United States Patent
Yamazaki et al.

(10) Patent No.: US 10,211,239 B2
(45) Date of Patent: Feb. 19, 2019

(54) SEPARATION METHOD, DISPLAY DEVICE, DISPLAY MODULE, AND ELECTRONIC DEVICE

(71) Applicant: Semiconductor Energy Laboratory Co., Ltd., Atsugi-shi, Kanagawa-ken (JP)

(72) Inventors: Shunpei Yamazaki, Tokyo (JP); Seiji Yasumoto, Tochigi (JP); Yuka Kobayashi, Tochigi (JP); Satoru Idojiri, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/666,758

(22) Filed: Aug. 2, 2017

(65) Prior Publication Data

US 2018/0040647 A1 Feb. 8, 2018

(30) Foreign Application Priority Data

Aug. 5, 2016 (JP) .................................. 2016-154489

(51) Int. Cl.
*H01L 27/12* (2006.01)
*H01L 21/02* (2006.01)
(Continued)

(52) U.S. Cl.
CPC .... *H01L 27/1266* (2013.01); *G02F 1/133603* (2013.01); *H01L 21/02118* (2013.01);
(Continued)

(58) Field of Classification Search
CPC .......... H01L 27/1266; H01L 21/02118; H01L 21/02255; H01L 21/02282; H01L 21/47;
(Continued)

(56) References Cited

U.S. PATENT DOCUMENTS 4,409,134 A 10/1983 Yamazaki
5,826,162 A 10/1998 Arai et al.
(Continued)

FOREIGN PATENT DOCUMENTS

CN 102403333 A 4/2012
CN 104425773 A 3/2015
(Continued)

OTHER PUBLICATIONS

International Search Report (Application No. PCT/IB2017/052836) dated Aug. 29, 2017.
(Continued)

*Primary Examiner* — Fernando L Toledo
*Assistant Examiner* — Neil Prasad
(74) *Attorney, Agent, or Firm* — Fish & Richardson P.C.

(57) ABSTRACT

To increase the yield of the separation process. To produce display devices formed through the separation process with higher mass productivity. A first layer is formed using a material including a resin or a resin precursor over a substrate. Then, first heat treatment is performed on the first layer, whereby a first resin layer including a residue of an oxydiphthalic acid is formed. Then, a layer to be separated is formed over the first resin layer. Then, the layer to be separated and the substrate are separated from each other. The first heat treatment is performed in an atmosphere containing oxygen.

25 Claims, 32 Drawing Sheets

(51) Int. Cl.

| | | |
|---|---|---|
| *H01L 21/47* | (2006.01) | |
| *H01L 21/683* | (2006.01) | |
| *H01L 29/66* | (2006.01) | |
| *H01L 29/786* | (2006.01) | |
| *G02F 1/1333* | (2006.01) | |
| *G02F 1/1335* | (2006.01) | |
| *G02F 1/1362* | (2006.01) | |
| *G02F 1/1368* | (2006.01) | |
| *H01L 27/32* | (2006.01) | |
| *G02F 1/136* | (2006.01) | |

(52) U.S. Cl.
CPC .. *H01L 21/02255* (2013.01); *H01L 21/02282* (2013.01); *H01L 21/47* (2013.01); *H01L 21/6835* (2013.01); *H01L 27/1218* (2013.01); *H01L 27/1225* (2013.01); *H01L 27/3232* (2013.01); *H01L 29/66969* (2013.01); *H01L 29/7869* (2013.01); *G02F 1/1368* (2013.01); *G02F 1/133305* (2013.01); *G02F 1/133553* (2013.01); *G02F 1/136227* (2013.01); *G02F 2001/13613* (2013.01); *G02F 2001/133354* (2013.01); *G02F 2201/44* (2013.01); *H01L 27/323* (2013.01); *H01L 27/3262* (2013.01); *H01L 2221/6835* (2013.01); *H01L 2221/68381* (2013.01); *H01L 2227/323* (2013.01); *H01L 2227/326* (2013.01)

(58) Field of Classification Search
CPC ............ H01L 21/6835; H01L 27/1218; H01L 27/1225; H01L 27/3232; H01L 29/66969; H01L 29/7869; G02F 1/133305; G02F 1/133553; G02F 1/136227; G02F 1/1368; G02F 2001/133354
See application file for complete search history.

(56) References Cited

U.S. PATENT DOCUMENTS

| | | | |
|---|---|---|---|
| 5,834,327 | A | 11/1998 | Yamazaki et al. |
| 6,100,166 | A | 8/2000 | Sakaguchi et al. |
| 6,127,199 | A | 10/2000 | Inoue et al. |
| 6,335,479 | B1 | 1/2002 | Yamada et al. |
| 6,372,608 | B1 | 4/2002 | Shimoda et al. |
| 6,379,792 | B1 | 4/2002 | Isshiki et al. |
| 6,468,638 | B2 | 10/2002 | Jacobsen et al. |
| 6,521,511 | B1 | 2/2003 | Inoue et al. |
| 6,627,518 | B1 | 9/2003 | Inoue et al. |
| 6,645,830 | B2 | 11/2003 | Shimoda et al. |
| 6,714,268 | B2 | 3/2004 | Wang et al. |
| 6,814,832 | B2 | 11/2004 | Utsunomiya |
| 6,825,099 | B2 | 11/2004 | Yanagita et al. |
| 6,846,616 | B2 | 1/2005 | Kobayashi et al. |
| 6,867,067 | B2 | 3/2005 | Ghyselen et al. |
| 6,885,146 | B2 | 4/2005 | Yamazaki et al. |
| 6,946,361 | B2 | 9/2005 | Takayama et al. |
| 6,947,321 | B2 | 9/2005 | Tanabe |
| 7,038,641 | B2 | 5/2006 | Hirota et al. |
| 7,052,924 | B2 | 5/2006 | Daniels et al. |
| 7,067,392 | B2 | 6/2006 | Yamazaki et al. |
| 7,078,737 | B2 | 7/2006 | Yuri et al. |
| 7,084,045 | B2 | 8/2006 | Takayama et al. |
| 7,084,936 | B2 | 8/2006 | Kato |
| 7,094,665 | B2 | 8/2006 | Shimoda et al. |
| 7,102,704 | B2 | 9/2006 | Mitsui et al. |
| 7,147,740 | B2 | 12/2006 | Takayama et al. |
| 7,169,652 | B2 | 1/2007 | Kimura |
| 7,176,991 | B2 | 2/2007 | Mitsui et al. |
| 7,239,361 | B2 | 7/2007 | Kato |
| 7,248,235 | B2 | 7/2007 | Fujii et al. |
| 7,262,088 | B2 | 8/2007 | Kodaira et al. |
| 7,341,924 | B2 | 3/2008 | Takayama et al. |
| 7,385,654 | B2 | 6/2008 | Mitsui et al. |
| 7,420,208 | B2 | 9/2008 | Yamazaki et al. |
| 7,456,059 | B2 | 11/2008 | Kodaira et al. |
| 7,572,667 | B2 | 8/2009 | Ryu et al. |
| 7,575,965 | B2 | 8/2009 | Kuwabara et al. |
| 8,110,442 | B2 | 2/2012 | Jinbo |
| 8,173,519 | B2 | 5/2012 | Morisue et al. |
| 9,437,831 | B2 | 9/2016 | Yamazaki et al. |
| 2003/0003687 | A1 | 1/2003 | Yanagita et al. |
| 2003/0024635 | A1 | 2/2003 | Utsunomiya |
| 2003/0048370 | A1 | 3/2003 | Koyama |
| 2003/0087073 | A1 | 5/2003 | Kobayashi |
| 2003/0201960 | A1 | 10/2003 | Fujieda |
| 2003/0217805 | A1 | 11/2003 | Takayama et al. |
| 2004/0079941 | A1 | 4/2004 | Yamazaki et al. |
| 2004/0129960 | A1 | 7/2004 | Maruyama et al. |
| 2004/0209442 | A1 | 10/2004 | Takakuwa et al. |
| 2004/0239827 | A1 | 12/2004 | Yamazaki et al. |
| 2005/0124751 | A1 | 6/2005 | Klingenberg et al. |
| 2005/0127371 | A1 | 6/2005 | Yamazaki et al. |
| 2005/0130391 | A1 | 6/2005 | Takayama et al. |
| 2005/0173701 | A1 | 8/2005 | Kawase et al. |
| 2005/0250308 | A1 | 11/2005 | Yamaguchi et al. |
| 2005/0287871 | A1 | 12/2005 | Nakayama et al. |
| 2006/0072047 | A1 | 4/2006 | Sekiguchi |
| 2007/0171142 | A1 | 7/2007 | Ikarashi et al. |
| 2007/0207571 | A1 | 9/2007 | Morisue et al. |
| 2007/0295973 | A1 | 12/2007 | Jinbo et al. |
| 2008/0180618 | A1 | 7/2008 | Fujieda |
| 2009/0315457 | A1 | 12/2009 | Furukawa et al. |
| 2010/0171905 | A1 | 7/2010 | Huang et al. |
| 2011/0308739 | A1* | 12/2011 | McCutcheon ........ H01L 21/187 156/766 |
| 2012/0061664 | A1* | 3/2012 | Yamazaki ........... H01L 27/1225 257/43 |
| 2012/0228617 | A1 | 9/2012 | Ko et al. |
| 2012/0325535 | A1* | 12/2012 | Zahr ...................... H05K 3/386 174/259 |
| 2015/0072454 | A1 | 3/2015 | Kim et al. |
| 2015/0303408 | A1 | 10/2015 | Lee et al. |
| 2017/0158805 | A1* | 6/2017 | Su ...................... C08G 18/6438 |
| 2017/0278878 | A1 | 9/2017 | Kuwabara et al. |
| 2017/0293171 | A1 | 10/2017 | Yamazaki et al. |
| 2017/0294462 | A1 | 10/2017 | Yamazaki et al. |
| 2017/0294463 | A1 | 10/2017 | Yamazaki et al. |
| 2017/0301860 | A1 | 10/2017 | Yamazaki et al. |
| 2017/0305134 | A1 | 10/2017 | Hirakata |
| 2017/0309731 | A1 | 10/2017 | Yamazaki et al. |
| 2017/0329162 | A1 | 11/2017 | Yamazaki et al. |
| 2018/0012751 | A1* | 1/2018 | Kamochi .............. H01L 21/022 |
| 2018/0033978 | A1 | 2/2018 | Ohno et al. |

FOREIGN PATENT DOCUMENTS

| | | |
|---|---|---|
| CN | 104685553 A | 6/2015 |
| CN | 104910400 A | 9/2015 |
| EP | 2849241 A | 3/2015 |
| JP | 2001-066593 A | 3/2001 |
| JP | 2002-196702 A | 7/2002 |
| JP | 2002-328630 A | 11/2002 |
| JP | 2003-076302 A | 3/2003 |
| JP | 2003-098977 A | 4/2003 |
| JP | 2003-157026 A | 5/2003 |
| JP | 2003-157029 A | 5/2003 |
| JP | 2003-228304 A | 8/2003 |
| JP | 2003-316295 A | 11/2003 |
| JP | 2003-322850 A | 11/2003 |
| JP | 2004-296162 A | 10/2004 |
| JP | 2007-232882 A | 9/2007 |
| JP | 4161574 | 10/2008 |
| JP | 2012-083733 A | 4/2012 |
| JP | 2013-080876 A | 5/2013 |
| JP | 2013-221965 A | 10/2013 |
| JP | 2015-056664 A | 3/2015 |
| JP | 2015-187987 A | 10/2015 |
| JP | 2015-223823 A | 12/2015 |
| JP | 2016-145987 A | 8/2016 |
| KR | 2015-0029429 A | 3/2015 |
| KR | 2015-0060716 A | 6/2015 |
| KR | 2015-0106852 A | 9/2015 |

(56) References Cited

FOREIGN PATENT DOCUMENTS

| TW | 201425048 | 7/2014 |
|---|---|---|
| TW | 201513318 | 4/2015 |
| TW | 201534657 | 9/2015 |
| TW | 201700301 | 1/2017 |
| WO | WO-2004/053819 | 6/2004 |
| WO | WO-2014/050933 | 4/2014 |
| WO | WO-2016/152906 | 9/2016 |

OTHER PUBLICATIONS

Written Opinion (Application No. PCT/IB2017/052836) dated Aug. 29, 2017.

Kusunoki.K et al., "Transmissive OLED and Reflective LC Hybrid (TR-Hybrid) Display", SID Digest '16 : SID International Symposium Digest of Technical Papers, May 22, 2016, vol. 47, pp. 57-60.

Sakuishi.T et al., "Transmissive OLED and Reflective LC Hybrid (TR-Hybrid) Display with High Visibility and Low Power Consumption", SID Digest '16 : SID International Symposium Digest of Technical Papers, May 22, 2016, vol. 47, pp. 735-738.

Ohide.T et al., "Application of Transfer Technology to Manufacturing of Transmissive OLED and Reflective LC Hybrid (TR-Hybrid) Display", SID Digest '16 : SID International Symposium Digest of Technical Papers, May 22, 2016, vol. 47, pp. 1002-1004.

Shieh.H, "Transflective display by Hybrid OLED and LCD", LEOS 2005 (IEEE Lasers and Electro-Optics Society Annual Meeting), Oct. 22, 2005, pp. 650-651, IEEE.

Lee.J et al., "High ambient-contrast-ratio display using tandem reflective liquid crystal display and organic light-emitting device", Optics Express, Nov. 14, 2005, vol. 13, No. 23, pp. 9431-9438.

French.I et al., "54.2: Thin Plastic Electrophoretic Displays Fabricated by a Novel Process", SID Digest '05 : SID International Symposium Digest of Technical Papers, May 24, 2005, vol. 36, pp. 1634-1637.

Yoon.J et al., "World 1st Large Size 18-inch Flexible OLED Display and the Key Technologies", SID Digest '15 : SID International Symposium Digest of Technical Papers, Jun. 2, 2015, pp. 962-965.

Ko.M et al., "Late-News Paper: Joule Heating Induced Lift-off Technology for Large Area Flexible AMOLED Displays", SID Digest '11 : SID International Symposium Digest of Technical Papers, 2011, vol. 42, No 1, pp. 118-120.

Hong.S et al., "Development of Commercial Flexible AMOLEDs", SID Digest '14 : SID International Symposium Digest of Technical Papers, Jun. 1, 2014, vol. 45, pp. 334-337.

\* cited by examiner

SEPARATION METHOD, DISPLAY DEVICE, DISPLAY MODULE, AND ELECTRONIC DEVICE

TECHNICAL FIELD

One embodiment of the present invention relates to a separation method, a display device, a display module, an electronic device, and a manufacturing method of a display device.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input-output device (e.g., a touch panel), a driving method thereof, and a manufacturing method thereof.

In this specification and the like, a semiconductor device generally means a device that can function by utilizing semiconductor characteristics. A transistor, a semiconductor circuit, an arithmetic device, a memory device, and the like are each an embodiment of the semiconductor device. In addition, an imaging device, an electro-optical device, a power generation device (e.g., a thin film solar cell and an organic thin film solar cell), and an electronic device each may include a semiconductor device.

BACKGROUND ART

Display devices using organic electroluminescent (EL) elements or liquid crystal elements have been known. Examples of the display devices also include light-emitting devices provided with light-emitting elements such as light-emitting diodes (LEDs), and electronic papers performing display with an electrophoretic method or the like.

The organic EL element generally has a structure in which a layer containing a light-emitting organic compound is provided between a pair of electrodes. By voltage application to this element, the light-emitting organic compound can emit light. A display device including such an organic EL element can be thin and lightweight and have high contrast and low power consumption.

A flexible display device can be obtained by formation of a semiconductor element such as a transistor or a display element such as an organic EL element over a flexible substrate (film).

In a manufacturing method of a flexible display device that is disclosed in Patent Document 1, laser light irradiation is performed on a supporting substrate over which a sacrifice layer, a heat-resistant resin layer, and an electronic element are provided in that order, and the heat-resistant resin layer is separated from the glass substrate.

REFERENCE

Patent Document

[Patent Document 1] Japanese Published Patent Application No. 2015-223823

DISCLOSURE OF INVENTION

An object of one embodiment of the present invention is to provide a novel separation method or a novel manufacturing method of a display device. An object of one embodiment of the present invention is to provide a separation method or a manufacturing method of a display device at low cost with high mass productivity. An object of one embodiment of the present invention is to provide a separation method with a high yield. An object of one embodiment of the present invention is to perform separation using a large-sized substrate. An object of one embodiment of the present invention is to manufacture a display device using a large-sized substrate. An object of one embodiment of the present invention is to provide a manufacturing method of a display device with a simplified manufacturing process. An object of one embodiment of the present invention is to manufacture a display device at low temperatures.

An object of one embodiment of the present invention is to provide a display device with low power consumption. An object of one embodiment of the present invention is to provide a display device with high visibility regardless of the ambient brightness. An object of one embodiment of the present invention is to provide an all-weather display device. An object of one embodiment of the present invention is to provide a display device with high convenience. An object of one embodiment of the present invention is to provide a display device with high reliability. An object of one embodiment of the present invention is to reduce the thickness or weight of a display device. An object of one embodiment of the present invention is to provide a display device with flexibility or having a curved surface. An object of one embodiment of the present invention is to provide a display device that is unlikely to be broken. An object of one embodiment of the present invention is to provide a novel display device, a novel input/output device, a novel electronic device, or the like.

Note that the descriptions of these objects do not disturb the existence of other objects. In one embodiment of the present invention, there is no need to achieve all the objects. Other objects can be derived from the description of the specification, the drawings, the claims, and the like.

One embodiment of the present invention is a separation method including: forming, over a substrate, a first layer including a material including a resin or a resin precursor; forming a first resin layer including a residue of an oxydiphthalic acid by performing first heat treatment on the first layer in an atmosphere containing oxygen; forming, over the first resin layer, a layer to be separated; and separating the layer to be separated and the substrate from each other. After the first heat treatment, an island-like-shaped first resin layer may be formed by forming a mask over the first resin layer and performing etching. In a step of forming the layer to be separated, for example, an insulating layer covering an end portion of the first resin layer is formed over the substrate and the first resin layer, and a transistor including metal oxide in a channel formation region is formed over the first resin layer with the insulating layer positioned between the first resin layer and the transistor. Before the separation of the layer to be separated and the substrate from each other, a separation starting point may be formed by separating at least part of the first resin layer from the substrate. It is preferable that, in the first heat treatment, a gas containing oxygen be made to flow.

One embodiment of the present invention is a separation method including: forming, over a substrate, a first layer including a material including a resin or a resin precursor; forming a first resin layer including a residue of an oxydiphthalic acid by performing first heat treatment on the first layer in an atmosphere containing oxygen; forming an island-like-shaped first resin layer by forming a mask over the first resin layer and performing etching; forming a second layer covering an end portion of the first resin layer over the substrate and the first resin layer; forming a second resin layer covering the end portion of the first resin layer by performing second heat treatment on the second layer in an atmosphere containing less oxygen than the atmosphere of the first heat treatment; forming a transistor including metal oxide in a channel formation region over the first resin layer with the second resin layer positioned between the first resin layer and the transistor; forming a separation starting point by separating at least part of the first resin layer from the substrate; and separating the transistor and the substrate from each other. It is preferable that, in the first heat treatment, a gas containing oxygen be made to flow. It is preferable that, in the second heat treatment, a gas containing oxygen not be made to flow or a gas in which the proportion of oxygen is lower than the proportion of oxygen in the gas used in the first heat treatment be made to flow. The second resin layer may include a residue of an oxydiphthalic acid.

At least one of the first resin layer and the second resin layer may include a polyimide resin obtained using an acid component containing an oxydiphthalic acid or an oxydiphthalic acid derivative and an amine component containing an aromatic amine or an aromatic amine derivative.

The first heat treatment may be performed at a temperature higher than or equal to 350° C. and lower than or equal to 450° C. In the first heat treatment, a mixed gas containing nitrogen and oxygen may be made to flow.

The first resin layer may be formed to a thickness greater than or equal to 1 μm and less than or equal to 3 μm.

The first layer may be formed with the use of a solution with a viscosity of greater than or equal to 5 cP and less than 100 cP. The first layer may be formed with the use of a spin coater. The first layer may be formed using a non-photosensitive material.

It is preferable that the transistor be manufactured at a temperature lower than or equal to the temperature of the first heat treatment.

One embodiment of the present invention is a display device including a first resin layer, a second resin layer over the first resin layer, a transistor over the second resin layer, and a display element electrically connected to the transistor. The first resin layer includes a residue of an oxydiphthalic acid. The second resin layer preferably includes a residue of an oxydiphthalic acid. The oxygen concentration measured by X-ray photoelectron spectroscopy (XPS) analysis performed on a surface of the first resin layer that is opposite to a surface on the second resin layer side is preferably higher than or equal to 10 atomic %. The first resin layer preferably has a thickness greater than or equal to 1 μm and less than or equal to 3 μm. The transistor preferably includes metal oxide in a channel formation region.

One embodiment of the present invention is a display module including any of the above display devices and a circuit board such as a flexible printed circuit (FPC).

One embodiment of the present invention is an electronic device including the above display module and at least one of an antenna, a battery, a housing, a camera, a speaker, a microphone, and an operation button.

One embodiment of the present invention can provide a novel separation method or a novel manufacturing method of a display device. One embodiment of the present invention can provide a separation method or a manufacturing method of a display device at low cost with high mass productivity. One embodiment of the present invention can provide a separation method with a high yield. One embodiment of the present invention can perform separation using a large-sized substrate. One embodiment of the present invention can manufacture a display device using a large-sized substrate. One embodiment of the present invention can provide a manufacturing method of a display device with a simplified manufacturing process. One embodiment of the present invention can manufacture a display device at low temperatures.

One embodiment of the present invention can provide a display device with low power consumption. One embodiment of the present invention can provide a display device with high visibility regardless of the ambient brightness. One embodiment of the present invention can provide an all-weather display device. One embodiment of the present invention can provide a display device with high convenience. One embodiment of the present invention can provide a display device with high reliability. One embodiment of the present invention can reduce the thickness or weight of a display device. One embodiment of the present invention can provide a display device with flexibility or having a curved surface. One embodiment of the present invention can provide a display device that is unlikely to be broken. One embodiment of the present invention can provide a novel display device, a novel input/output device, a novel electronic device, or the like.

Note that the description of these effects does not preclude the existence of other effects. One embodiment of the present invention does not necessarily have all the effects listed above. Other effects can be derived from the description of the specification, the drawings, the claims, and the like.

BRIEF DESCRIPTION OF DRAWINGS

FIGS. 4A, 4B, 4C, 4D1, 4D2, and 4E are cross-sectional views illustrating an example of a manufacturing method of a display device.

FIGS. 5A and 5B1 are cross-sectional views illustrating an example of a manufacturing method of a display device, and FIGS. 5B2 and 5B3 are top views illustrating the example.

BEST MODE FOR CARRYING OUT THE INVENTION

Figure 1A:
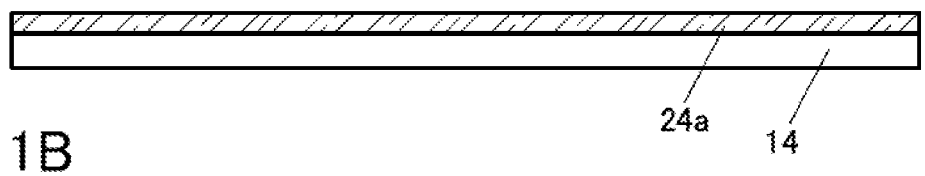
FIGS. 1A to 1E are cross-sectional views illustrating an example of a manufacturing method of a display device.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. Thus, the present invention should not be construed as being limited to the description in the following embodiments.

Note that in the structures of the present invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

The position, size, range, or the like of each structure illustrated in drawings is not accurately represented in some cases for easy understanding. Therefore, the disclosed invention is not necessarily limited to the position, size, range, or the like disclosed in the drawings.

Note that the terms "film" and "layer" can be interchanged with each other depending on the case or circumstances. For example, the term "conductive layer" can be changed into the term "conductive film". Also, the term "insulating film" can be changed into the term "insulating layer".

Note that in this specification and the like, a "substrate" preferably has a function of supporting at least one of a functional circuit, a functional element, a functional film, and the like. A "substrate" does not necessary have a function of supporting a functional circuit, a functional element, a functional film, and the like, and may have a function of protecting a surface of the device, or a function of sealing at least one of a functional circuit, a functional element, a functional film, and the like, for example.

In this specification and the like, metal oxide means an oxide of metal in a broad sense. Metal oxides are classified into an oxide insulator, an oxide conductor (including a transparent oxide conductor), an oxide semiconductor (also simply referred to as an OS), and the like. For example, metal oxide used in a semiconductor layer of a transistor is called an oxide semiconductor in some cases. In other words, an OS FET is a transistor including metal oxide or an oxide semiconductor.

In this specification and the like, metal oxide including nitrogen is also called metal oxide in some cases. Moreover, metal oxide including nitrogen may be called a metal oxynitride.

In this specification and the like, "c-axis aligned crystal (CAAC)" or "cloud-aligned composite (CAC)" might be stated. CAAC refers to an example of a crystal structure, and CAC refers to an example of a function or a material composition.

An example of a crystal structure of an oxide semiconductor or metal oxide is described. Note that an oxide semiconductor deposited by a sputtering method using an In—Ga—Zn oxide target (In:Ga:Zn=4:2:4.1 in an atomic ratio) is described below as an example. An oxide semiconductor formed by a sputtering method using the above-mentioned target at a substrate temperature of higher than or equal to 100° C. and lower than or equal to 130° C. is referred to as sIGZO, and an oxide semiconductor formed by a sputtering method using the above-mentioned target with the substrate temperature set at room temperature (R.T.) is referred to as tIGZO. For example, sIGZO has one or both crystal structures of nano crystal (nc) and CAAC. Furthermore, tIGZO has a crystal structure of nc. Note that room temperature (R.T.) herein also refers to a temperature of the time when a substrate is not heated intentionally.

In this specification and the like, CAC-OS or CAC-metal oxide has a function of a conductor in a part of the material and has a function of a dielectric (or insulator) in another part of the material; as a whole, CAC-OS or CAC-metal oxide has a function of a semiconductor. In the case where CAC-OS or CAC-metal oxide is used in a semiconductor layer of a transistor, the conductor has a function of letting electrons (or holes) serving as carriers flow, and the dielectric has a function of not letting electrons serving as carriers flow. By the complementary action of the function as a conductor and the function as a dielectric, CAC-OS or CAC-metal oxide can have a switching function (on/off function). In the CAC-OS or CAC-metal oxide, separation of the functions can maximize each function.

In this specification and the like, CAC-OS or CAC-metal oxide includes conductor regions and dielectric regions. The conductor regions have the above-described function of the conductor, and the dielectric regions have the above-described function of the dielectric. In some cases, the conductor regions and the dielectric regions in the material are separated at the nanoparticle level. In some cases, the conductor regions and the dielectric regions are unevenly distributed in the material. When observed, the conductor regions are coupled in a cloud-like manner with their boundaries blurred, in some cases.

In other words, CAC-OS or CAC-metal oxide can be called a matrix composite or a metal matrix composite.

Furthermore, in the CAC-OS or CAC-metal oxide, the conductor regions and the dielectric regions each have a size of more than or equal to 0.5 nm and less than or equal to 10 nm, preferably more than or equal to 0.5 nm and less than or equal to 3 nm and are dispersed in the material, in some cases.

(Embodiment 1)

In this embodiment, a separation method and a method for manufacturing a display device of one embodiment of the present invention will be described with reference to FIG. 1A to FIG. 17B.

In this embodiment, a display device including a transistor and an organic EL element (also referred to as an active matrix organic EL display device) is given as an example. The display device can be flexible by using a flexible material as a substrate. Note that one embodiment of the present invention is not limited to a light-emitting device, a display device, or an input/output device (e.g., a touch panel) that includes an organic EL element and can be applied to a variety of devices such as a semiconductor device, a light-emitting device, a display device, and an input/output device that each include another functional element.

In the separation method of one embodiment of the present invention, first, a material including a resin or a resin precursor is formed as a first layer over the substrate. Then, first heat treatment is performed on the first layer, whereby a first resin layer is formed. Then, a layer to be separated is formed over the first resin layer. Then, the layer to be separated and the substrate are separated from each other. The first heat treatment is performed in an atmosphere containing oxygen. A gas containing oxygen is preferably made to flow in the first heat treatment. The material including a resin or a resin precursor is preferably a non-photosensitive material.

The first resin layer formed by heating the first layer in an atmosphere containing enough oxygen includes a large amount of oxygen and thus can be easily separated from the substrate.

The first resin layer includes a residue of a compound represented by Structural formula (100) (an oxydiphthalic acid).

[Chemical formula 1]

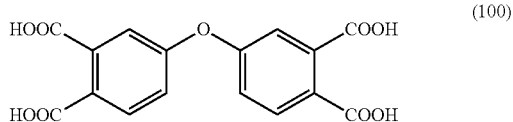
(100)

A polyimide resin obtained using an acid component including an oxydiphthalic acid or an oxydiphthalic acid derivative and an amine component including an aromatic amine or an aromatic amine derivative is suitable for the first resin layer. Examples of the oxydiphthalic acid derivative include an oxydiphthalic anhydride.

In the separation method of one embodiment of the present invention, the first resin layer can be easily separated from the substrate by controlling heat conditions used to form the first resin layer. That is, a step of irradiating an entire surface of the first resin layer with laser light to increase the separability of the first resin layer is not necessary.

If the entire surface of the first resin layer is irradiated with laser light, use of a linear laser beam is suitable, but a laser apparatus for the linear laser beam irradiation is expensive and requires high running costs. In the separation method of one embodiment of the present invention, the laser apparatus is not necessary, leading to significant cost savings. Moreover, the separation method is easily applicable to a large-sized substrate.

Because the step of irradiating the entire surface of the first resin layer with laser light through the substrate is not performed, the substrate can be prevented from being damaged by the laser light irradiation. The substrate after being used once is less likely to decrease in strength; thus, the substrate can be reused, leading to cost savings.

In another separation method of one embodiment of the present invention, first, a material including a resin or a resin precursor is formed as a first layer over a substrate. Then, first heat treatment is performed on the first layer, whereby a first resin layer including a residue of an oxydiphthalic acid is formed. Then, a mask is formed over the first resin layer, and etching is performed, whereby an island-like-shaped first resin layer is formed. Then, an insulating layer covering an end portion of the first resin layer is formed over the substrate and the first resin layer. Then, a transistor including metal oxide in a channel formation region is formed over the first resin layer with the insulating layer positioned between the first resin layer and the transistor. Then, a separation starting point is formed by separating at least part of the first resin layer from the substrate. Then, the transistor and the substrate are separated from each other. The first heat treatment is performed in an atmosphere containing oxygen. A gas containing oxygen is preferably made to flow in the first heat treatment.

A portion that is in contact with the first resin layer and a portion that is in contact with the insulating layer are provided for the substrate. The insulating layer is formed covering the end portion of the first resin layer. The adhesion of the insulating layer to the substrate is stronger than the adhesion of the first resin layer to the substrate. By the formation of the insulating layer covering the end portion of the first resin layer, unintentional separation of the first resin layer from the substrate can be inhibited even in the case where the first resin layer has high separability. For example, separation of the first resin layer that will occur at the time of transferring the substrate can be inhibited. Furthermore, the separation starting point enables separation of the substrate and the first resin layer from each other at a desired time. That is, in the separation method of this embodiment, the time at which the separation occurs can be controlled and high separability can be achieved. This can improve the yield of the separation process and the manufacturing process of the display device.

In another separation method of one embodiment of the present invention, first, a material including a resin or a resin precursor is formed as a first layer over a substrate. Then, first heat treatment is performed on the first layer in an atmosphere containing oxygen, whereby a first resin layer including a residue of an oxydiphthalic acid is formed. Then, a mask is formed over the first resin layer, and etching is performed, whereby an island-like-shaped first resin layer is formed. Then, a second layer covering an end portion of the first resin layer is formed over the substrate and the first resin layer. Then, second heat treatment is performed on the second layer in an atmosphere containing less oxygen than the atmosphere of the first heat treatment, whereby a second resin layer covering the end portion of the first resin layer is formed. Then, a transistor including metal oxide in a channel formation region is formed over the first resin layer with the second resin layer positioned between the first resin layer and the transistor. Then, a separation starting point is formed by separating at least part of the first resin layer from the substrate. Then, the transistor and the substrate are separated from each other.

The first heat treatment is performed in an atmosphere containing oxygen. A gas containing oxygen is preferably made to flow in the first heat treatment.

The second heat treatment is performed in an atmosphere containing less oxygen than the atmosphere of the first heat treatment. In the second heat treatment, it is preferable that a gas containing oxygen not be made to flow or a gas in which the proportion of oxygen is lower than the proportion of oxygen in the gas used in the first heat treatment be made to flow.

The separability of the second resin layer is lower than the separability of the first resin layer because the second resin layer is formed by heating in the atmosphere containing less oxygen than the atmosphere of the first heat treatment.

Note that in some cases, it can be confirmed that the amount of oxygen contained in the first resin layer is larger than the amount of oxygen contained in the second resin layer through analysis of the oxygen amount or oxygen concentration in the film or of the film surface. Specifically, analysis using secondary ion mass spectrometry (SIMS), XPS, or the like can be used.

A portion that is in contact with the first resin layer and a portion that is in contact with the second resin layer are provided for the substrate. The second resin layer is formed covering the end portion of the first resin layer. The adhesion of the second resin layer to the substrate is stronger than the adhesion of the first resin layer to the substrate. By the formation of the second resin layer covering the end portion of the first resin layer, separation of the first resin layer from the substrate that will occur at an unintended time can be inhibited even in the case where the first resin layer has high separability. Furthermore, the separation starting point enables separation of the substrate and the first resin layer from each other at a desired time. That is, in the separation method of this embodiment, the time at which the separation occurs can be controlled and high separability can be achieved. This can improve the yield of the separation process and the manufacturing process of the display device.

Note that even when the atmosphere of the first heat treatment is the same as the atmosphere of the second heat treatment, the separability of the first resin layer can be made different from the separability of the second resin layer in some cases by setting the temperature of the second heat treatment sufficiently lower than the temperature of the first heat treatment.

A resin including a residue of a compound represented by Structural formula (100) (an oxydiphthalic acid) is suitable for the second resin layer.

[Chemical Formula 2]

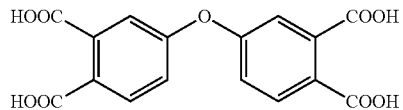

(100)

A polyimide resin obtained using an acid component including an oxydiphthalic acid or an oxydiphthalic acid derivative and an amine component including an aromatic amine or an aromatic amine derivative is suitable for the second resin layer. Examples of the oxydiphthalic acid derivative include an oxydiphthalic anhydride.

The first resin layer and the second resin layer may be formed using either different materials or the same material. Using the same material is preferable in terms of cost reduction. Even in the case of using the same material, the level of adhesion of the first resin layer to a formation substrate can be made different from the level of adhesion of the second resin layer to the substrate by using different conditions for the first heat treatment and the second heat treatment.

The display device of this embodiment preferably includes metal oxide in the channel formation region of the transistor. The metal oxide can serve as an oxide semiconductor.

In the case where low temperature polysilicon (LTPS) is used for the channel formation region of the transistor, the first resin layer and the second resin layer are required to have heat resistance because heat at a temperature of approximately 500° C. to 550° C. needs to be applied. Furthermore, the first resin layer and the second resin layer need to have a large thickness so that damage in a step of laser crystallization is reduced.

In contrast, the transistor including the metal oxide in the channel formation region can be formed at a temperature lower than or equal to 350° C., or even lower than or equal to 300° C. Thus, the first resin layer and the second resin layer are not required to have high heat resistance. Accordingly, the heat resistant temperature of the first resin layer and the second resin layer can be low, and the range of choices for the materials can be widened. Furthermore, the transistor including metal oxide in the channel formation region does not need a laser crystallization step; thus, the first resin layer and the second resin layer can be thin. Since first resin layer and the second resin layer are not required to have high heat resistance and can be thinned, the manufacturing costs of a device can be significantly reduced. Metal oxide is preferably used, in which case the steps can be simplified as compared with the case where LTPS is used.

The first resin layer and the second resin layer may each have a thickness greater than or equal to 0.1 μm and less than or equal to 3 μm. By forming the first resin layer and the second resin layer thin, the display device can be manufactured at low cost. The display device can be light-weight and thin. The display device can have higher flexibility.

In this embodiment, the transistor or the like is formed at a temperature lower than or equal to the heat resistance temperature of the first resin layer and lower than or equal to the heat resistance temperature of the second resin layer. The heat resistance of the resin layer can be measured by, for example, a weight loss percentage due to heat, specifically, the 5% weight loss temperature. In the separation method and the manufacturing method of the display device of this embodiment, the maximum process temperature can be low. For example, the 5% weight loss temperature of the first resin layer and the 5% weight loss temperature of the second resin layer can each be higher than or equal to 200° C. and lower than or equal to 550° C., higher than or equal to 200° C. and lower than or equal to 450° C., higher than or equal to 200° C. and lower than or equal to 400° C., or higher than or equal to 200° C. and lower than or equal to 350° C. Thus, the range of choices for the material is widened. Note that the 5% weight loss temperature of the first resin layer or the second resin layer may be higher than 550° C.

The manufacturing method of the display device of this embodiment will be specifically described below.

Note that the thin films included in the display device (i.e., the insulating film, the semiconductor film, the conductive film, and the like) can be formed by any of a sputtering method, a chemical vapor deposition (CVD) method, a vacuum evaporation method, a pulsed laser deposition (PLD) method, an atomic layer deposition (ALD) method, and the like. As the CVD method, a plasma-enhanced chemical vapor deposition (PECVD) method or a thermal CVD method may be used. As an example of the thermal CVD method, a metal organic chemical vapor deposition (MOCVD) method may be used.

Alternatively, the thin films constituting the display device (i.e., the insulating film, the semiconductor film, the conductive film, and the like) can be formed by a method such as spin coating, dipping, spray coating, inkjet printing, dispensing, screen printing, or offset printing, or with a doctor knife, a slit coater, a roll coater, a curtain coater, or a knife coater.

When thin films included in the display device are processed, a lithography method or the like can be used for the processing. Alternatively, island-shaped thin films may be formed by a film formation method using a blocking mask. Alternatively, the thin films may be processed by a nanoimprinting method, a sandblasting method, a lift-off method, or the like. As the photolithography method, there are a method in which a resist mask is formed over a thin film to be processed, the thin film is processed by etching or the like, and the resist mask is removed and a method in which a photosensitive thin film is formed, and the photosensitive thin film is exposed to light and developed to be processed in a desirable shape.

In the case of using light in the lithography method, any of an i-line (light with a wavelength of 365 nm), a g-line (light with a wavelength of 436 nm), and an h-line (light with a wavelength of 405 nm), or combined light of any of them can be used for exposure. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use EUV, X-rays, or an electron beam because extremely minute processing can be performed. Note that in the case of performing exposure by scanning of a beam such as an electron beam, a photomask is not needed.

For etching of the thin film, dry etching, wet etching, a sandblast method, or the like can be used.

[Manufacturing Method Example 1]

First, a first layer 24a is formed over a formation substrate 14 (FIG. 1A).

In FIG. 1A, an example of forming the first layer 24a over an entire surface of the formation substrate 14 by a coating method is shown. The formation method is not limited to a coating method, and the first layer 24a may be formed over the formation substrate 14 by a printing method or the like. The first layer 24a that has an island-like shape, the first layer 24a that has an opening or an uneven shape, or the like may be formed over the formation substrate 14.

The first layer 24a can be formed using any of a variety of resin materials (including a resin precursor). The first layer 24a is preferably formed using a thermosetting material. In this embodiment, the first layer 24a is formed using a material that does not have photosensitivity (also referred to as a non-photosensitive material).

The first layer 24a is preferably formed using a material including a polyimide resin or a polyimide resin precursor. The first layer 24a can be formed using, for example, a material including a polyimide resin and a solvent or a material including a polyamic acid and a solvent.

The first layer 24a is preferably formed with a spin coater. By a spin coating method, a thin film can be uniformly formed over a large-sized substrate.

The first layer 24a is preferably formed using a solution having a viscosity of greater than or equal to 5 cP and less than 500 cP, further preferably greater than or equal to 5 cP and less than 100 cP, still further preferably greater than or equal to 10 cP and less than or equal to 50 cP. The lower the viscosity of the solution is, the easier the coating is. Furthermore, the lower the viscosity of the solution is, the more the entry of bubbles can be prevented, leading to a film with good quality.

Alternatively, the first layer 24a can be formed by dipping, spray coating, ink-jetting, dispensing, screen printing, or offset printing, or with a doctor knife, a slit coater, a roll coater, a curtain coater, or a knife coater, for example.

The formation substrate 14 has stiffness high enough for easy transfer and has resistance to heat applied in the manufacturing process. Examples of a material that can be used for the formation substrate 14 include glass, quartz, ceramics, sapphire, a resin, a semiconductor, a metal, and an alloy. Examples of the glass include alkali-free glass, barium borosilicate glass, and aluminoborosilicate glass.

Figure 1B:
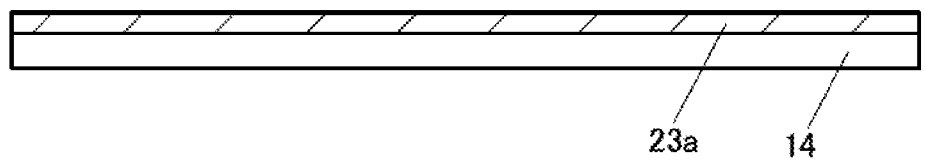

Then, first heat treatment is performed on the first layer 24a, whereby a first resin layer 23a is formed (FIG. 1B). The first resin layer 23a includes a residue of an oxydiphthalic acid.

The first heat treatment is performed in an atmosphere containing oxygen.

The larger the amount of oxygen contained in the first resin layer 23a is, the smaller the force required for separation of the first resin layer 23a can be. The higher the proportion of oxygen in the atmosphere of the first heat treatment is, the larger the amount of oxygen contained in the first resin layer 23a can be, so that the separability of the first resin layer 23a can be increased.

The first heat treatment can be performed using an atmosphere containing oxygen in a chamber of a heating apparatus, for example. Alternatively, the first heat treatment can be performed with a hot plate or the like in an air atmosphere.

The partial pressure of oxygen in the atmosphere at the time of performing the first heat treatment is preferably higher than or equal to 5% and lower than 100%, further preferably higher than or equal to 10% and lower than 100%, still further preferably higher than or equal to 15% and lower than 100%.

The first heat treatment is preferably performed while a gas containing oxygen is made to flow into the chamber of the heating apparatus. For example, the first heat treatment is preferably performed while only an oxygen gas or a mixed gas containing an oxygen gas is made to flow. Specifically, a mixed gas containing oxygen and nitrogen or a rare gas (such as argon) can be used.

Some heat apparatuses deteriorate in the case where the proportion of oxygen in the atmosphere is high. Therefore, in the case where a mixed gas containing an oxygen gas is used, the proportion of the flow rate of the oxygen gas in the flow rate of the whole mixed gas is preferably set higher than or equal to 5% and lower than or equal to 50%, further preferably higher than or equal to 10% and lower than or equal to 50%, still further preferably higher than or equal to 15% and lower than or equal to 50%.

The temperature of the first heat treatment is preferably higher than or equal to 200° C. and lower than or equal to 500° C., further preferably higher than or equal to 250° C. and lower than or equal to 475° C., still further preferably higher than or equal to 300° C. and lower than or equal to 450° C.

The higher the temperature of the first heat treatment is, the higher the separability of the first resin layer 23a can be.

By the first heat treatment, released gas components (e.g., hydrogen or water) in the first resin layer 23a can be reduced. In particular, heating is preferably performed at a temperature higher than or equal to the formation temperature of each layer formed over the first resin layer 23a. Thus, a gas released from the first resin layer 23a in the manufacturing process of the transistor can be significantly reduced.

For example, in the case where the manufacturing temperature of the transistor is below 350° C., a film to be the first resin layer 23a is preferably heated at a temperature higher than or equal to 350° C. and lower than or equal to 450° C., further preferably higher than or equal to 350° C. and lower than or equal to 400° C., still further preferably higher than or equal to 350° C. and lower than or equal to 375° C. Thus, a gas released from the first resin layer 23a in the manufacturing process of the transistor can be significantly reduced.

The maximum temperature in manufacturing the transistor is preferably equal to the temperature of the first heat treatment, in which case the maximum temperature in manufacturing the display device can be prevented from being increased by the first heat treatment.

The longer the heating time of the first heat treatment is, the higher the separability of the first resin layer 23a can be.

By increasing the heating time of the treatment, even when the heating temperature is comparatively low, the separability equivalent to that obtained in heating at a high temperature can be obtained in some cases. Therefore, in the case where the heating temperature cannot be increased because of the structure of the heating apparatus, it is preferable to increase the heating time of the treatment.

The heating time of the first heat treatment is preferably longer than or equal to 5 minutes and shorter than or equal to 24 hours, further preferably longer than or equal to 30 minutes and shorter than or equal to 12 hours, still further preferably longer than or equal to 1 hour and shorter than or equal to 6 hours, for example. Note that the heating time of the first heat treatment is not limited to this. The heating time of the first heat treatment may be shorter than 5 minutes in the case where the first heat treatment is performed by rapid thermal annealing (RTA), for example.

As the heating apparatus, any of a variety of apparatuses, e.g., an electric furnace or an apparatus for heating an object by heat conduction or heat radiation from a heating element such as a resistance heating element, can be used. For example, an RTA apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas. With the RTA apparatus, the process time can be shortened and thus the RTA apparatus is preferred for mass production. Alternatively, an in-line heating apparatus may be used in the heat treatment.

In the case where a resin is used in a planarization layer or the like of the display device, for example, heating is generally performed under the conditions where oxygen is hardly contained and at the lowest temperature in a temperature range in which the resin is cured, thereby preventing change in quality of the resin due to oxidation. In contrast, in one embodiment of the present invention, heating is performed at a comparatively high temperature (e.g., a temperature higher than or equal to 200° C.) with a surface of the first layer 24a to be the first resin layer 23a exposed to an atmosphere positively containing oxygen. Thus, the first resin layer 23a can have high separability.

Note that by the heat treatment, the thickness of the first resin layer 23a is changed from the thickness of the first layer 24a in some cases. For example, by the removal of a solvent contained in the first layer 24a or density increase due to the increase in stiffness, the volume is decreased, so that the thickness of the first resin layer 23a becomes smaller than the thickness of the first layer 24a in some cases. Alternatively, owing to oxygen contained at the time of performing the heat treatment, the volume is increased, so that the thickness of the first resin layer 23a becomes larger than the thickness of the first layer 24a in some cases.

Before the first heat treatment is performed, thermal treatment (also referred to as pre-baking treatment) for removing a solvent contained in the first layer 24a may be performed. The temperature of the pre-baking treatment can be determined as appropriate in consideration of a material to be used. The pre-baking treatment can be performed at a temperature of, for example, higher than or equal to 50° C. and lower than or equal to 180° C., higher than or equal to 80° C. and lower than or equal to 150° C., or higher than or equal to 90° C. and lower than or equal to 120° C. The first heat treatment may also serve as the pre-baking treatment; that is, a solvent contained in the first layer 24a may be removed by the first heat treatment.

The first resin layer 23a has flexibility. The formation substrate 14 has lower flexibility than the first resin layer 23a.

The first resin layer 23a preferably has a thickness greater than or equal to 0.01 μm and less than 10 μm, further preferably greater than or equal to 0.1 μm and less than or equal to 3 μm, and still further preferably greater than or equal to 0.5 μm and less than or equal to 2 μm. With the use of a solution with low viscosity, the first resin layer 23a having a small thickness can be easily formed. When the first resin layer 23a has a thickness in the above range, the display device can have higher flexibility. Without being limited thereto, the thickness of the first resin layer 23a may be greater than or equal to 10 μm. For example, the first resin layer 23a may have a thickness greater than or equal to 10 μm and less than or equal to 200 μm. The first resin layer 23a that has a thickness greater than or equal to 10 μm is favorable because the rigidity of the display device can be increased.

The first resin layer 23a preferably has a thermal expansion coefficient greater than or equal to 0.1 ppm/° C. and less than or equal to 50 ppm/° C., further preferably greater than or equal to 0.1 ppm/° C. and less than or equal to 20 ppm/° C., still further preferably greater than or equal to 0.1 ppm/° C. and less than or equal to 10 ppm/° C. As the first resin layer 23a has a lower thermal expansion coefficient, generation of a crack in a layer included in a transistor or the like and breakage of a transistor or the like which are caused owing to the heat treatment can be further prevented.

In the case where the first resin layer 23a is positioned on the display surface side of the display device, the first resin layer 23a preferably has a high visible-light transmitting property.

Figure 1C:
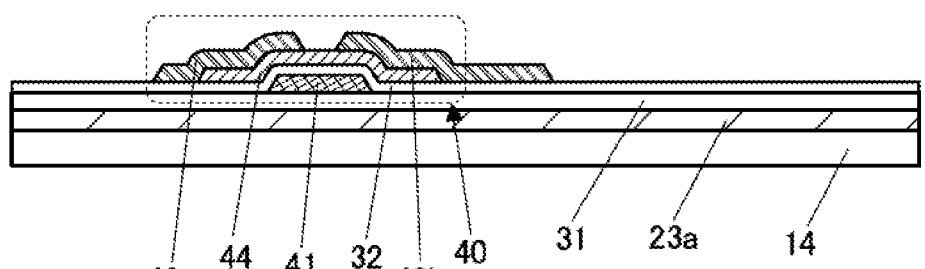

Next, an insulating layer 31 is formed over the first resin layer 23a (FIG. 1C).

The insulating layer 31 is formed at a temperature lower than or equal to the heat resistant temperature of the first resin layer 23a. The insulating layer 31 is preferably formed at a temperature lower than or equal to the temperature of the first heat treatment and may be formed at a temperature lower than the temperature of the first heat treatment.

The insulating layer 31 can be used as a barrier layer that prevents impurities contained in the first resin layer 23a from diffusing into a transistor and a display element formed later. For example, the insulating layer 31 preferably prevents moisture and the like contained in the first resin layer 23a from diffusing into the transistor and the display element when the first resin layer 23a is heated. Thus, the insulating layer 31 preferably has a high barrier property.

For the insulating layer 31, an inorganic insulating film such as a silicon nitride film, a silicon oxynitride film, a silicon oxide film, a silicon nitride oxide film, an aluminum oxide film, or an aluminum nitride film can be used, for example. A hafnium oxide film, a yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used. It is particularly preferable that a silicon nitride film be formed over the first resin layer 23a and a silicon oxide film be formed over the silicon nitride film.

Note that in this specification and the like, silicon oxynitride contains more oxygen than nitrogen, and silicon nitride oxide contains more nitrogen than oxygen.

An inorganic insulating film is preferably formed at high temperatures because the film can have higher density and barrier property as the deposition temperature becomes higher.

The substrate temperature during the deposition of the insulating layer 31 is preferably higher than or equal to room temperature (25° C.) and lower than or equal to 350° C., further preferably higher than or equal to 100° C. and lower than or equal to 300° C.

Next, a transistor 40 is formed over the insulating layer 31 (FIG. 1C).

There is no particular limitation on the structure of the transistor in the display device. For example, a planar transistor, a staggered transistor, or an inverted staggered transistor may be used. A top-gate transistor or a bottom-gate transistor may be used. Gate electrodes may be provided above and below a channel.

Here, the case where a bottom-gate transistor including a metal oxide layer 44 is formed as the transistor 40 is described. The metal oxide layer 44 can serve as a semiconductor layer of the transistor 40. Metal oxide can serve as an oxide semiconductor.

In this embodiment, an oxide semiconductor is used as a semiconductor in the transistor. A semiconductor material having a wider band gap and a lower carrier density than silicon is preferably used because off-state current of the transistor can be reduced.

The transistor 40 is formed at a temperature lower than or equal to the heat resistant temperature of the first resin layer 23a. The transistor 40 is preferably formed at a temperature lower than or equal to the temperature of the first heat treatment and may be formed at a temperature lower than the temperature of the first heat treatment.

Specifically, first, a conductive layer 41 is formed over the insulating layer 31. The conductive layer 41 can be formed in the following manner: a conductive film is formed, a resist mask is formed, the conductive film is etched, and the resist mask is removed.

The substrate temperature during the deposition of the conductive film is preferably higher than or equal to room temperature and lower than or equal to 350° C., further preferably higher than or equal to room temperature and lower than or equal to 300° C.

The conductive layers included in the display device can each have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. Alternatively, a light-transmitting conductive material such as indium oxide, indium tin oxide (ITO), indium oxide containing tungsten, indium zinc oxide containing tungsten, indium oxide containing titanium, ITO containing titanium, indium zinc oxide, zinc oxide (ZnO), ZnO containing gallium, or ITO containing silicon may be used. Alternatively, a semiconductor such as an oxide semiconductor or polycrystalline silicon whose resistance is lowered by containing an impurity element or the like, or silicide such as nickel silicide may be used. A film including graphene may be used as well. The film including graphene can be formed, for example, by reducing a film containing graphene oxide. A semiconductor such as an oxide semiconductor containing an impurity element may be used. Alternatively, the film including graphene may be formed using a conductive paste of silver, carbon, copper, or the like or a conductive polymer such as a polythiophene. A conductive paste is preferable because it is inexpensive. A conductive polymer is preferable because it is easily applied.

Next, an insulating layer 32 is formed. For the insulating layer 32, the description of the inorganic insulating film that can be used for the insulating layer 31 can be referred to.

Then, the metal oxide layer 44 is formed. The metal oxide layer 44 can be formed in the following manner: a metal oxide film is formed, a resist mask is formed, the metal oxide film is etched, and the resist mask is removed.

The substrate temperature during the deposition of the metal oxide film is preferably lower than or equal to 350° C., further preferably higher than or equal to room temperature and lower than or equal to 200° C., still further preferably higher than or equal to room temperature and lower than or equal to 130° C.

The metal oxide film can be formed using one of or both an inert gas and an oxygen gas. Note that there is no particular limitation on the flow rate ratio of oxygen (the partial pressure of oxygen) during the deposition of the metal oxide film. To obtain a transistor having high field-effect mobility, the percentage of oxygen flow rate (the partial pressure of oxygen) during the deposition of the metal oxide film is preferably higher than or equal to 0% and lower than or equal to 30%, further preferably higher than or equal to 5% and lower than or equal to 30%, still further preferably higher than or equal to 7% and lower than or equal to 15%.

The metal oxide film preferably contains at least indium or zinc. In particular, indium and zinc are preferably contained.

The energy gap of the metal oxide is preferably 2 eV or more, further preferably 2.5 eV or more, and still further preferably 3 eV or more. With the use of metal oxide having such a wide energy gap, the off-state current of the transistor can be reduced.

Such a metal oxide film can be formed by a sputtering method. Alternatively, a PLD method, a PECVD method, a thermal CVD method, an ALD method, a vacuum evaporation method, or the like may be used.

Next, a conductive layer 43a and a conductive layer 43b are formed. The conductive layers 43a and 43b can be formed in the following manner: a conductive film is formed, a resist mask is formed, the conductive film is etched, and the resist mask is removed. Each of the conductive layers 43a and 43b is connected to the metal oxide layer 44.

Note that during the processing of the conductive layers 43a and 43b, the metal oxide layer 44 might be partly etched to be thin in a region not covered by the resist mask.

The substrate temperature during the deposition of the conductive film is preferably higher than or equal to room temperature and lower than or equal to 350° C., further preferably higher than or equal to room temperature and lower than or equal to 300° C.

In the above manner, the transistor 40 can be formed (FIG. 1C). In the transistor 40, part of the conductive layer 41 functions as a gate, part of the insulating layer 32 functions as a gate insulating layer, and the conductive layer 43a and the conductive layer 43b function as a source and a drain.

Figure 1D:
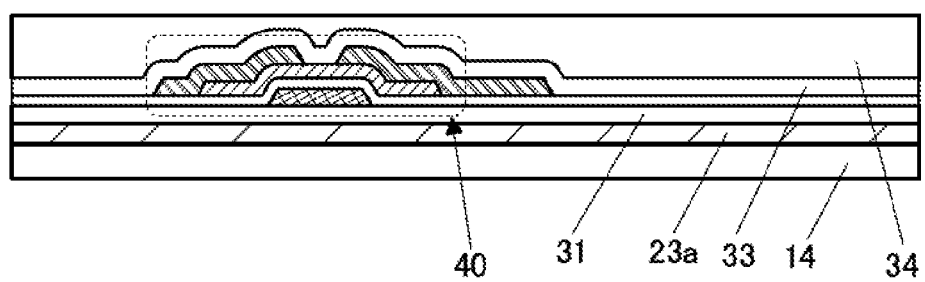

After that, an insulating layer 33 that covers the transistor 40 is formed (FIG. 1D). The insulating layer 33 can be formed in a manner similar to that of the insulating layer 31.

It is preferable to use an oxide insulating film, such as a silicon oxide film or a silicon oxynitride film, formed in an atmosphere containing oxygen for the insulating layer 33. An insulating film with low oxygen diffusibility and oxygen permeability, such as a silicon nitride film, is preferably stacked over the silicon oxide film or the silicon oxynitride film. The oxide insulating film formed in an atmosphere containing oxygen can easily release a large amount of oxygen by heating. When a stack including such an oxide insulating film that releases oxygen and an insulating film with low oxygen diffusibility and oxygen permeability is heated, oxygen can be supplied to the metal oxide layer 44. As a result, oxygen vacancies in the metal oxide layer 44 can be filled and defects at the interface between the metal oxide layer 44 and the insulating layer 33 can be repaired, leading to a reduction in defect levels. Accordingly, an extremely highly reliable display device can be fabricated.

Through the above steps, the insulating layer 31, the transistor 40, and the insulating layer 33 can be formed over the first resin layer 23a (FIG. 1D).

If the formation substrate 14 and the transistor 40 are separated from each other at this stage by a method described later, a flexible device including no display element can be fabricated. Forming the transistor 40 or forming a capacitor, a resistor, a wiring, and the like in addition to the transistor 40 can provide a semiconductor device, for example.

Then, an insulating layer 34 is formed over the insulating layer 33 (FIG. 1D). The display element is formed on the insulating layer 34 in a later step; thus, the insulating layer 34 preferably functions as a planarization layer. For the insulating layer 34, the description of the organic insulating film or the inorganic insulating film that can be used for the insulating layer 31 can be referred to.

The insulating layer 34 is formed at a temperature lower than or equal to the heat resistant temperature of the first resin layer 23a. The insulating layer 34 is preferably formed at a temperature lower than or equal to the temperature of the first heat treatment and may be formed at a temperature lower than the temperature of the first heat treatment.

In the case of using an organic insulating film for the insulating layer 34, a temperature applied to the first resin layer 23a at the formation of the insulating layer 34 is preferably higher than or equal to room temperature and lower than or equal to 350° C. and further preferably higher than or equal to room temperature and lower than or equal to 300° C.

In the case of using an inorganic insulating film for the insulating layer 34, substrate temperature during the deposition is preferably higher than or equal to room temperature and lower than or equal to 350° C., and further preferably higher than or equal to 100° C. and lower than or equal to 300° C.

Next, openings that reach the conductive layer 43b are formed in the insulating layer 34 and the insulating layer 33.

Figure 1E:
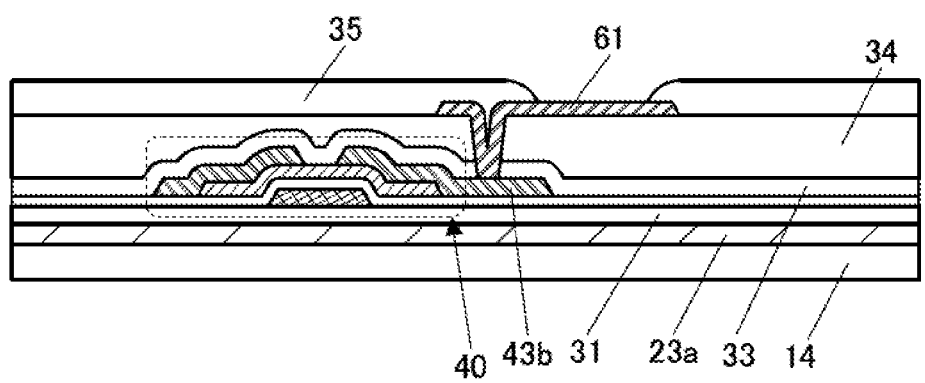

Then, a conductive layer 61 is formed (FIG. 1E). Part of the conductive layer 61 functions as a pixel electrode of the light-emitting element 60. The conductive layer 61 can be formed in the following manner: a conductive film is formed, a resist mask is formed, the conductive film is etched, and the resist mask is removed.

The conductive layer 61 is formed at a temperature lower than or equal to the heat resistant temperature of the first resin layer 23a. The conductive layer 61 is preferably formed at a temperature lower than or equal to the temperature of the first heat treatment and may be formed at a temperature lower than the temperature of the first heat treatment.

The substrate temperature during the deposition of the conductive film is preferably higher than or equal to room temperature and lower than or equal to 350° C., further preferably higher than or equal to room temperature and lower than or equal to 300° C.

Then, an insulating layer 35 that covers an end portion of the conductive layer 61 is formed (FIG. 1E). For the insulating layer 35, the description of the organic insulating film or the inorganic insulating film that can be used for the insulating layer 31 can be referred to.

The insulating layer 35 is formed at a temperature lower than or equal to the heat resistant temperature of the first resin layer 23a. The insulating layer 35 is preferably formed at a temperature lower than or equal to the temperature of the first heat treatment and may be formed at a temperature lower than the temperature of the first heat treatment.

In the case of using an organic insulating film for the insulating layer 35, a temperature applied to the first resin layer 23a at the formation of the insulating layer 35 is preferably higher than or equal to room temperature and lower than or equal to 350° C. and further preferably higher than or equal to room temperature and lower than or equal to 300° C.

In the case of using an inorganic insulating film for the insulating layer 35, substrate temperature during the deposition is preferably higher than or equal to room temperature and lower than or equal to 350° C., and further preferably higher than or equal to 100° C. and lower than or equal to 300° C.

Figure 2A:
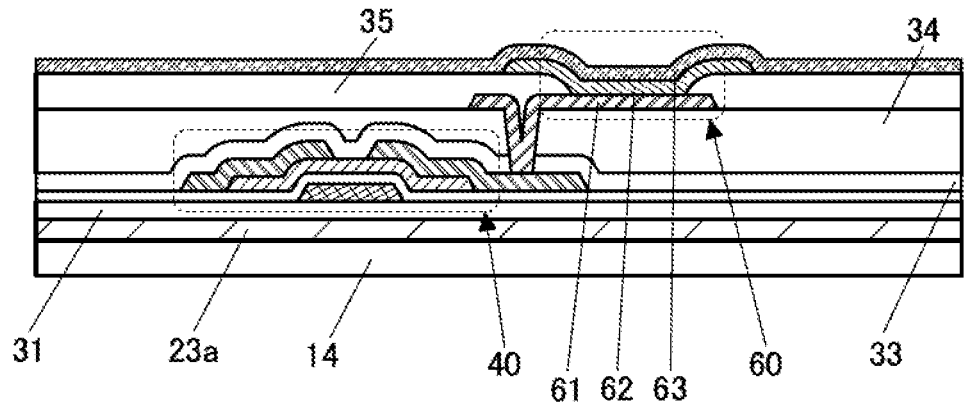
FIGS. 2A to 2C are cross-sectional views illustrating an example of a manufacturing method of a display device.

Then, an EL layer 62 and a conductive layer 63 are formed (FIG. 2A). Part of the conductive layer 63 functions as a common electrode of the light-emitting element 60.

The EL layer 62 can be formed by an evaporation method, a coating method, a printing method, a discharge method, or the like. In the case where the EL layer 62 is formed for each individual pixel, an evaporation method using a blocking mask such as a metal mask, an ink-jet method, or the like can be used. In the case of sharing the EL layer 62 by some pixels, an evaporation method not using a metal mask can be used.

Either a low molecular compound or a high molecular compound can be used for the EL layer 62, and an inorganic compound may also be included.

The conductive layer 63 can be formed by an evaporation method, a sputtering method, or the like.

The conductive layer 63 is formed at a temperature lower than or equal to the heat resistant temperature of the first resin layer 23a and lower than or equal to the heat resistant temperature of the EL layer 62. The conductive layer 63 is preferably formed at a temperature lower than or equal to the temperature of the first heat treatment and may be formed at a temperature lower than the temperature of the first heat treatment.

In the above manner, the light-emitting element 60 can be completed (FIG. 2A). In the light-emitting element 60, the conductive layer 61 part of which functions as a pixel electrode, the EL layer 62, and the conductive layer 63 part of which functions as a common electrode are stacked.

Although a top-emission light-emitting element is formed as the light-emitting element 60 here, one embodiment of the present invention is not limited thereto.

The light-emitting element may be a top-emission, bottom-emission, or dual-emission light-emitting element. A conductive film that transmits visible light is used as the electrode through which light is extracted. A conductive film that reflects visible light is preferably used as the electrode through which light is not extracted.

Figure 2B:
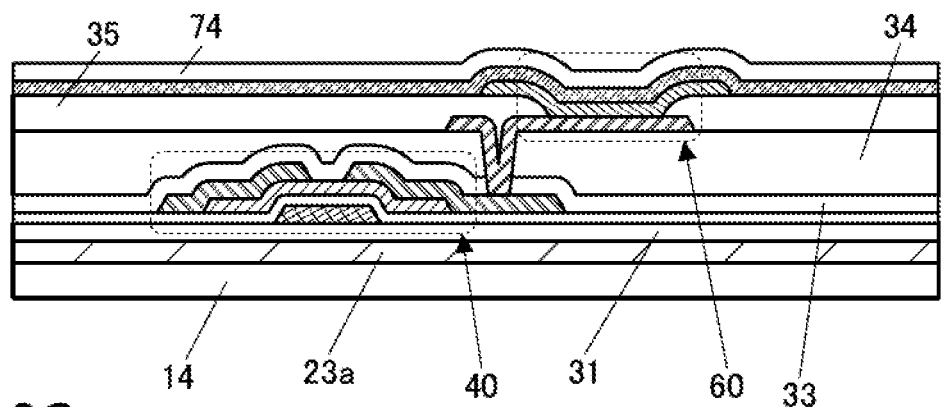

Then, an insulating layer 74 is formed covering the conductive layer 63 (FIG. 2B). The insulating layer 74 functions as a protective layer that prevents diffusion of impurities such as water into the light-emitting element 60. The light-emitting element 60 is sealed with the insulating layer 74. After the conductive layer 63 is formed, the insulating layer 74 is preferably formed without exposure to the air.

The insulating layer 74 is formed at a temperature lower than or equal to the heat resistant temperature of the first resin layer 23a and lower than or equal to the heat resistant temperature of the light-emitting element 60. The insulating layer 74 is preferably formed at a temperature lower than or equal to the temperature of the first heat treatment and may be formed at a temperature lower than the temperature of the first heat treatment.

The insulating layer 74 preferably includes an inorganic insulating film with a high barrier property that can be used for the insulating layer 31. A stack including an inorganic insulating film and an organic insulating film can also be used.

The insulating layer 74 can be formed by an ALD method, a sputtering method, or the like. An ALD method and a sputtering method are preferable because a film can be formed at low temperatures. An ALD method is preferable because the coverage of the insulating layer 74 is improved.

Figure 2C:
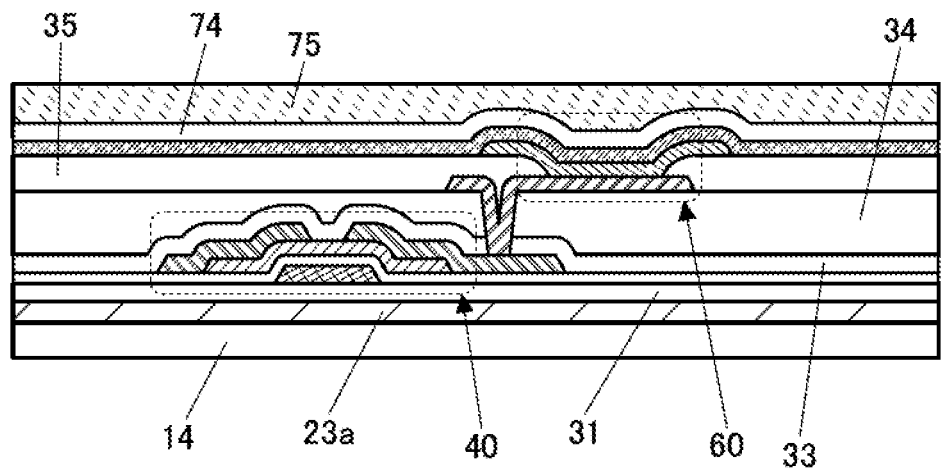

Then, a protective layer 75 is formed over the insulating layer 74 (FIG. 2C). The protective layer 75 can be used as a layer positioned on the outermost surface of the display device. The protective layer 75 preferably has a high visible-light transmitting property.

The above-described organic insulating film that can be used for the insulating layer 31 is preferably used for the protective layer 75 because the surface of the display device can be prevented from being damaged or cracked.

Figure 3A:
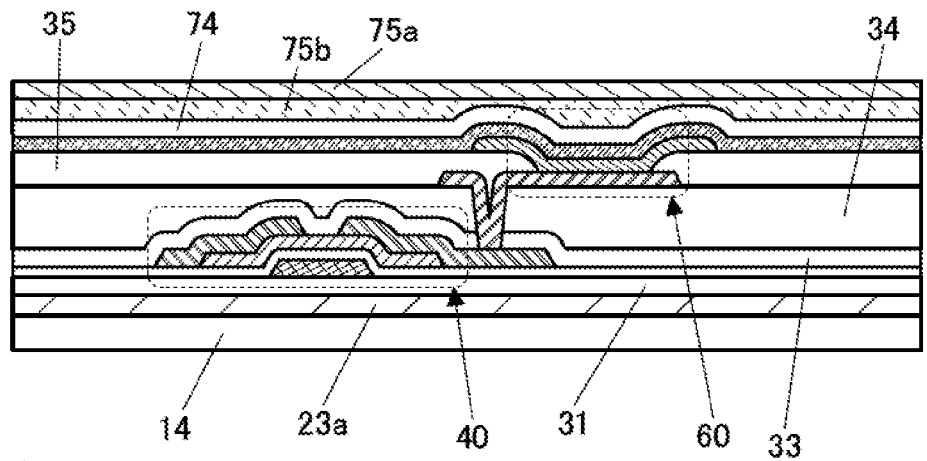
FIGS. 3A to 3C are cross-sectional views illustrating an example of a manufacturing method of a display device.

FIG. 3A illustrates an example in which a substrate 75a is attached to the insulating layer 74 with a bonding layer 75b.

As the bonding layer 75b, any of a variety of curable adhesives such as a reactive curable adhesive, a thermosetting adhesive, an anaerobic adhesive, and a photocurable adhesive such as an ultraviolet curable adhesive can be used. Still alternatively, an adhesive sheet or the like may be used.

For the substrate 75a, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. The substrate 75a formed using any of a variety of materials such as glass, quartz, a resin, a metal, an alloy, and a semiconductor may be thin enough to be flexible.

Figure 3B:
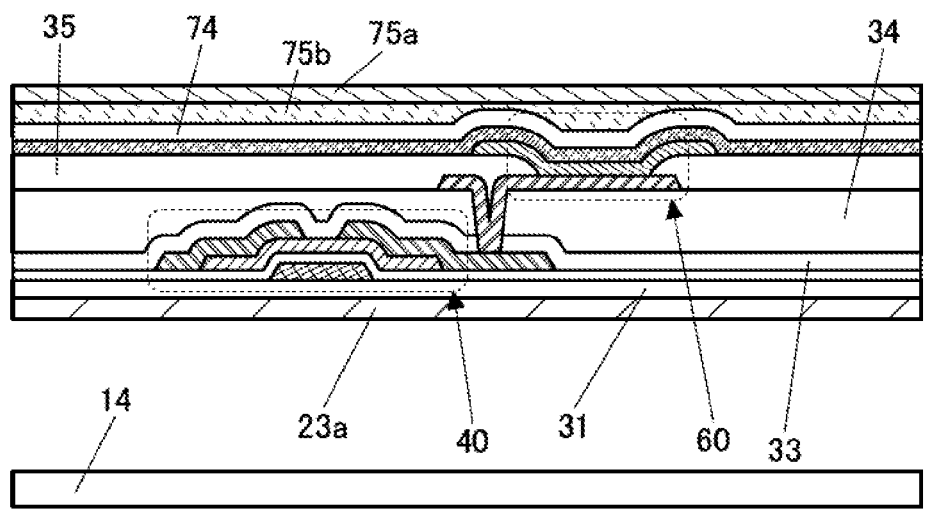

Then, the formation substrate 14 and the first resin layer 23a are separated from each other (FIG. 3B).

For example, the first resin layer 23a can be separated from the formation substrate 14 by applying a perpendicular tensile force to the first resin layer 23a. Specifically, the first resin layer 23a can be separated from the formation substrate 14 by pulling up the substrate 75a by part of its suction-attached top surface.

Here, if the separation is performed in such a manner that liquid containing water such as water or an aqueous solution is added to the separation interface and the liquid penetrates into the separation interface, the separability can be improved. Furthermore, an adverse effect of static electricity caused at the separation on a functional element such as a transistor (e.g., damage to a semiconductor element from static electricity) can be suppressed.

Before the separation, a separation starting point may be formed by separating part of the first resin layer 23a from the formation substrate 14. For example, a separation starting point may be formed by inserting a sharp instrument such as a knife between the formation substrate 14 and the first resin layer 23a. Alternatively, a separation starting point may be formed by cutting the first resin layer 23a from the substrate 75a side with a sharp instrument. The separation starting point may be formed by a method using a laser such as a laser ablation method.

In the manufacturing method example 1, the first heat treatment is performed in the atmosphere containing oxygen at the time of forming the first resin layer 23a; thus, the formation substrate 14 and the first resin layer 23a can be separated from each other without performing laser irradiation on the entire surface of the first resin layer 23a. Consequently, the display device can be manufactured at low cost.

Figure 3C:
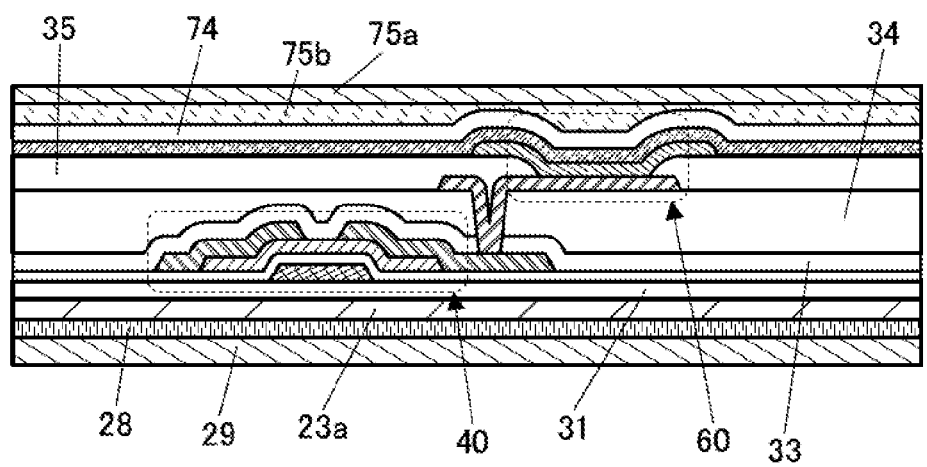

The first resin layer 23a that is exposed by being separated from the formation substrate 14 may be attached to a substrate 29 using a bonding layer 28 (FIG. 3C). The substrate 29 can serve as a support substrate of the display device.

The material that can be used for the bonding layer 75b can be used for the bonding layer 28. The material that can be used for the substrate 75a can be used for the substrate 29.

Through the above steps, the display device using metal oxide for the channel formation region of the transistor and a separate coloring method for an EL element can be fabricated.

[Manufacturing Method Example 2]

In a manufacturing method example given below, description of a portion similar to that in the above-described manufacturing method example is omitted in some cases.

Figure 4A:
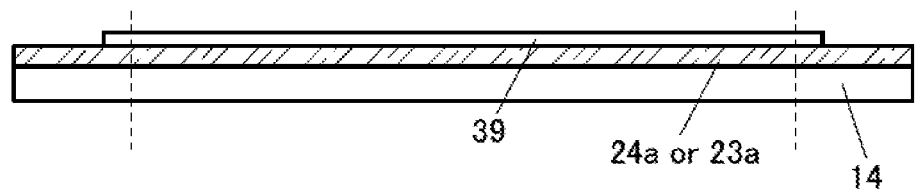

First, the first layer 24a is formed over the formation substrate 14 (FIG. 4A).

For a material and a method that are used to form the first layer 24a, the manufacturing method example 1 can be referred to.

Figure 4B:
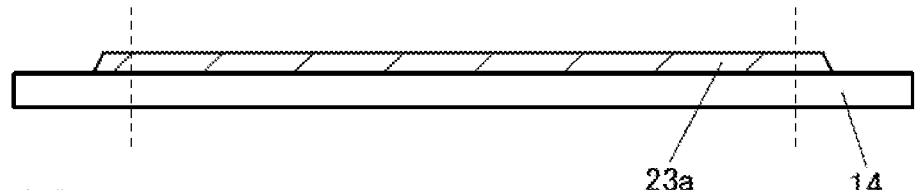

Then, the first heat treatment is performed on the first layer 24a, whereby the first resin layer 23a is formed (FIG. 4B). The first resin layer 23a includes a residue of an oxydiphthalic acid.

As in the manufacturing method example 1, the first heat treatment is performed in the atmosphere containing oxygen. In the first heat treatment, a gas containing oxygen is preferably made to flow.

In FIG. 4B, an example of forming the first resin layer 23a that has an island-like shape is shown.

A mask 39 such as a resist mask or a hard mask is formed over the first layer 24a or the first resin layer 23a, and etching is performed, whereby the first resin layer 23a that has a desired shape can be formed. For example, the first layer 24a subjected to the pre-baking treatment or the first resin layer 23a formed through the first heat treatment can be processed.

For example, an inorganic film is formed over the first resin layer 23a, and a resist mask is formed over the inorganic film. After the inorganic film is etched using the resist mask, the first resin layer 23a can be etched using the inorganic film as a hard mask.

Examples of the inorganic film that can be used as the hard mask include a variety of inorganic insulating films that can be used to form the insulating layer 31 and a metal film and an alloy film that can be used to form the conductive layer.

It is preferable to form the mask 39 with an extremely small thickness and remove the mask 39 concurrently with the etching, in which case a step of removing the mask 39 can be eliminated.

Figure 4C:
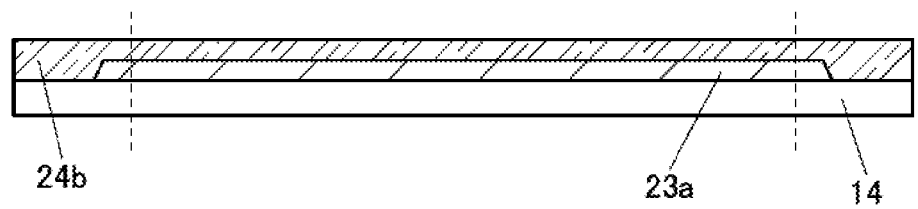
Figure 4C:
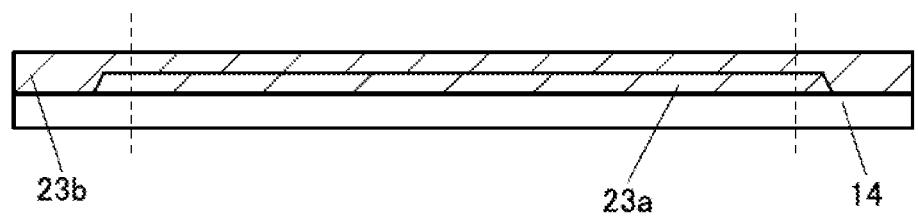
Figure 4C:
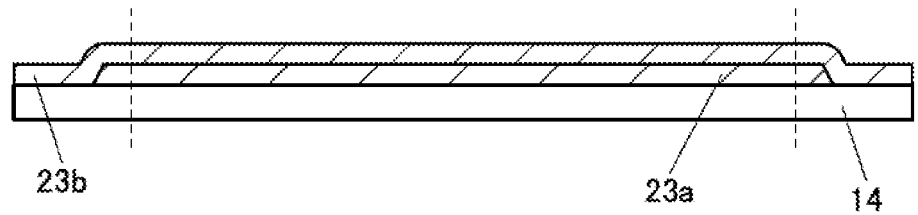

Then, a second layer 24b is formed over the formation substrate 14 and the first resin layer 23a (FIG. 4C). A portion where the first resin layer 23a is not provided exists over the formation substrate 14. Thus, a portion that is in contact with the second layer 24b can be formed on the formation substrate 14.

The second layer 24b is preferably formed using a thermosetting material. The second layer 24b may be formed using either a photosensitive material or a non-photosensitive material.

The second layer 24b can be formed using a material and a method that can be used to form the first layer 24a. Forming the second layer 24b using a material that can be used to form the first layer 24a is preferable because the costs can be reduced.

Examples of a resin material that can be used to form the second layer 24b include an acrylic resin, an epoxy resin, a polyamide resin, a polyimide-amide resin, a siloxane resin, a benzocyclobutene-based resin, and a phenol resin, and a precursor of these resins.

The second layer 24b is preferably formed by a coating method, in which case step coverage is improved and a surface of a second resin layer 23b described later can be flat.

Then, second heat treatment is performed on the second layer 24b, whereby the second resin layer 23b is formed (FIG. 4D1). The second resin layer 23b preferably includes a residue of an oxydiphthalic acid.

The second heat treatment is performed in an atmosphere containing less oxygen than the atmosphere of the first heat treatment. In the second heat treatment, it is preferable that a gas containing oxygen not be made to flow or a gas in which the proportion of oxygen is lower than the proportion of oxygen in the gas used in the first heat treatment be made to flow.

The second heat treatment can be performed in a state where the atmosphere in a chamber of an apparatus is a nitrogen atmosphere or a rare gas atmosphere, for example.

The partial pressure of oxygen in performing the second heat treatment is preferably higher than or equal to 0% and lower than 15%, further preferably higher than or equal to 0% and lower than or equal to 10%, still further preferably higher than or equal to 0% and lower than or equal to 5%.

The second heat treatment is preferably performed while a gas that does not contain oxygen or a gas in which the proportion of oxygen is lower than the proportion of oxygen in the gas used in the first heat treatment is made to flow into the chamber of the apparatus. The second heat treatment is preferably performed while only a nitrogen gas, only an argon gas, or a mixed gas containing oxygen is made to flow. Specifically, a mixed gas containing oxygen and nitrogen or a rare gas (e.g., argon) can be used. The proportion of the flow rate of the oxygen gas in the flow rate of the whole mixed gas is preferably higher than 0% and lower than 15%, further preferably higher than 0% and lower than or equal to 10%, still further preferably higher than 0% and lower than or equal to 5%.

The temperature of the second heat treatment is preferably higher than or equal to 200° C. and lower than or equal to 500° C., further preferably higher than or equal to 250° C. and lower than or equal to 475° C., still further preferably higher than or equal to 300° C. and lower than or equal to 450° C.

By the second heat treatment, released gas components (e.g., hydrogen or water) in the second resin layer 23b can be reduced. In particular, heating is preferably performed at a temperature higher than or equal to the formation temperature of each layer formed over the second resin layer 23b. Thus, a gas released from the second resin layer 23b in the manufacturing process of the transistor can be significantly reduced.

For example, in the case where the manufacturing temperature of the transistor is below 350° C., a film to be the second resin layer 23b is preferably heated at a temperature higher than or equal to 350° C. and lower than or equal to 450° C., further preferably lower than or equal to 400° C., still further preferably lower than or equal to 375° C. Thus, a gas released from the second resin layer 23b in the manufacturing process of the transistor can be significantly reduced.

The maximum temperature in manufacturing the transistor is preferably equal to the temperature of the second heat treatment, in which case the maximum temperature in manufacturing the device can be prevented from being increased by the second heat treatment.

The longer the second heat treatment time is, the more sufficiently released gas components in the second resin layer 23b can be reduced.

By increasing the heating time of the heat treatment, even when the heating temperature is comparatively low, an effect equivalent to that obtained in heating at a high temperature can be obtained in some cases. Therefore, in the case where the heating temperature cannot be increased because of the structure of the apparatus, it is preferable to increase the heating time of the treatment.

The heating time of the second heat treatment is preferably longer than or equal to 5 minutes and shorter than or equal to 24 hours, further preferably longer than or equal to 30 minutes and shorter than or equal to 12 hours, still further preferably longer than or equal to 1 hour and shorter than or equal to 6 hours, for example. Note that the heating time of the second heat treatment is not limited to this. The heating time of the second heat treatment may be shorter than 5 minutes in the case where the second heat treatment is performed by RTA, for example.

Note that by the heat treatment, the thickness of the second resin layer 23b is changed from the thickness of the second layer 24b in some cases.

Before the second heat treatment is performed, thermal treatment (pre-baking treatment) for removing a solvent contained in the second layer 24b may be performed. The second heat treatment may also serve as the pre-baking treatment; that is, a solvent contained in the second layer 24b may be removed by the second heat treatment.

The second resin layer 23b has flexibility. The formation substrate 14 has lower flexibility than the second resin layer 23b.

The second resin layer 23b preferably has a thickness greater than or equal to 0.01 μm and less than 10 μm, further preferably greater than or equal to 0.1 μm and less than or equal to 3 μm, and still further preferably greater than or equal to 0.5 μm and less than or equal to 2 μm. With the use of a solution having low viscosity, the second resin layer 23b having a small thickness can be easily formed. When the second resin layer 23b has a thickness in the above range, the display device can have higher flexibility. Without being limited thereto, the thickness of the second resin layer 23b may be greater than or equal to 10 μm. For example, the second resin layer 23b may have a thickness greater than or equal to 10 μm and less than or equal to 200 μm. The second resin layer 23b that has a thickness greater than or equal to 10 μm is favorable because the rigidity of the display device can be increased.

The second resin layer 23b preferably has a thermal expansion coefficient greater than or equal to 0.1 ppm/° C. and less than or equal to 50 ppm/° C., further preferably greater than or equal to 0.1 ppm/° C. and less than or equal to 20 ppm/° C., still further preferably greater than or equal to 0.1 ppm/° C. and less than or equal to 10 ppm/° C. As the second resin layer 23b has a lower thermal expansion coefficient, generation of a crack in a layer included in a transistor or the like and breakage of a transistor or the like which are caused owing to the heat treatment can be further prevented.

In the case where the second resin layer 23b is positioned on the display surface side of the display device, the second resin layer 23b preferably has a high visible-light transmitting property.

The second resin layer 23b that does not have a planarizing function may be used. Although the second resin layer 23b has a flat top surface in an example shown in FIG. 4D1, the second resin layer 23b may have an uneven top surface as shown in FIG. 4D2.

Figure 4E:
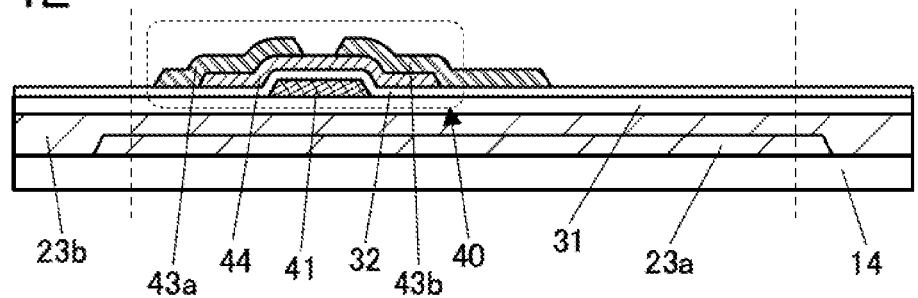

Next, the insulating layer 31 is formed over the second resin layer 23b (FIG. 4E).

The insulating layer 31 is formed at a temperature lower than or equal to the heat resistance temperature of the first resin layer 23a and lower than or equal to the heat resistance temperature of the second resin layer 23b. The insulating layer 31 is preferably formed at a temperature lower than or equal to the temperature of the first heat treatment and lower than or equal to the temperature of the second heat treatment and may be formed at a temperature lower than both of the temperature of the first heat treatment and the temperature of the second heat treatment.

The insulating layer 31 can be used as a barrier layer that prevents diffusion of impurities contained in the first resin layer 23a and the second resin layer 23b into a transistor and a display element formed later. For example, the insulating layer 31 preferably prevents moisture and the like contained in the first resin layer 23a and the second resin layer 23b from diffusing into the transistor and the display element when the first resin layer 23a and the second resin layer 23b are heated. Thus, the insulating layer 31 preferably has a high barrier property.

For the insulating layer 31, the material given as an example in the manufacturing method example 1 can be used.

Next, the transistor 40 is formed over the insulating layer 31 (FIG. 4E).

The transistor 40 is formed at a temperature lower than or equal to the heat resistance temperature of the first resin layer 23a and lower than or equal to the heat resistance temperature of the second resin layer 23b. The transistor 40 is preferably formed at a temperature lower than or equal to the temperature of the first heat treatment and lower than or equal to the temperature of the second heat treatment and may be formed at a temperature lower than both of the temperature of the first heat treatment and the temperature of the second heat treatment.

Figure 5A:
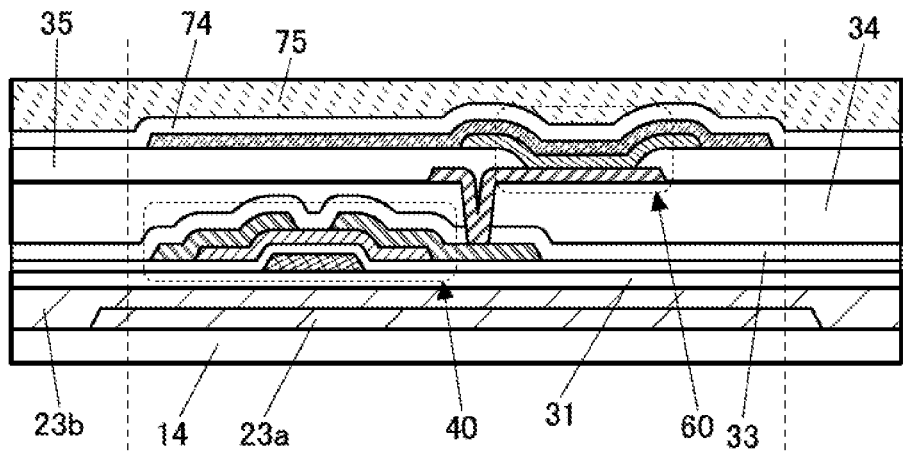
Figure 5A:
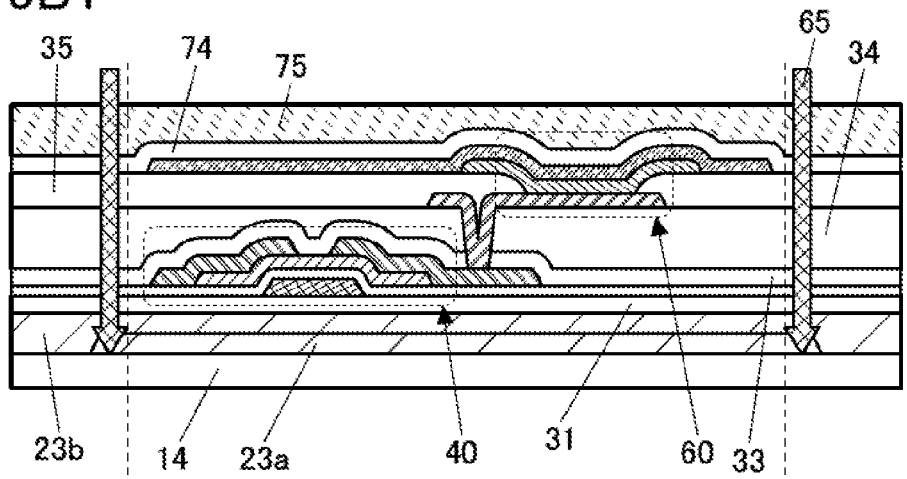
Figure 5A:
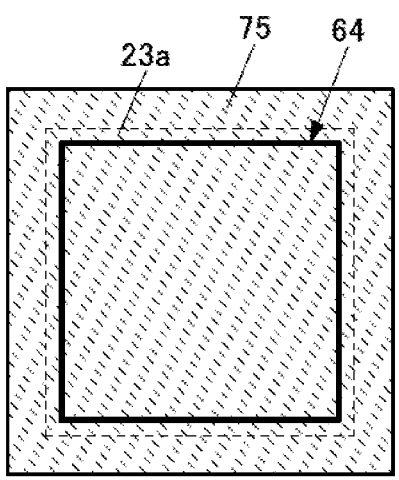
Figure 5A:
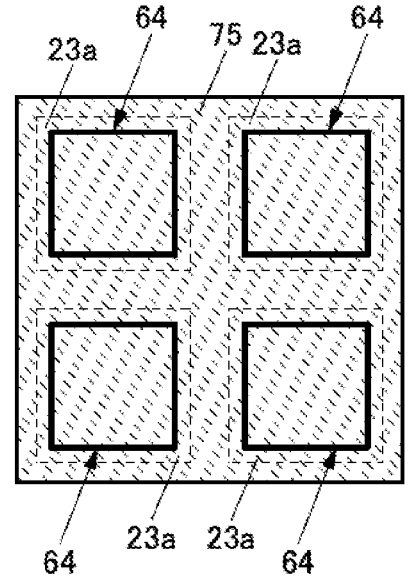

Then, in a manner similar to that described in the manufacturing method example 1, constituents from the insulating layer 33 to the protective layer 75 are formed (FIG. 5A). Note that the constituents are formed at a temperature lower than or equal to the heat resistance temperature of the first resin layer 23a and lower than or equal to the heat resistance temperature of the second resin layer 23b. The constituents are preferably formed at a temperature lower than or equal to the temperature of the first heat treatment and lower than or equal to the temperature of the second heat treatment and may be formed at a temperature lower than both of the temperature of the first heat treatment and the temperature of the second heat treatment.

Then, the separation starting point is formed in the first resin layer 23a (FIGS. 5B1 and 5B2).

For example, a sharp instrument 65 such as a knife is inserted from the protective layer 75 side into a portion inward from an end portion of the first resin layer 23a to form a frame-like-shaped cut 64.

The first resin layer 23a may be irradiated with laser light in a frame-like shape.

Note that in the case where a plurality of display devices are formed using one formation substrate (multiple panels are obtained from one substrate), a plurality of display devices can be formed using one first resin layer 23a. For example, a plurality of display devices are positioned in a portion inside the cut 64 shown in FIG. 5B2. Thus, a plurality of display devices can be separated from the formation substrate at a time.

Alternatively, a plurality of first resin layers 23a may be formed so that the first resin layer 23a is provided for each display device. In FIG. 5B3, an example in which four first resin layers 23a are formed over the formation substrate is shown. By forming the frame-like-shaped cut 64 in each of the four first resin layers 23a, display devices can be separated at different times.

In the manufacturing method example 2, a portion that is in contact with the first resin layer 23a and a portion that is in contact with the second resin layer 23b are provided for the formation substrate 14. By the first heat treatment performed in the atmosphere containing oxygen, the first resin layer 23a becomes easy to separate from the formation substrate 14. In contrast, the second resin layer 23b is difficult to separate from the formation substrate 14 because the second heat treatment is performed in the atmosphere containing less oxygen than the atmosphere of the first heat treatment. Thus, separation of the first resin layer 23a from the formation substrate 14 that will occur at an unintended time can be inhibited. Furthermore, the separation starting point enables separation of the formation substrate 14 and the first resin layer 23a from each other at a desired time. As a result, the time at which the separation occurs can be controlled and high separability can be achieved. This can improve the yield of the separation process and the manufacturing process of the display device.

Figure 6A:
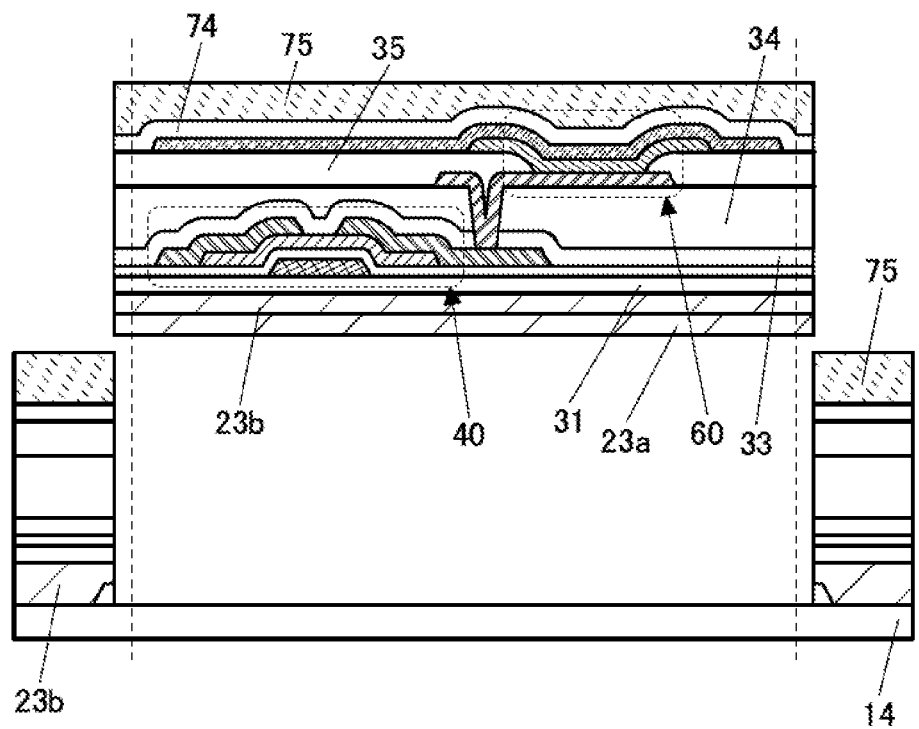
FIGS. 6A and 6B are cross-sectional views illustrating an example of a manufacturing method of a display device.

Then, the formation substrate 14 and the transistor 40 are separated from each other (FIG. 6A).

In the manufacturing method example 2, the first heat treatment is performed in the atmosphere containing oxygen at the time of forming the first resin layer 23a; thus, the formation substrate 14 and the first resin layer 23a can be separated from each other without performing laser irradiation on the entire surface of the first resin layer 23a. Consequently, the display device can be manufactured at low cost.

Figure 6B:
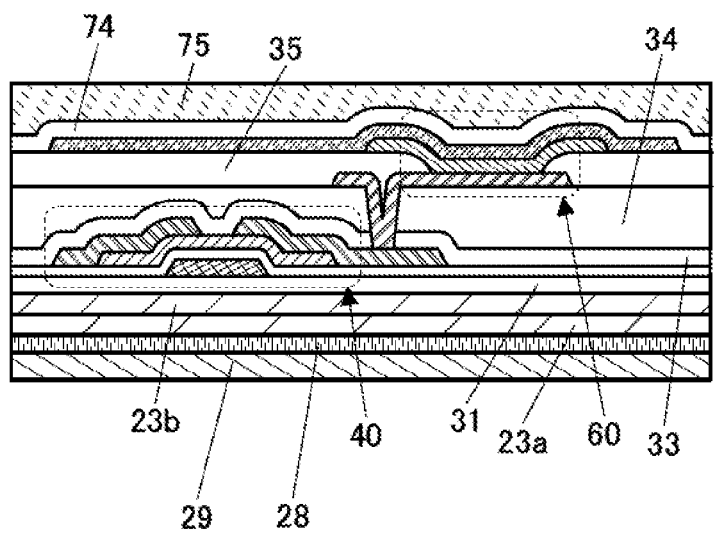

Then, the first resin layer 23a that is exposed by being separated from the formation substrate 14 is attached to the substrate 29 using the bonding layer 28 (FIG. 6B). The substrate 29 can serve as a support substrate of the display device.

Through the above steps, the display device using metal oxide in the channel formation region of the transistor and a separate coloring method for an EL element can be fabricated.

[Structure Example 1 of Display Device]

Figure 7A:
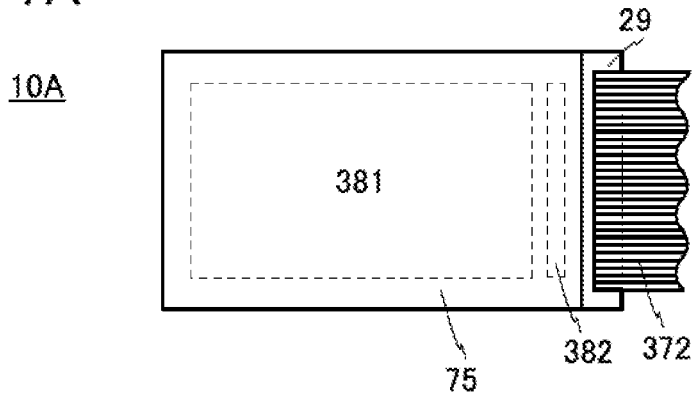
FIGS. 7A to 7C are a top view and cross-sectional views illustrating an example of a display device.
Figure 7B:
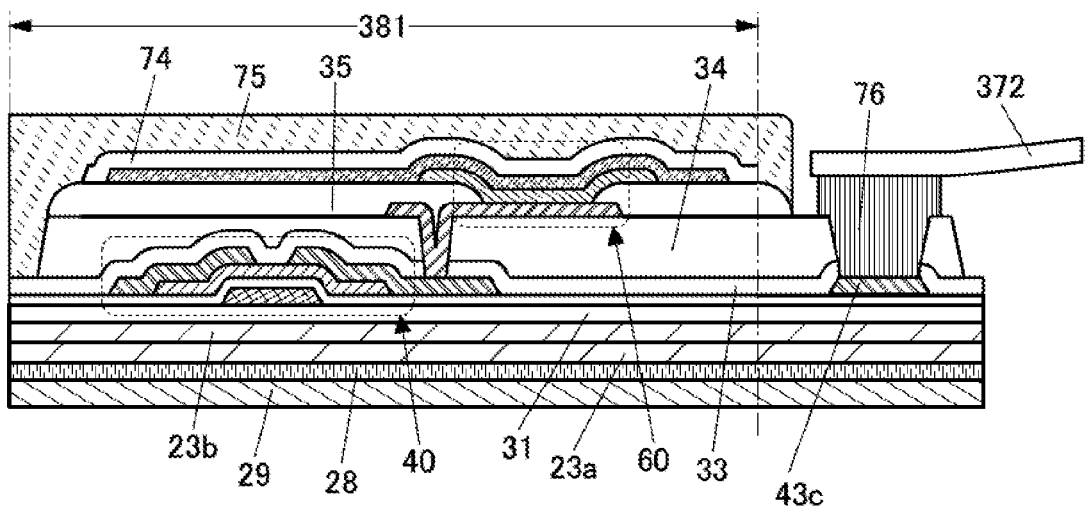
Figure 7C:
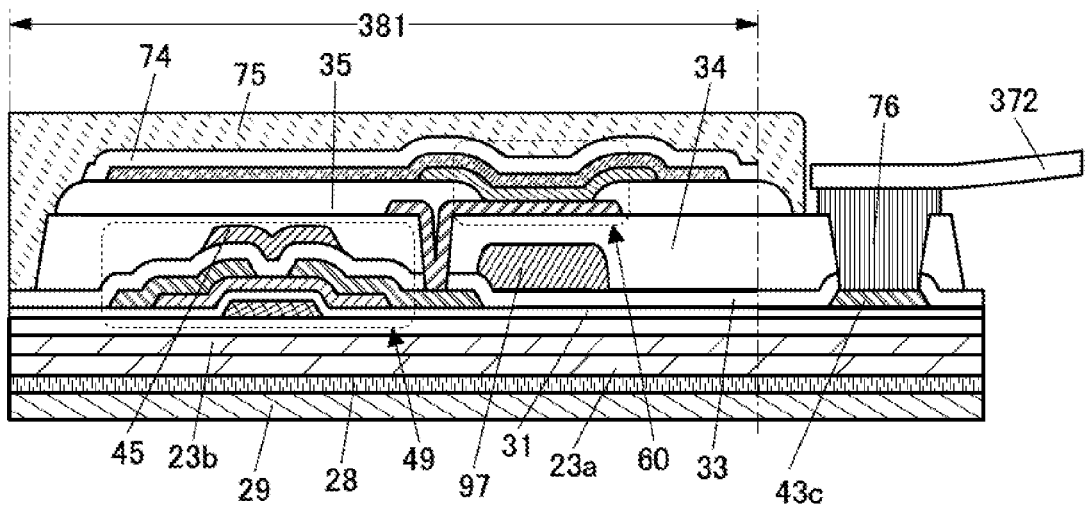

FIG. 7A is a top view of a display device 10A. FIGS. 7B and 7C show examples of a cross-sectional view of a display portion 381 and a cross-sectional view of a connection portion for connection to an FPC 372 in the display device 10A.

The display device 10A can be manufactured by the manufacturing method example 2. The display device 10A can remain being bent or can be bent repeatedly, for example.

The display device 10A includes the protective layer 75 and the substrate 29. The protective layer 75 side corresponds to the display surface side of the display device. The display device 10A includes the display portion 381 and a driver circuit portion 382. The FPC 372 is attached to the display device 10A.

A conductive layer 43c is electrically connected to the FPC 372 through a connector 76 (FIGS. 7B and 7C). The conductive layer 43c can be formed using the same material and the same step as those used to form the source and the drain of the transistor.

As the connector 76, any of various anisotropic conductive films (ACF), anisotropic conductive pastes (ACP), and the like can be used.

The display device shown in FIG. 7C is different from the display device shown in FIG. 7B in that a transistor 49 is included instead of the transistor 40 and that a coloring layer 97 is provided over the insulating layer 33. In the case where the light-emitting element 60 is a bottom-emission type light-emitting element, the coloring layer 97 can be provided closer to the substrate 29 than the light-emitting element 60 is.

In the transistor 49 shown in FIG. 7C, a conductive layer 45 serving as a gate is added to the structure of the transistor 40 shown in FIG. 7B.

The structure in which the semiconductor layer where a channel is formed is provided between two gates is used as an example of the transistor 49. Such a structure enables control of threshold voltages of transistor. In that case, the two gates may be connected to each other and supplied with the same signal to operate the transistor. Such a transistor can have a higher field-effect mobility and thus have higher on-state current than other transistors. Consequently, a circuit capable of high-speed operation can be obtained. Furthermore, the area occupied by a circuit portion can be reduced. The use of the transistor having high on-state current can reduce signal delay in wirings and can reduce display unevenness even in a display device in which the number of wirings is increased because of increase in size or definition.

Alternatively, by supplying a potential for controlling the threshold voltage to one of the two gates and a potential for driving to the other, the threshold voltage of the transistor can be controlled.

As described above, by the heat treatment performed in the atmosphere containing oxygen, the first resin layer 23a can be separated from the formation substrate without performing laser irradiation on the entire surface of the first resin layer 23a. Therefore, in some cases, it is shown by analysis that a large amount of oxygen is contained in the first resin layer 23a included in the display device manufactured by the manufacturing method of the display device of this embodiment. Specifically, the oxygen concentration can be measured by analyzing, using XPS, a surface of the first resin layer 23a on the separation surface side (the surface is also referred to as the surface on the formation substrate side and corresponds to a surface in contact with the bonding layer 28 in FIGS. 7B and 7C). In particular, the oxygen concentration measured by the XPS analysis performed on the surface of the first resin layer 23a on the bonding layer 28 side is preferably higher than or equal to 10 atomic %, further preferably higher than or equal to 15 atomic %.

Components (e.g., an acid component and an amine component in a polyimide resin) contained in the first resin layer 23a and the second resin layer 23b can be recognized by analyzing these resin layers by using one or more analysis methods such as Fourier transform infrared spectroscopy (FTIR), nuclear magnetic resonance measurements ($^1$H NMR), gas chromatography mass spectrometry (GC/MS), liquid chromatography mass spectrometry (LC/MS), time-of-flight secondary ion mass spectrometry (ToF-SIMS), and matrix-assisted laser desorption/ionization time-of-flight mass spectrometry (MALDI-ToF-MS).

[Manufacturing Method Example 3]

Although the first resin layer 23a and the second resin layer 23b are formed in the manufacturing method example 2, the second resin layer 23b is not necessarily provided depending on the level of adhesion between the insulating layer 31 and the formation substrate 14.

Figure 8A:
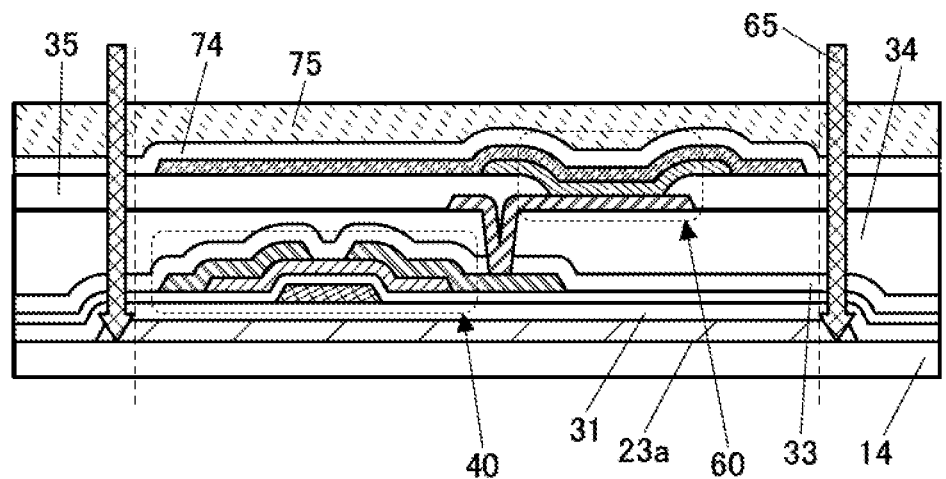
FIGS. 8A and 8B are cross-sectional views illustrating an example of a manufacturing method of a display device.

Specifically, after the first resin layer 23a is formed over the formation substrate 14, the insulating layer 31 may be formed in contact with top surfaces of the formation substrate 14 and the first resin layer 23a. Then, constituents from the transistor 40 to the protective layer 75 are formed over the insulating layer 31 (FIG. 8A).

Figure 8B:
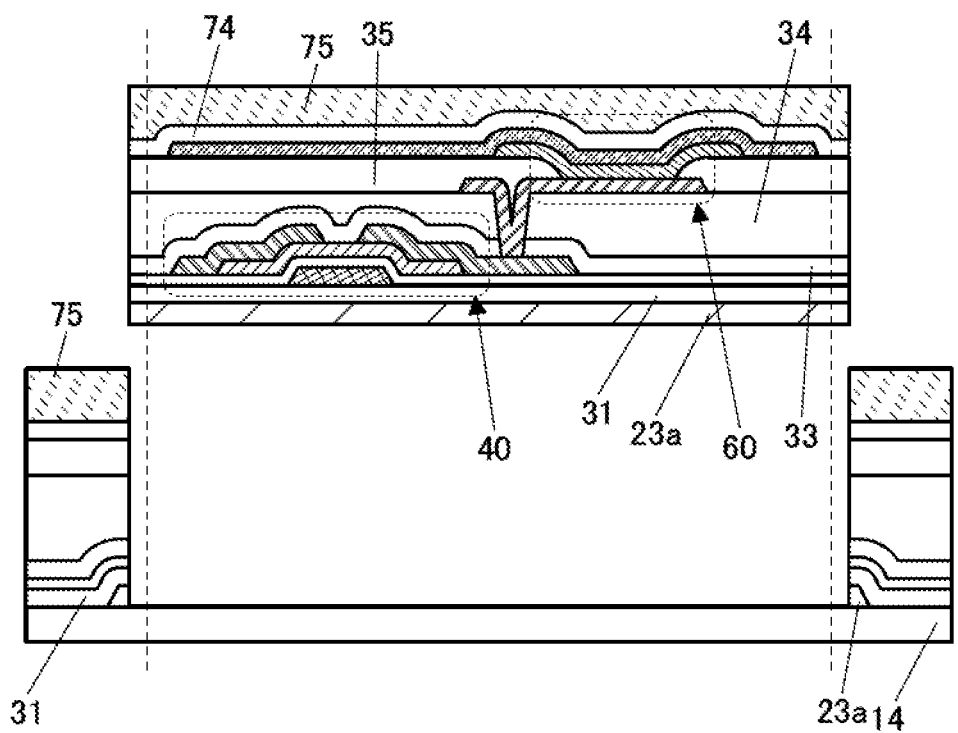

In the manufacturing method example 3, the portion that is in contact with the first resin layer 23a and a portion that is in contact with the insulating layer 31 are provided for the formation substrate 14. When the formation substrate 14 and the insulating layer 31 adhere to each other with sufficiently high adhesion, unintentional separation of the first resin layer 23a from the formation substrate 14 can be inhibited even in the case where the first resin layer 23a has high separability. Furthermore, the separation starting point is formed (see the instrument 65 shown in FIG. 8A), whereby the formation substrate 14 and the first resin layer 23a can be separated from each other at a desired time (FIG. 8B). As a result, the time at which the separation occurs can be controlled and high separability can be achieved. This can improve the yield of the separation process and the manufacturing process of the display device.

[Manufacturing Method Example 4]

Figure 9A:
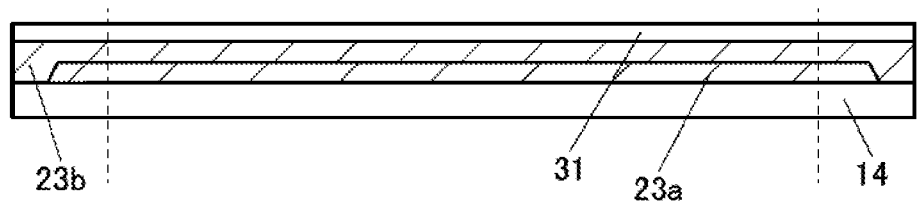
FIGS. 9A to 9C are cross-sectional views illustrating an example of a manufacturing method of a display device.

First, in a manner similar to that in the manufacturing method example 2, constituents from the first resin layer 23a to the insulating layer 31 are formed over the formation substrate 14 (FIG. 9A).

Figure 9B:
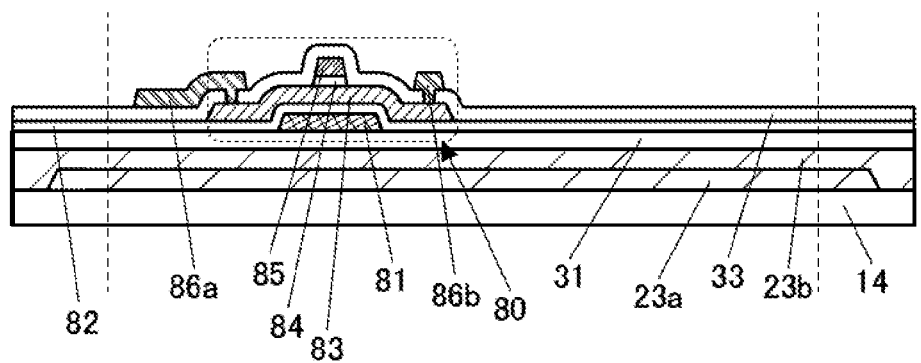

Then, a transistor 80 is formed over the insulating layer 31 (FIG. 9B).

Here, the case where a transistor including a metal oxide layer 83 and two gates is formed as the transistor 80 is described.

The transistor 80 is formed at a temperature lower than or equal to the heat resistance temperature of the first resin layer 23a and lower than or equal to the heat resistance temperature of the second resin layer 23b. The transistor 80 is preferably formed at a temperature lower than or equal to the temperature of the first heat treatment and lower than or equal to the temperature of the second heat treatment and may be formed at a temperature lower than both of the temperature of the first heat treatment and the temperature of the second heat treatment.

Specifically, first, a conductive layer 81 is formed over the insulating layer 31. The conductive layer 81 can be formed in the following manner: a conductive film is formed, a resist mask is formed, the conductive film is etched, and the resist mask is removed.

Next, an insulating layer 82 is formed. For the insulating layer 82, the description of the inorganic insulating film that can be used to form the insulating layer 31 can be referred to.

Then, the metal oxide layer 83 is formed. The metal oxide layer 83 can be formed in the following manner: a metal oxide film is formed, a resist mask is formed, the metal oxide film is etched, and the resist mask is removed. For the metal oxide layer 83, the description of the material that can be used for the metal oxide layer 44 can be referred to.

Then, an insulating layer 84 and a conductive layer 85 are formed. For the insulating layer 84, the description of the inorganic insulating film that can be used to form the insulating layer 31 can be referred to. The insulating layer 84 and the conductive layer 85 can be formed in the following manner: an insulating film to be the insulating layer 84 and a conductive film to be the conductive layer 85 are formed, a resist mask is formed, the insulating film and the conductive film are etched, and the resist mask is removed.

Next, the insulating layer 33 that covers the metal oxide layer 83, the insulating layer 84, and the conductive layer 85 are formed. The insulating layer 33 can be formed in a manner similar to that of forming the insulating layer 31.

Note that the insulating layer 33 preferably contains hydrogen. Hydrogen contained in the insulating layer 33 diffuses into the metal oxide layer 83 that is in contact with the insulating layer 33, so that the resistance of part of the metal oxide layer 83 is reduced. The part of the metal oxide layer 83 serves as a low-resistance region, and thus, the on-state current and the field-effect mobility of the transistor 80 can be increased.

Then, openings reaching the metal oxide layer 83 are formed in the insulating layer 33.

Then, a conductive layer 86a and a conductive layer 86b are formed. The conductive layers 86a and 86b can be formed in the following manner: a conductive film is formed, a resist mask is formed, the conductive film is etched, and the resist mask is removed. The conductive layers 86a and 86b are electrically connected to the metal oxide layer 83 through the openings formed in the insulating layer 33.

In the above manner, the transistor 80 can be formed (FIG. 9B). In the transistor 80, part of the conductive layer 81 functions as a gate, part of the insulating layer 84 functions as a gate insulating layer, part of the insulating layer 82 functions as a gate insulating layer, and part of the conductive layer 85 functions as a gate. The metal oxide layer 83 includes a channel region and a low-resistance region. The channel region overlaps with the conductive layer 85 with the insulating layer 84 provided therebetween. The low-resistance region includes a region connected to the conductive layer 86a and a region connected to the conductive layer 86b.

Figure 9C:
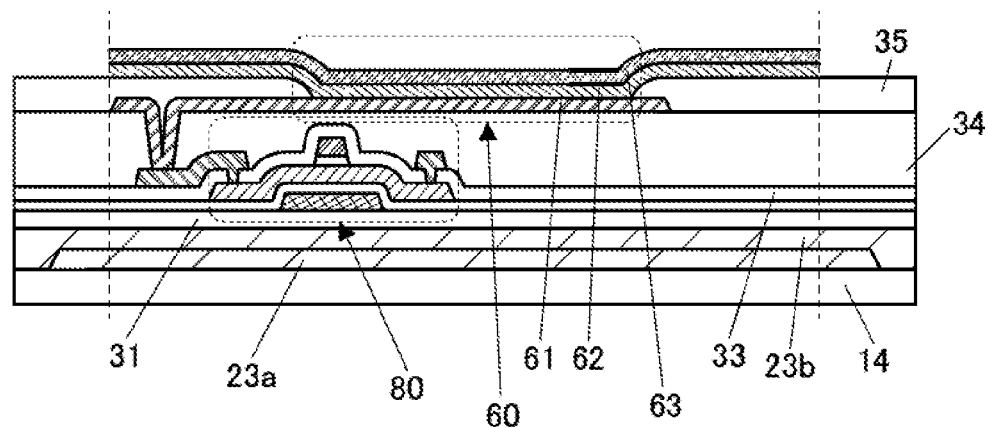

Next, constituents from the insulating layer 34 to the light-emitting element 60 are formed over the insulating layer 33 (FIG. 9C). For these steps, the description of the manufacturing method example 1 can be referred to.

Figure 10A:
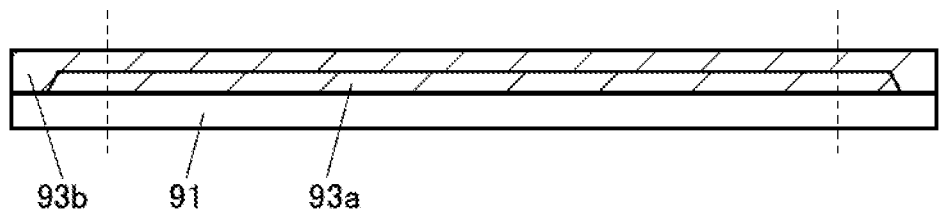
FIGS. 10A to 10C are cross-sectional views illustrating an example of a manufacturing method of a display device.
Figure 10B:
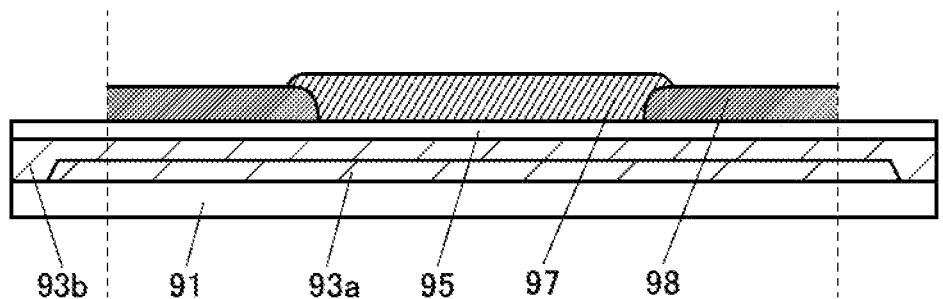

Furthermore, steps shown in FIGS. 10A and 10B are performed independently of the steps shown in FIGS. 9A to 9C. As in the step of forming the first resin layer 23a over the formation substrate 14, an island-like-shaped first resin layer 93a is formed over a formation substrate 91. Then, as in a step of forming the second resin layer 23b over the formation substrate 14 and the first resin layer 23a, a second resin layer 93b is formed over the formation substrate 91 and the first resin layer 93a (FIG. 10A).

Then, an insulating layer 95 is formed over the second resin layer 93b. Then, the coloring layer 97 and a light-blocking layer 98 are formed over the insulating layer 95 (FIG. 10B).

For the insulating layer 95, the description of the insulating layer 31 can be referred to.

A color filter or the like can be used as the coloring layer 97. The coloring layer 97 is provided to overlap with a display region of the light-emitting element 60.

A black matrix or the like can be used as the light-blocking layer 98. The light-blocking layer 98 is provided to overlap with the insulating layer 35.

Figure 10C:
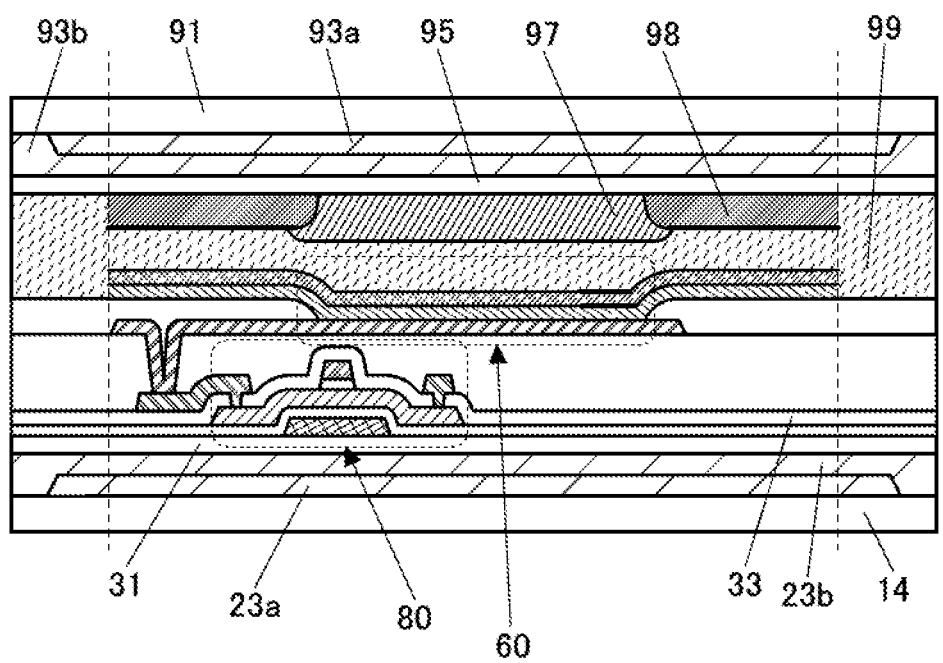

Next, a surface of the formation substrate 14 on which the transistor 80 and the like are formed and a surface of the formation substrate 91 on which the coloring layer 97 and the like are formed are attached to each other with a bonding layer 99 (FIG. 10C).

Figure 11A:
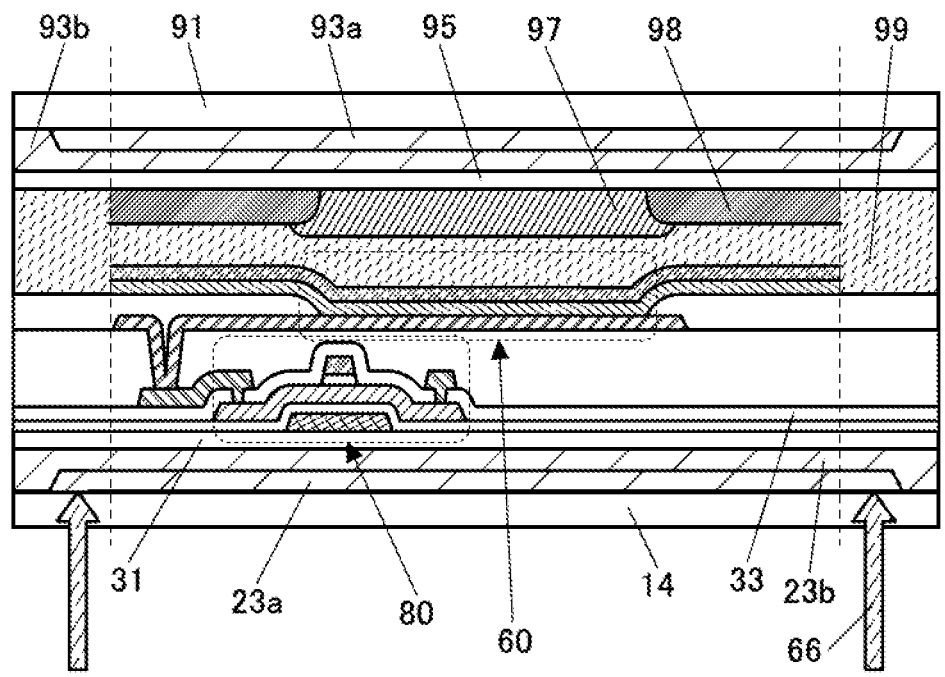
FIGS. 11A and 11B are a cross-sectional view and a top view illustrating an example of a manufacturing method of a display device.
Figure 11B:
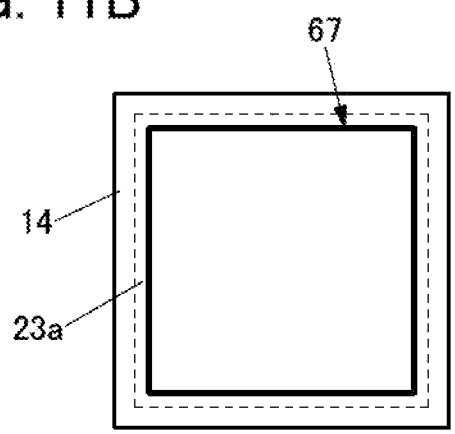

Then, the separation starting point is formed in the first resin layer 23a (FIGS. 11A and 11B). Either of the formation substrate 14 and the formation substrate 91 may be separated earlier. In the example shown here, the formation substrate 14 is separated earlier than the formation substrate 91.

For example, the first resin layer 23a is irradiated with laser light 66 in a frame-like shape from the formation substrate 14 side (see a laser-light irradiation region 67 shown in FIG. 11B). This method is suitable in the case of using hard substrates such as glass substrates as the formation substrate 14 and the formation substrate 91.

There is no particular limitation on a laser used to form the separation starting point. For example, a continuous wave laser or a pulsed oscillation laser can be used. Note that a condition for laser irradiation such as frequency, power density, energy density, or beam profile is controlled as appropriate in consideration of thicknesses, materials, or the like of the formation substrate and the first resin layer.

In the manufacturing method example 4, a portion that is in contact with the first resin layer 23a and a portion that is in contact with the second resin layer 23b are provided for the formation substrate 14. By the first heat treatment performed in the atmosphere containing oxygen, the first resin layer 23a becomes easy to separate from the formation substrate 14. In contrast, the second resin layer 23b is difficult to separate from the formation substrate 14 because the second heat treatment is performed in the atmosphere containing less oxygen than the atmosphere of the first heat treatment. Thus, separation of the first resin layer 23a from the formation substrate 14 that will occur at an unintended time can be inhibited. Similarly, a portion that is in contact with the first resin layer 93a and a portion that is in contact with the second resin layer 93b are provided for the formation substrate 91. The first resin layer 93a is easy to separate from the formation substrate 91, and the second resin layer 93b is difficult to separate from the formation substrate 91. Thus, separation of the first resin layer 93a from the formation substrate 91 that will occur at an unintended time can be inhibited.

A separation starting point is formed on either the first resin layer 23a or the first resin layer 93a. The timing of forming a separation starting point can be different between the first resin layer 23a and the first resin layer 93a; therefore, the formation substrate 14 and the formation substrate 91 can be separated in different steps. This can increase the yield of the separation process and the manufacturing process of a display device.

Irradiation with the laser light 66 does not need to be performed on the entire area of the first resin layer 23a and is performed on part of the resin layer. Accordingly, an expensive laser apparatus requiring high running costs is not needed.

Figure 12A:
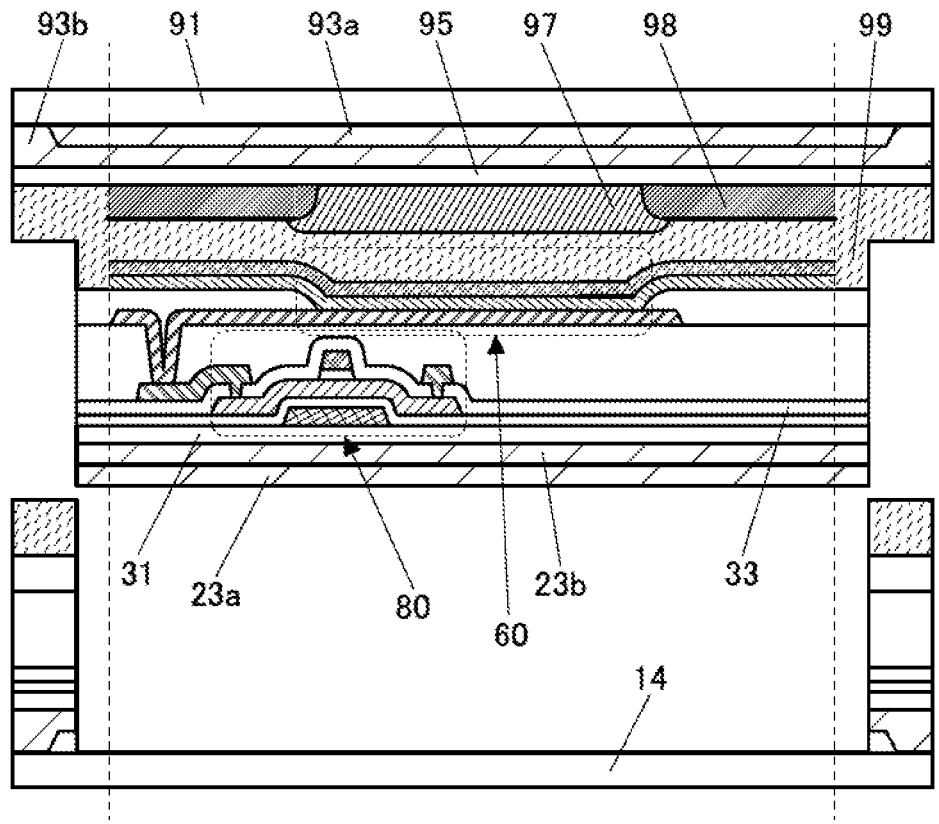
FIGS. 12A and 12B are cross-sectional views illustrating an example of a manufacturing method of a display device.

Next, the formation substrate 14 and the transistor 80 are separated from each other (FIG. 12A). In this example, the formation substrate 14 and a portion inside the region irradiated with the laser light 66 in a frame-like shape (i.e., a portion inside the laser-light irradiation region 67 illustrated in FIG. 11B) are separated from each other. Although in the example illustrated in FIG. 12A separation occurs in the bonding layer 99 (cohesive failure of the bonding layer 99 occurs) outside the region irradiated with the laser light 66 in a frame-like shape, one embodiment of the present invention is not limited to this example. For example, outside the irradiation region 67, separation (interfacial failure or adhesive failure) might occur at the interface between the bonding layer 99 and the insulating layer 95 or the insulating layer 33.

In the manufacturing method example 4, the first heat treatment is performed in the atmosphere containing oxygen at the time of forming the first resin layer 23a; thus, the formation substrate 14 and the first resin layer 23a can be separated from each other without performing laser irradiation on the entire surface of the first resin layer 23a. Consequently, the display device can be manufactured at low cost.

Figure 12B:
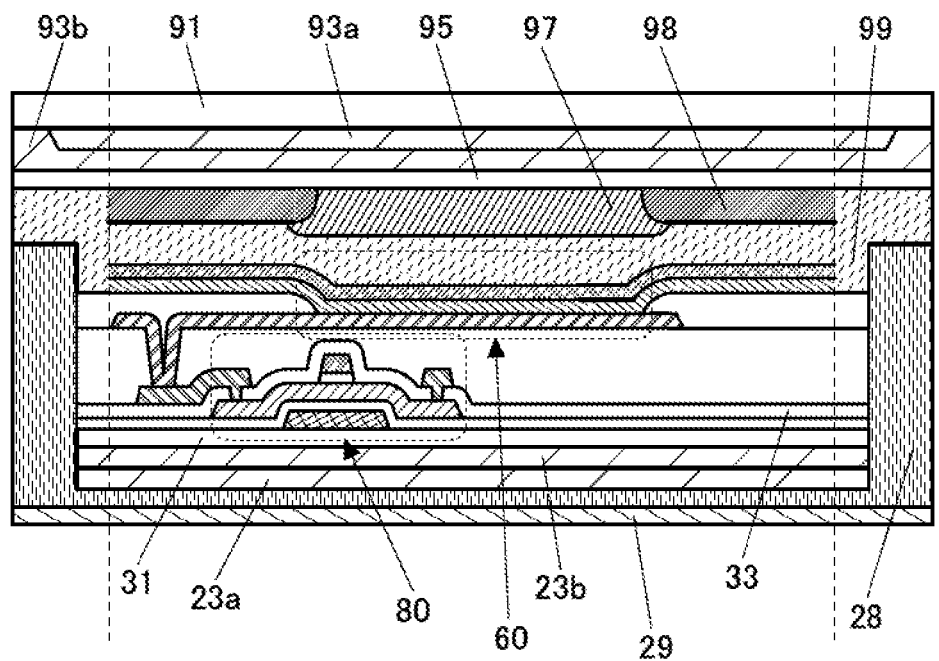

Then, the first resin layer 23a that is exposed by being separated from the formation substrate 14 is attached to the substrate 29 using the bonding layer 28 (FIG. 12B). The substrate 29 can serve as a support substrate of the display device.

Figure 13A:
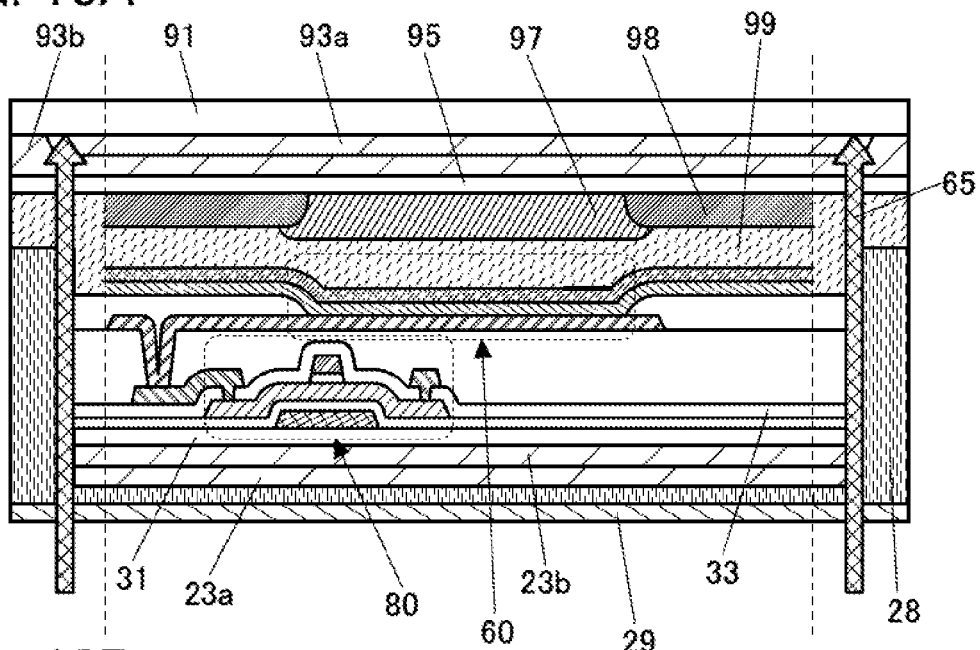
FIGS. 13A and 13B are cross-sectional views illustrating an example of a manufacturing method of a display device.

Then, the separation starting point is formed in the first resin layer 93a (FIG. 13A).

In FIG. 13A, the sharp instrument 65 such as a knife is inserted from the substrate 29 side into a portion inward from an end portion of the first resin layer 93a to form a frame-like-shaped cut. This method is suitable in the case of using a resin as the substrate 29.

Alternatively, in a manner similar to that of the formation of the separation starting point in the first resin layer 23a, the first resin layer 93a may be irradiated with laser light in a frame-like shape from the formation substrate 91 side.

The separation starting point enables separation of the formation substrate 91 and the first resin layer 93a from each other at a desired time. As a result, the time at which the separation occurs can be controlled and high separability can be achieved. This can improve the yield of the separation process and the manufacturing process of the display device.

Figure 13B:
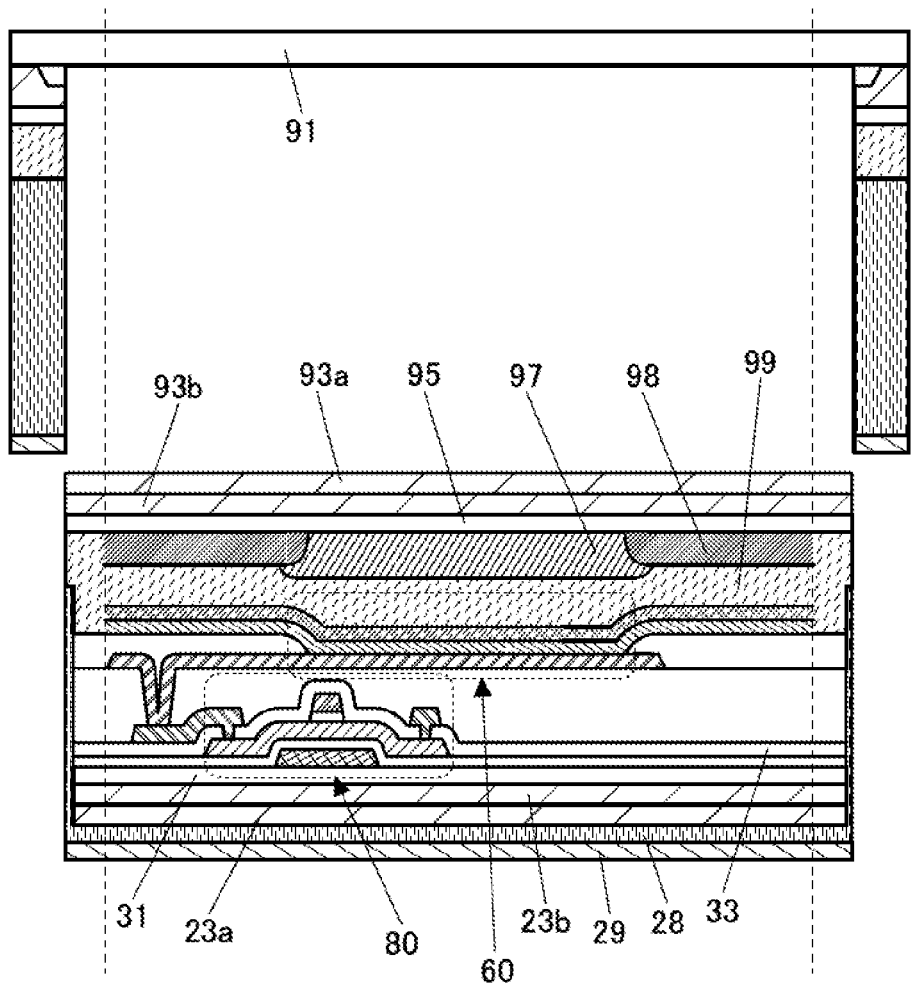

Then, the formation substrate 91 and the transistor 80 are separated from each other (FIG. 13B). In the example shown here, a portion inside the frame-like-shaped cut is separated from the formation substrate 91.

In the manufacturing method example 4, the first heat treatment is performed in the atmosphere containing oxygen at the time of forming the first resin layer 93a; thus, the formation substrate 91 and the first resin layer 93a can be separated from each other without performing laser irradiation on the entire surface of the first resin layer 93a. Consequently, the display device can be manufactured at low cost.

Figure 14A:
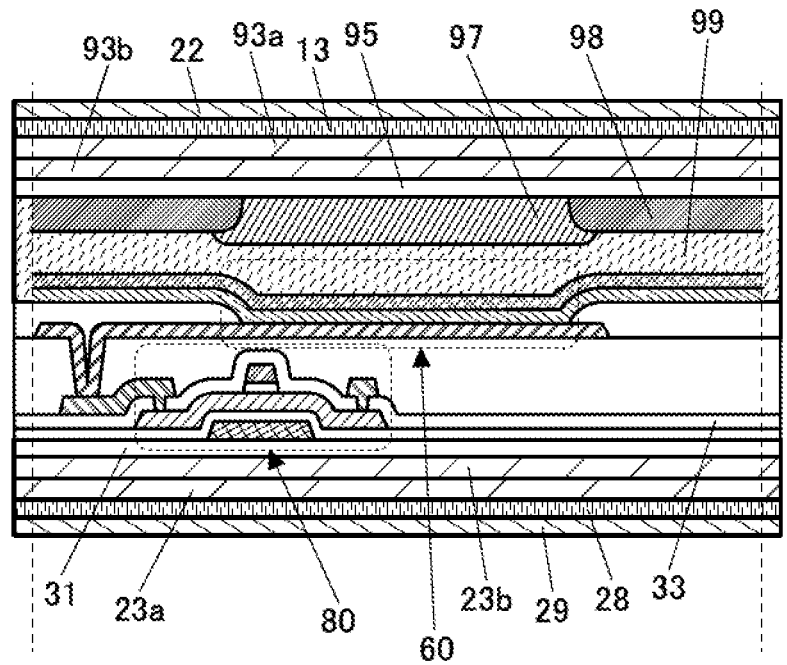
FIGS. 14A and 14B are cross-sectional views illustrating an example of a manufacturing method of a display device.
Figure 14B:
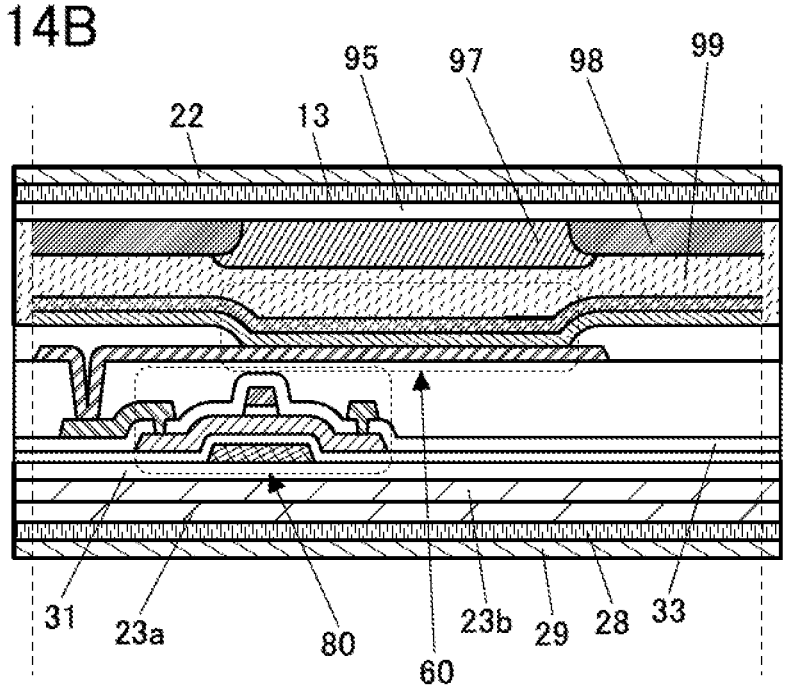

Then, the first resin layer 93a that is exposed by being separated from the formation substrate 91 is attached to a substrate 22 using a bonding layer 13 (FIG. 14A). The substrate 22 can serve as a support substrate of the display device.

In FIG. 14A, light emitted from the light-emitting element 60 is extracted to the outside of the display device through the coloring layer 97, the second resin layer 93b, and the first resin layer 93a. Therefore, the first resin layer 93a and the second resin layer 93b each preferably have a high visible light transmittance. In the separation method of one embodiment of the present invention, the thickness of each of the first resin layer 93a and the second resin layer 93b can be reduced. Thus, the first resin layer 93a and the second resin layer 93b can each have a high visible light transmittance, which can inhibit reduction of the light extraction efficiency of the light-emitting element 60.

One or both of the first resin layer 93a and the second resin layer 93b may be removed. This can further increase the light extraction efficiency of the light-emitting element 60. In the example shown in FIG. 14B, both of the first resin layer 93a and the second resin layer 93b are removed and the substrate 22 is attached to the insulating layer 95 with the bonding layer 13.

The material that can be used for the bonding layer 75b can be used for the bonding layer 13.

The material that can be used for the substrate 75a can be used for the substrate 22.

The manufacturing method example 4 is an example in which the separation method of one embodiment of the present invention is performed twice to fabricate the display device. In one embodiment of the present invention, each of the functional elements and the like included in the display device is formed over the formation substrate; thus, even in the case where a high-resolution display device is manufactured, high alignment accuracy of a flexible substrate is not required. It is thus easy to attach the flexible substrate.

[Modification Example]

In the manufacturing method example 4 (FIG. 10C), the bonding layer 99 overlaps with both a portion where the formation substrate 14 and the second resin layer 23b are in contact with each other and a portion where the formation substrate 91 and the second resin layer 93b are in contact with each other.

The adhesion between the formation substrate 14 and the second resin layer 23b is higher than that between the formation substrate 14 and the first resin layer 23a. The adhesion between the formation substrate 91 and the second resin layer 93b is higher than that between the formation substrate 91 and the first resin layer 93a.

When separation is caused at the interface between the formation substrate and the second resin layer, separation might be failed, for example, reducing the yield of separation. Therefore, the process is suitable in which only the portion that overlaps with the first resin layer is separated from the formation substrate after formation of a separation starting point in the first resin layer in a frame-like shape.

Figure 15A:
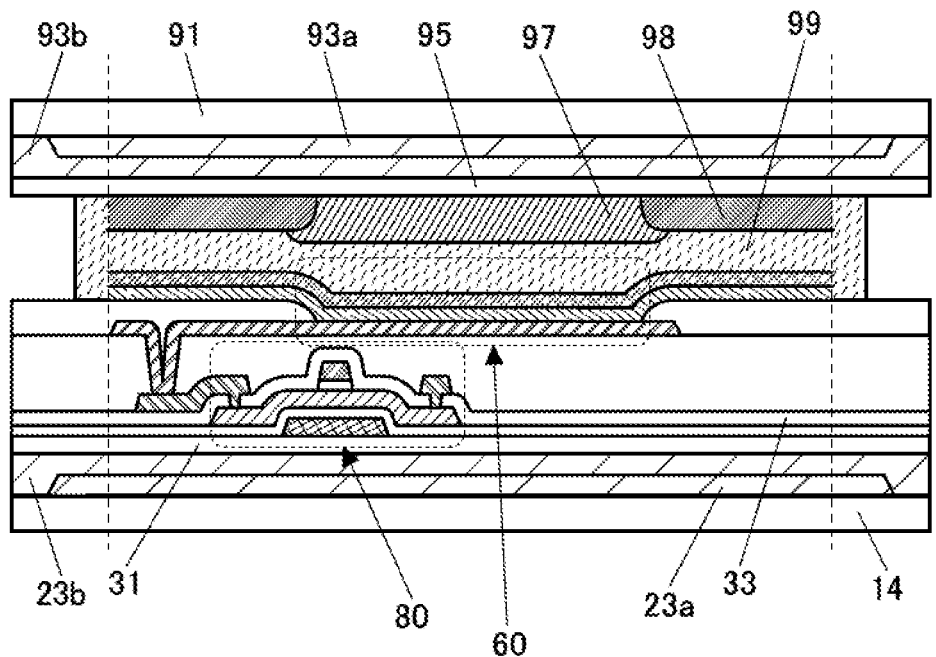
FIGS. 15A and 15B are cross-sectional views illustrating an example of a manufacturing method of a display device.
Figure 15B:
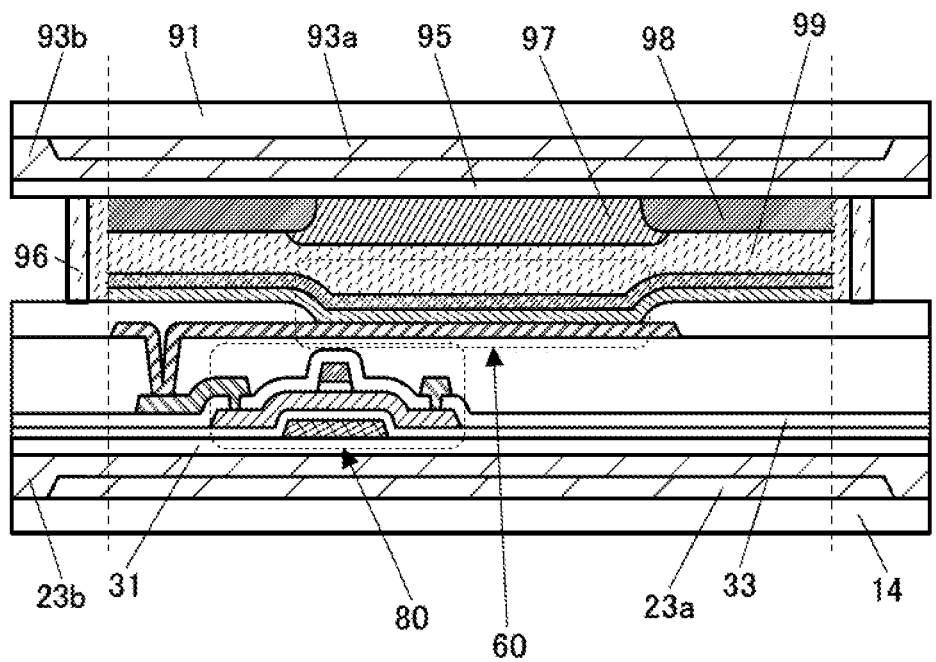

It is also possible to employ a structure in which the bonding layer 99 does not overlap with the portion where the formation substrate 14 and the second resin layer 23b are in contact with each other and the portion where the formation substrate 91 and the second resin layer 93b are in contact with each other, as illustrated in FIGS. 15A and 15B.

When an adhesive or an adhesive sheet having a low fluidity, for example, is used for the bonding layer 99, the bonding layer 99 can be easily formed to have an island-like shape (FIG. 15A).

Alternatively, a partition 96 having a frame-like shape may be formed and the space surrounded by the partition 96 may be filled with the bonding layer 99 (FIG. 15B).

In the case where the partition 96 is used as a component of a display device, the partition 96 is preferably formed using a cured resin. In that case, it is preferable that the partition 96 not overlap with the portion where the formation substrate 14 and the second resin layer 23b are in contact with each other and the portion where the formation substrate 91 and the second resin layer 93b are in contact with each other, either.

In the case where the partition 96 is not used as a component of a display device, the partition 96 is preferably formed using an uncured resin or a semi-cured resin. In that case, the partition 96 may overlap with one or both of the portion where the formation substrate 14 and the second resin layer 23b are in contact with each other and the portion where the formation substrate 91 and the second resin layer 93b are in contact with each other.

In the example described in this embodiment, the partition 96 is formed using an uncured resin, and the partition 96 does not overlap with the portion where the formation substrate 14 and the second resin layer 23b are in contact with each other and the portion where the formation substrate 91 and the second resin layer 93b are in contact with each other.

Description is made on a method for forming a separation starting point in the case where the bonding layer 99 does not overlap with the portion where the formation substrate 14 and the second resin layer 23b are in contact with each other and the portion where the formation substrate 91 and the second resin layer 93b are in contact with each other. An example in which the formation substrate 91 is separated is described below. A method similar to this method can be used when the formation substrate 14 is separated.

FIGS. 16A to 16E illustrate positions of irradiation with the laser light 66 in the case where the formation substrate 91 and the first resin layer 93a are separated from each other.

Figure 16A:
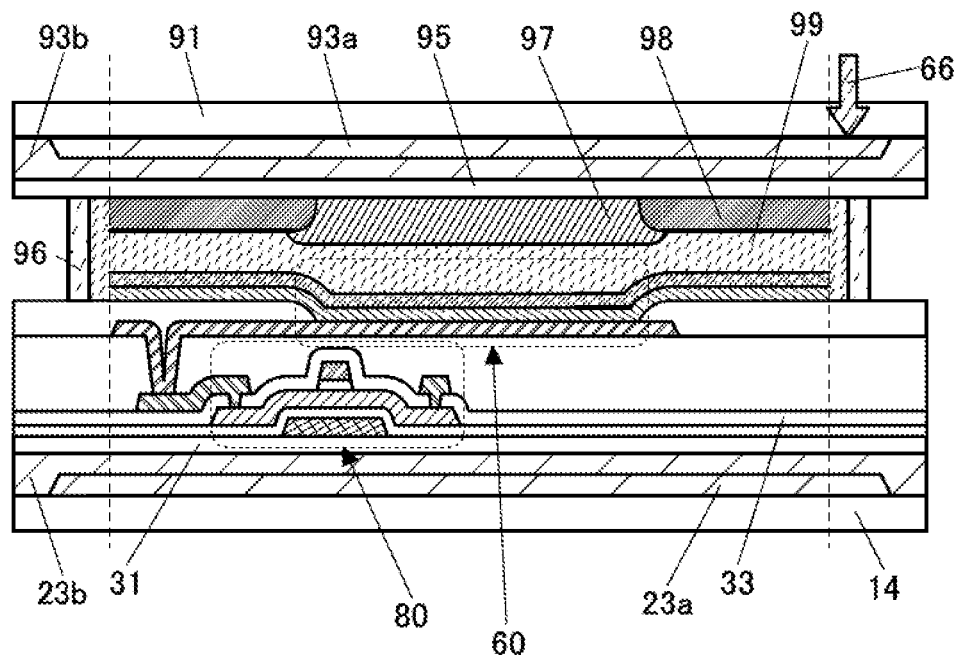
FIGS. 16A to 16E are a cross-sectional view and top views illustrating an example of a manufacturing method of a display device.

As illustrated in FIG. 16A, at least one place of a region where the first resin layer 93a and the bonding layer 99 overlap with each other is irradiated with the laser light 66, whereby the separation starting point can be formed.

It is preferable that the force for separating the formation substrate 91 and the first resin layer 93a from each other be locally exerted on the separation starting point; therefore, the separation starting point is preferably formed in the vicinity of an end portion of the bonding layer 99 rather than at the center of the bonding layer 99. It is particularly preferable to form the separation starting point in the vicinity of the corner portion compared to the vicinity of the side portion among the vicinities of the end portion.

FIGS. 16B to 16E illustrate examples of the laser-light irradiation region 67.

Figure 16B:
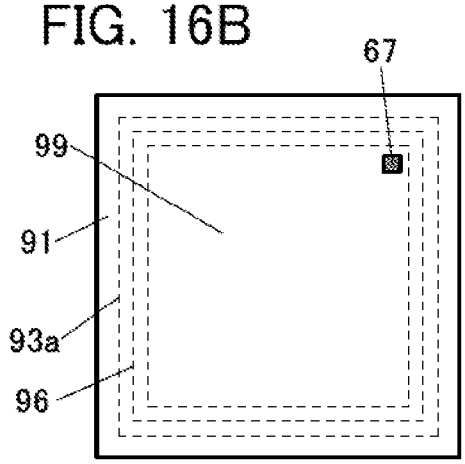

In FIG. 16B, one laser-light irradiation region 67 is provided at the corner portion of the bonding layer 99.

Figure 16C:
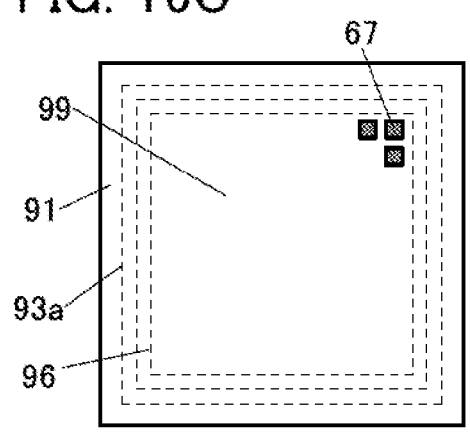
Figure 16D:
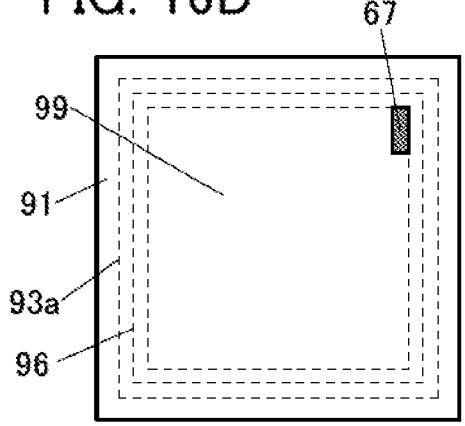
Figure 16E:
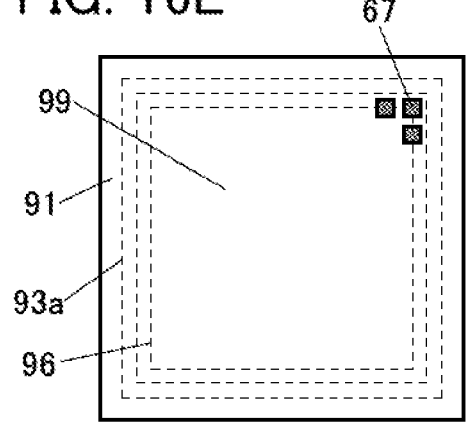

The separation starting point can be formed in the form of a solid line or a dashed line by continuous or intermittent irradiation with laser light. In FIG. 16C, three laser-light irradiation regions 67 are provided at the corner portion of the bonding layer 99. FIG. 16D illustrates an example in which the laser-light irradiation region 67 abuts on and extends along one side of the bonding layer 99. As illustrated in FIG. 16E, the laser-light irradiation region 67 may be positioned not only in a region where the bonding layer 99 and the first resin layer 93a overlap with each other but also in a region where the partition 96 not cured and the first resin layer 93a overlap with each other.

Then, the formation substrate 91 and the first resin layer 93a can be separated from each other. Note that part of the partition 96 remains on the formation substrate 14 side in some cases. The partition 96 may be removed or the next step may be performed without removal of the partition 96.

[Structure Example 2 of Display Device]

Figure 17A:
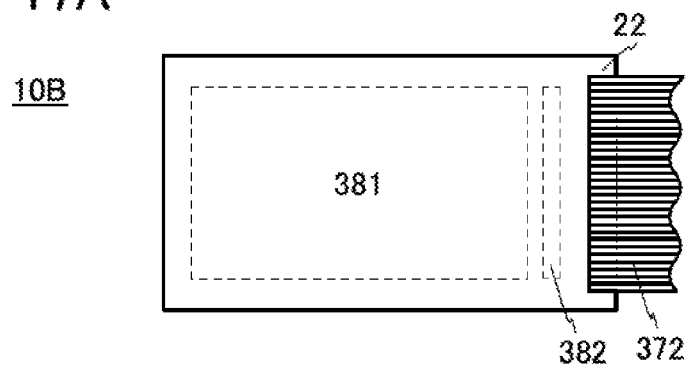
FIGS. 17A and 17B are a top view and a cross-sectional view illustrating an example of a display device.
Figure 17B:
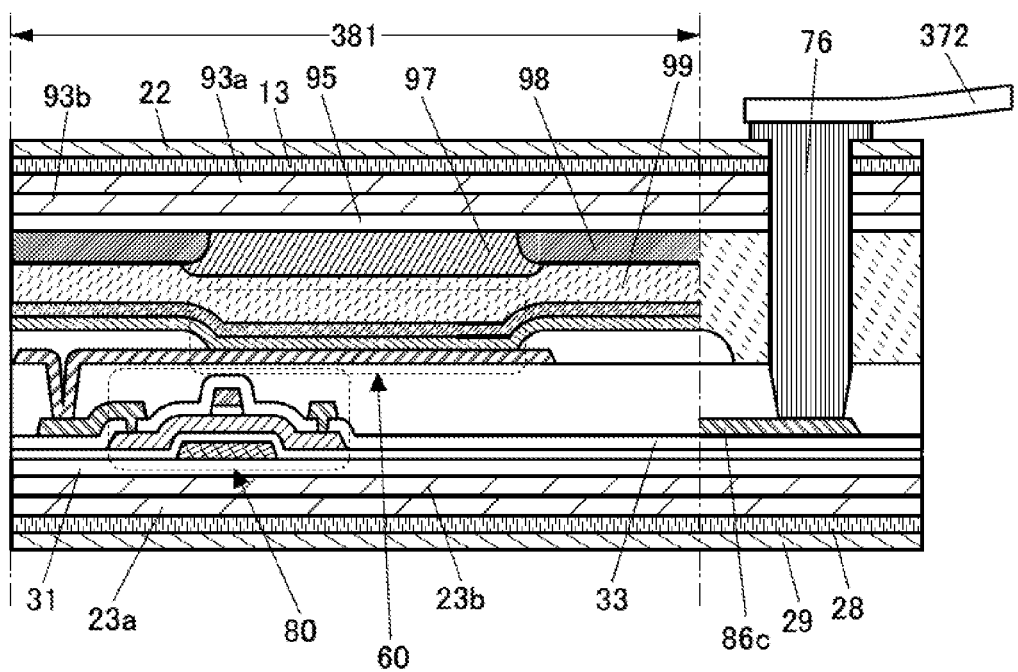

FIG. 17A is a top view of a display device 10B. FIG. 17B is an example of a cross-sectional view illustrating the display portion 381 of the display device 10B and a portion for connection to the FPC 372.

The display device 10B can be manufactured with the use of the above manufacturing method example 4. The display device 10B can be held in a bent state and can be bent repeatedly, for example.

The display device 10B includes the substrate 22 and the substrate 29. The substrate 22 side is the display surface side of the display device 10B. The display device 10B includes the display portion 381 and the driver circuit portion 382. The FPC 372 is attached to the display device 10B.

A conductive layer 86c and the FPC 372 are electrically connected through the connector 76 (FIG. 17B). The conductive layer 86c can be formed using the same material and the same step as those of the source and the drain of the transistor.

As described above, the heat treatment performed in an oxygen-containing atmosphere enables the first resin layer to be separated from the formation substrate without laser irradiation of the entire area of the first resin layer. Thus, a large amount of oxygen is sometimes observed by analysis in the first resin layer of the display device that is manufactured by the manufacturing method of a display device described in this embodiment. Specifically, the oxygen concentration can be obtained by analyzing the surface of the first resin layer on the separation surface side by XPS. The oxygen concentration that is obtained by analyzing the surface of the first resin layer 23a on the bonding layer 28 side by XPS is preferably higher than or equal to 10 atomic %, further preferably higher than or equal to 15 atomic %. The oxygen concentration that is obtained by analyzing the surface of the first resin layer 93a on the bonding layer 13 side by XPS is preferably higher than or equal to 10 atomic %, further preferably higher than or equal to 15 atomic %.

As described above, in the separation method of this embodiment, the separability of the resin layer with respect to the formation substrate is controlled by heat conditions used to form the resin layer. Treatment that uses an expensive apparatus, such as linear laser beam irradiation, is not necessary for the separation method; accordingly, the costs can be reduced. Moreover, use of a stack of two resin layers differing in separability with respect to the formation substrate enables separation of the formation substrate and the resin layer from each other to occur at a desired time. Thus, by the separation method of this embodiment, display devices and the like can be manufactured at low cost with high mass productivity.

This embodiment can be combined with any of other embodiments as appropriate. In the case where a plurality of structure examples are described in one embodiment in this specification, some of the structure examples can be combined as appropriate.

(Embodiment 2)

In this embodiment, a display device of one embodiment of the present invention and a manufacturing method thereof will be described with reference to drawings.

The display device of this embodiment includes a first display element reflecting visible light and a second display element emitting visible light.

The display device of this embodiment has a function of displaying an image using one or both of light reflected by the first display element and light emitted from the second display element.

As the first display element, an element which displays an image by reflecting external light can be used. Such an element does not include a light source (or does not require an artificial light source); thus, power consumed in displaying an image can be significantly reduced.

As a typical example of the first display element, a reflective liquid crystal element can be given. As the first display element, an element using a microcapsule method, an electrophoretic method, an electrowetting method, an Electronic Liquid Powder (registered trademark) method, or the like can also be used, other than micro electro mechanical systems (MEMS) shutter element or an optical interference type MEMS element.

As the second display element, a light-emitting element is preferably used. Since the luminance and the chromaticity of light emitted from such a display element are not affected by external light, a clear image that has high color reproducibility (wide color gamut) and a high contrast can be displayed.

As the second display element, a self-luminous light-emitting element such as an organic light-emitting diode (OLED), a light-emitting diode (LED), or a quantum-dot light-emitting diode (QLED) can be used.

The display device of this embodiment has a first mode in which an image is displayed using only the first display element, a second mode in which an image is displayed using only the second display element, and a third mode in which an image is displayed using both the first display element and the second display element. The display device of this embodiment can be switched between these modes automatically or manually.

In the first mode, an image is displayed using the first display element and external light. Because a light source is unnecessary in the first mode, power consumed in this mode is extremely low. When sufficient external light enters the display device (e.g., in a bright environment), for example, an image can be displayed by using light reflected by the first display element. The first mode is effective in the case where external light is white light or light near white light and is sufficiently strong, for example. The first mode is suitable for displaying text. Furthermore, the first mode enables eye-friendly display owing to the use of reflected external light, which leads to an effect of easing eyestrain.

In the second mode, an image is displayed using light emitted from the second display element. Thus, an extremely vivid image (with high contrast and excellent color reproducibility) can be displayed regardless of the illuminance and the chromaticity of external light. The second mode is effective in the case of extremely low illuminance, such as in a night environment or in a dark room, for example. When a bright image is displayed in a dark environment, a user may feel that the image is too bright. To prevent this, an image with reduced luminance is preferably displayed in the second mode. In that case, glare can be reduced, and power consumption can also be reduced. The second mode is suitable for displaying a vivid (still and moving) image or the like.

In the third mode, an image is displayed using both light reflected by the first display element and light emitted from the second display element. An image displayed in the third mode can be more vivid than an image displayed in the first mode while power consumption can be lower than that in the second mode. The third mode is effective in the case where the illuminance is relatively low or in the case where the chromaticity of external light is not white, for example, in an environment under indoor illumination or in the morning or evening.

With such a structure, an all-weather display device or a highly convenient display device with high visibility regardless of the ambient brightness can be fabricated.

The display device of this embodiment includes a plurality of first pixels including the first display elements and a plurality of second pixels including the second display elements. The first pixels and the second pixels are preferably arranged in matrices.

Each of the first pixels and the second pixels can include one or more sub-pixels. For example, each pixel can include one sub-pixel (e.g., a white (W) sub-pixel), three sub-pixels (e.g., red (R), green (G), and blue (B) sub-pixels, or yellow (Y), cyan (C), and magenta (M) sub-pixels), or four sub-pixels (e.g., red (R), green (G), blue (B), and white (W) sub-pixels, or red (R), green (G), blue (B), and yellow (Y) sub-pixels).

The display device of this embodiment can display a full-color image using either the first pixels or the second pixels. Alternatively, the display device of this embodiment can display a black-and-white image or a grayscale image using the first pixels and can display a full-color image using the second pixels. The first pixels that can be used for displaying a black-and-white image or a grayscale image are suitable for displaying information that need not be displayed in color such as text information.

Structure examples of the display device in this embodiment are described with reference to FIG. 18, FIG. 19, and FIG. 20.

<Structure Example 1>

Figure 18:
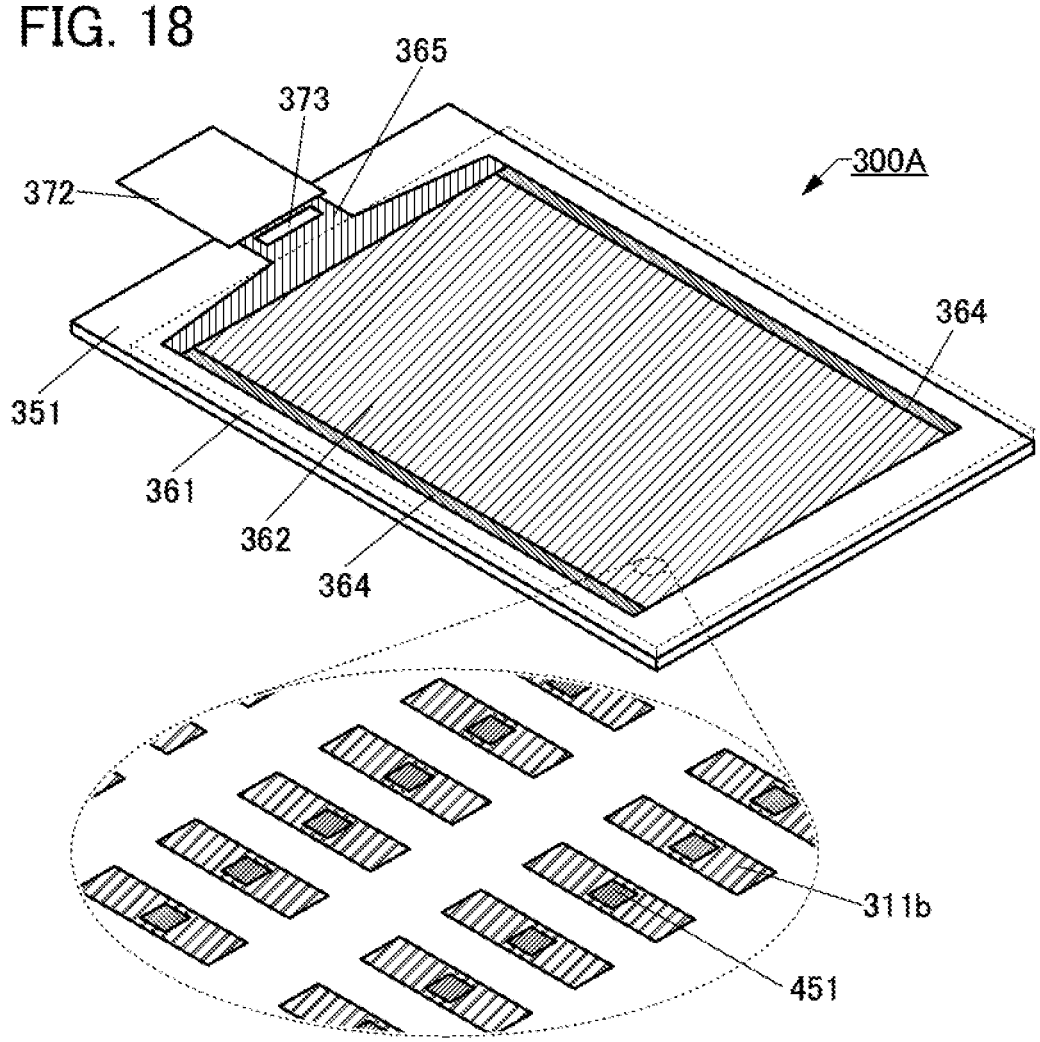
FIG. 18 is a perspective view illustrating an example of a display device.

FIG. 18 is a schematic perspective view of a display device 300A. In the display device 300A, the substrate 351 and the substrate 361 are bonded to each other. In FIG. 18, the substrate 361 is denoted by a dashed line.

The display device 300A includes a display portion 362, a circuit 364, a wiring 365, and the like. FIG. 18 illustrates an example in which the display device 300A is provided with an integrated circuit (IC) 373 and an FPC 372. Thus, the structure illustrated in FIG. 18 can be regarded as a display module including the display device 300A, the IC, and the FPC.

As the circuit 364, for example, a scan line driver circuit can be used.

The wiring 365 has a function of supplying a signal and power to the display portion 362 and the circuit 364. The signal and power are input to the wiring 365 from the outside through the FPC 372 or from the IC 373.

FIG. 18 illustrates an example in which the IC 373 is provided over the substrate 351 by a chip on glass (COG) method, a chip on film (COF) method, or the like. An IC including a scan line driver circuit, a signal line driver circuit, or the like can be used as the IC 373, for example. Note that the display device 300A and the display module are not necessarily provided with an IC. The IC may be provided over the FPC by a COF method or the like.

FIG. 18 illustrates an enlarged view of part of the display portion 362. Electrodes 311b included in a plurality of display elements are arranged in a matrix in the display portion 362. The electrode 311b has a function of reflecting visible light, and serves as a reflective electrode of the liquid crystal element 180.

As illustrated in FIG. 18, the electrode 311b includes an opening 451. In addition, the display portion 362 includes the light-emitting element 170 that is positioned closer to the substrate 351 than the electrode 311b. Light from the light-emitting element 170 is emitted to the substrate 361 side through the opening 451 in the electrode 311b. The area of the light-emitting region of the light-emitting element 170 may be equal to the area of the opening 451. One of the area of the light-emitting region of the light-emitting element 170 and the area of the opening 451 is preferably larger than the other because a margin for misalignment can be increased.

Figure 19:
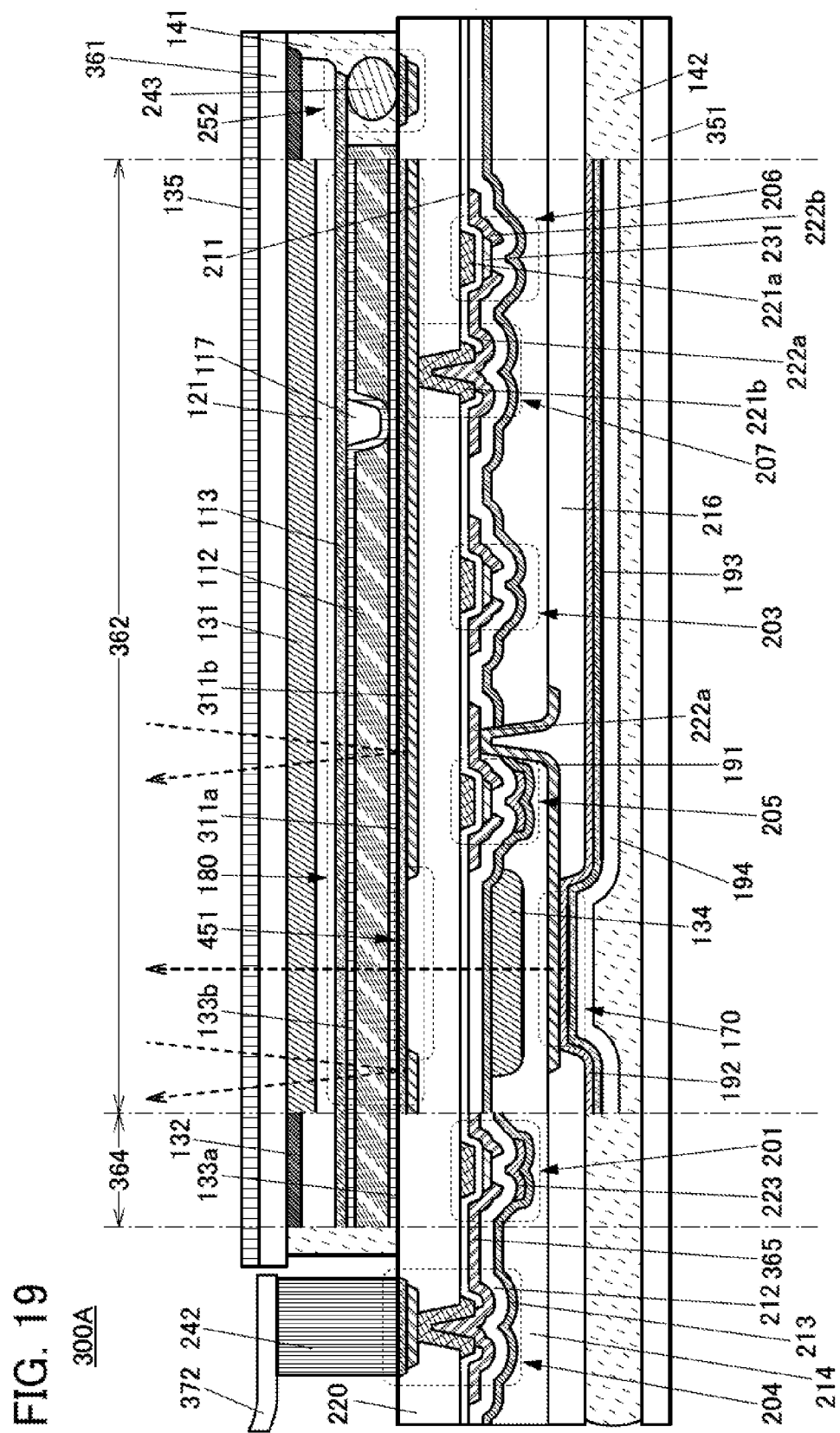
FIG. 19 is a cross-sectional view illustrating an example of a display device.

FIG. 19 illustrates an example of cross-sections of part of a region including the FPC 372, part of a region including the circuit 364, and part of a region including the display portion 362 of the display device 300A illustrated in FIG. 18.

The display device 300A illustrated in FIG. 19 includes a transistor 201, a transistor 203, a transistor 205, a transistor 206, the liquid crystal element 180, the light-emitting element 170, an insulating layer 220, a coloring layer 131, a coloring layer 134, and the like, between the substrate 351 and the substrate 361. The substrate 361 and the insulating layer 220 are bonded to each other with a bonding layer 141.

The substrate 351 and the insulating layer 220 are bonded to each other with a bonding layer 142.

The substrate 361 is provided with the coloring layer 131, a light-blocking layer 132, an insulating layer 121, an electrode 113 functioning as a common electrode of the liquid crystal element 180, an alignment film 133b, an insulating layer 117, and the like. A polarizing plate 135 is provided on an outer surface of the substrate 361. The insulating layer 121 may have a function of a planarization layer. The insulating layer 121 enables the electrode 113 to have an almost flat surface, resulting in a uniform alignment state of a liquid crystal layer 112. The insulating layer 117 serves as a spacer for holding a cell gap of the liquid crystal element 180. In the case where the insulating layer 117 transmits visible light, the insulating layer 117 may be positioned to overlap with a display region of the liquid crystal element 180.

The liquid crystal element 180 is a reflective liquid crystal element. The liquid crystal element 180 has a stacked-layer structure of an electrode 311a serving as a pixel electrode, the liquid crystal layer 112, and the electrode 113. The electrode 311b that reflects visible light is provided in contact with a surface of the electrode 311a on the substrate 351 side. The electrode 311b includes the opening 451. The electrode 311a and the electrode 113 transmit visible light. An alignment film 133a is provided between the liquid crystal layer 112 and the electrode 311a. The alignment film 133b is provided between the liquid crystal layer 112 and the electrode 113.

In the liquid crystal element 180, the electrode 311b has a function of reflecting visible light, and the electrode 113 has a function of transmitting visible light. Light entering from the substrate 361 side is polarized by the polarizing plate 135, transmitted through the electrode 113 and the liquid crystal layer 112, and reflected by the electrode 311b. Then, the light is transmitted through the liquid crystal layer 112 and the electrode 113 again to reach the polarizing plate 135. In this case, alignment of a liquid crystal can be controlled with a voltage that is applied between the electrode 311b and the electrode 113, and thus optical modulation of light can be controlled. In other words, the intensity of light emitted through the polarizing plate 135 can be controlled. Light excluding light in a particular wavelength region is absorbed by the coloring layer 131 and thus, emitted light is red light, for example.

As illustrated in FIG. 19, the electrode 311a that transmits visible light is preferably provided across the opening 451. Accordingly, liquid crystals in the liquid crystal layer 112 are aligned in a region overlapping with the opening 451 as in the other regions, in which case an alignment defect of the liquid crystals in a boundary portion of these regions is prevented and undesired light leakage can be suppressed.

At a connection portion 207, the electrode 311b is electrically connected to a conductive layer 222a included in the transistor 206 via a conductive layer 221b. The transistor 206 has a function of controlling the driving of the liquid crystal element 180.

A connection portion 252 is provided in part of a region where the bonding layer 141 is provided. In the connection portion 252, a conductive layer obtained by processing the same conductive film as the electrode 311a is electrically connected to part of the electrode 113 with a connector 243. Accordingly, a signal or a potential input from the FPC 372 connected to the substrate 351 side can be supplied to the electrode 113 formed on the substrate 361 side through the connection portion 252.

As the connector 243, for example, a conductive particle can be used. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. A material capable of elastic deformation or plastic deformation is preferably used for the connector 243. As illustrated in FIG. 19, the connector 243, which is the conductive particle, has a shape that is vertically crushed in some cases. With the crushed shape, the contact area between the connector 243 and a conductive layer electrically connected to the connector 243 can be increased, thereby reducing contact resistance and suppressing the generation of problems such as disconnection.

The connector 243 is preferably provided so as to be covered with the bonding layer 141. For example, the connectors 243 are dispersed in the bonding layer 141 before curing of the bonding layer 141.

The light-emitting element 170 is a bottom-emission light-emitting element. The light-emitting element 170 has a stacked-layer structure in which an electrode 191 serving as a pixel electrode, an EL layer 192, and an electrode 193 serving as a common electrode are stacked in this order from the insulating layer 220 side. The electrode 191 is connected to the conductive layer 222a included in the transistor 205 through an opening provided in an insulating layer 214. The transistor 205 has a function of controlling the driving of the light-emitting element 170. An insulating layer 216 covers an end portion of the electrode 191. The electrode 193 includes a material that reflects visible light, and the electrode 191 includes a material that transmits visible light. An insulating layer 194 is provided to cover the electrode 193. Light is emitted from the light-emitting element 170 to the substrate 361 side through the coloring layer 134, the insulating layer 220, the opening 451, the electrode 311a, and the like.

The liquid crystal element 180 and the light-emitting element 170 can exhibit various colors when the color of the coloring layer varies among pixels. The display device 300A can display a color image using the liquid crystal element 180. The display device 300A can display a color image using the light-emitting element 170.

The transistor 201, the transistor 203, the transistor 205, and the transistor 206 are formed on a plane of the insulating layer 220 on the substrate 351 side. These transistors can be fabricated through the same process.

A circuit electrically connected to the liquid crystal element 180 and a circuit electrically connected to the light-emitting element 170 are preferably formed on the same plane. In that case, the thickness of the display device can be smaller than that in the case where the two circuits are formed on different planes. Furthermore, since two transistors can be formed in the same process, a manufacturing process can be simplified as compared to the case where two transistors are formed on different planes.

The pixel electrode of the liquid crystal element 180 is positioned on the opposite side of a gate insulating layer included in the transistor from the pixel electrode of the light-emitting element 170.

In the case where a transistor including a metal oxide in its channel formation region and having an extremely low off-state current is used as the transistor 206 or in the case where a memory element electrically connected to the transistor 206 is used, for example, in displaying a still image using the liquid crystal element 180, even if writing operation to a pixel is stopped, the gray level can be maintained. In other words, an image can be kept displayed even with an extremely low frame rate. In one embodiment of the present invention, the frame rate can be extremely low and driving with low power consumption can be performed.

The transistor 203 is used for controlling whether the pixel is selected or not (such a transistor is also referred to as a switching transistor or a selection transistor). The transistor 205 is used for controlling current flowing to the light-emitting element 170 (such a transistor is also referred to as a driving transistor).

Insulating layers such as an insulating layer 211, an insulating layer 212, an insulating layer 213, and the insulating layer 214 are provided on the substrate 351 side of the insulating layer 220. Part of the insulating layer 211 functions as a gate insulating layer of each transistor. The insulating layer 212 is provided to cover the transistor 206 and the like. The insulating layer 213 is provided to cover the transistor 205 and the like. The insulating layer 214 functions as a planarization layer. Note that the number of insulating layers covering the transistor is not limited and may be one or two or more.

A material through which impurities such as water or hydrogen do not easily diffuse is preferably used for at least one of the insulating layers that cover the transistors. This is because such an insulating layer can serve as a barrier film. Such a structure can effectively suppress diffusion of the impurities into the transistors from the outside, and a highly reliable display device can be provided.

Each of the transistors 201, 203, 205, and 206 includes a conductive layer 221a functioning as a gate, the insulating layer 211 functioning as the gate insulating layer, the conductive layer 222a and a conductive layer 222b functioning as a source and a drain, and a semiconductor layer 231. Here, a plurality of layers obtained by processing the same conductive film are shown with the same hatching pattern.

The transistor 201 and the transistor 205 each include a conductive layer 223 functioning as a gate, in addition to the components of the transistor 203 or the transistor 206.

The structure in which the semiconductor layer where a channel is formed is provided between two gates is used as an example of the transistors 201 and 205. Such a structure enables the control of the threshold voltages of transistors. The two gates may be connected to each other and supplied with the same signal to operate the transistors. Such transistors can have higher field-effect mobility and thus have a higher on-state current than other transistors. Consequently, a circuit capable of high-speed operation can be obtained. Furthermore, the area occupied by a circuit portion can be reduced. The use of the transistor having a high on-state current can reduce signal delay in wirings and can reduce display unevenness even in a display device in which the number of wirings is increased because of an increase in size or resolution.

Alternatively, by supplying a potential for controlling the threshold voltage to one of the two gates and a potential for driving to the other, the threshold voltage of the transistor can be controlled.

There is no limitation on the structure of the transistors included in the display device. The transistor included in the circuit 364 and the transistor included in the display portion 362 may have the same structure or different structures. A plurality of transistors included in the circuit 364 may have the same structure or a combination of two or more kinds of structures. Similarly, a plurality of transistors included in the display portion 362 may have the same structure or a combination of two or more kinds of structures.

It is preferable to use a conductive material containing an oxide for the conductive layer 223. A conductive film used for the conductive layer 223 is formed in an oxygen-containing atmosphere, whereby oxygen can be supplied to the insulating layer 212. The proportion of an oxygen gas in a deposition gas is preferably higher than or equal to 90% and lower than or equal to 100%. Oxygen supplied to the insulating layer 212 is then supplied to the semiconductor layer 231 by later heat treatment; as a result, oxygen vacancies in the semiconductor layer 231 can be reduced.

It is particularly preferable to use a low-resistance metal oxide for the conductive layer 223. In that case, an insulating film that releases hydrogen, such as a silicon nitride film, is preferably used for the insulating layer 213, for example, because hydrogen can be supplied to the conductive layer 223 during the formation of the insulating layer 213 or by heat treatment performed after the formation of the insulating layer 213, which leads to an effective reduction in the electric resistance of the conductive layer 223.

The coloring layer 134 is provided in contact with the insulating layer 213. The coloring layer 134 is covered with the insulating layer 214.

A connection portion 204 is provided in a region where the substrate 351 does not overlap with the substrate 361. In the connection portion 204, the wiring 365 is electrically connected to the FPC 372 via a connection layer 242. The connection portion 204 has a structure similar to that of the connection portion 207. On the top surface of the connection portion 204, a conductive layer obtained by processing the same conductive film as the electrode 311a is exposed. Thus, the connection portion 204 and the FPC 372 can be electrically connected to each other via the connection layer 242.

As the polarizing plate 135 provided on the outer surface of the substrate 361, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element used as the liquid crystal element 180 are controlled depending on the kind of the polarizing plate so that desirable contrast is obtained.

Note that a variety of optical members can be arranged on the outer surface of the substrate 361. Examples of the optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film suppressing generation of a scratch caused by the use, or the like may be arranged on the outer surface of the substrate 361.

For each of the substrates 351 and 361, glass, quartz, ceramic, sapphire, an organic resin, or the like can be used. When the substrates 351 and 361 are formed using a flexible material, the flexibility of the display device can be increased.

A liquid crystal element having, for example, a vertical alignment (VA) mode can be used as the liquid crystal element 180. Examples of the vertical alignment mode include a multi-domain vertical alignment (MVA) mode, a patterned vertical alignment (PVA) mode, and an advanced super view (ASV) mode.

A liquid crystal element having a variety of modes can be used as the liquid crystal element 180. For example, a liquid crystal element using, instead of a VA mode, a twisted nematic (TN) mode, an in-plane switching (IPS) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

The liquid crystal element is an element that controls transmission or non-transmission of light utilizing an optical modulation action of the liquid crystal. The optical modulation action of the liquid crystal is controlled by an electric field applied to the liquid crystal (including a horizontal electric field, a vertical electric field, and an oblique electric field). As the liquid crystal used for the liquid crystal element, a thermotropic liquid crystal, a low-molecular liquid crystal, a high-molecular liquid crystal, a polymer dispersed liquid crystal (PDLC), a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

As the liquid crystal material, a positive liquid crystal or a negative liquid crystal may be used, and an appropriate liquid crystal material can be used depending on the mode or design to be used.

To control the alignment of the liquid crystal, the alignment films can be provided. In the case where a horizontal electric field mode is employed, a liquid crystal exhibiting a blue phase for which an alignment film is unnecessary may be used.

In the case where the reflective liquid crystal element is used, the polarizing plate 135 is provided on the display surface side. In addition, a light diffusion plate is preferably provided on the display surface side to improve visibility.

A front light may be provided on the outer side of the polarizing plate 135. As the front light, an edge-light front light is preferably used. A front light including an LED is preferably used to reduce power consumption.

For the materials that can be used for the light-emitting element, the transistors, the insulating layers, the conductive layers, the bonding layers, the connection layer, and the like, the description in Embodiment 1 can be referred to.

<Structure Example 2>

Figure 20:
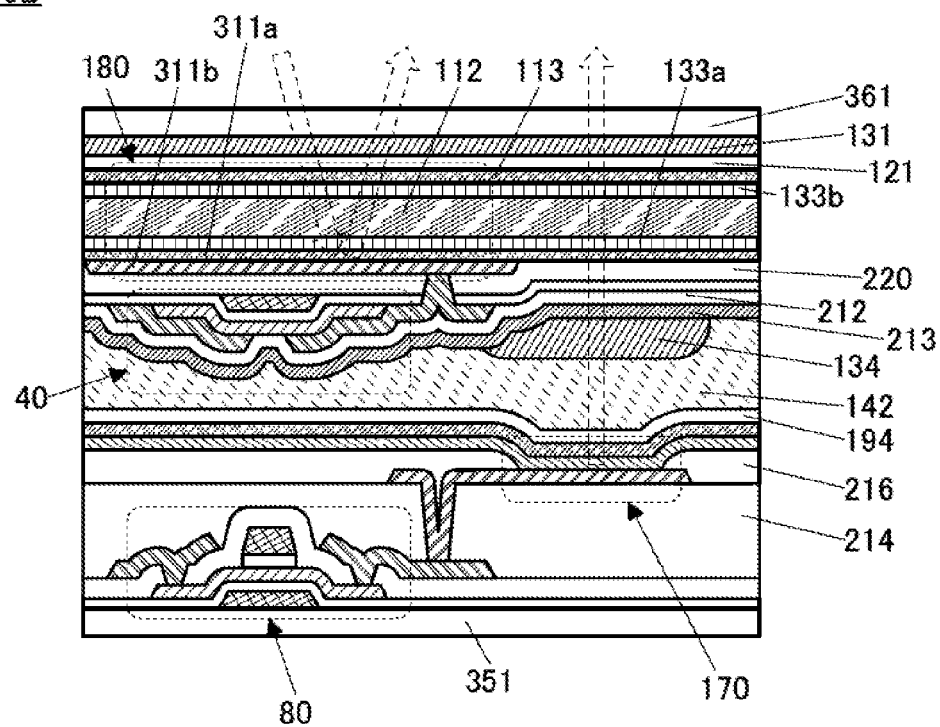
FIG. 20 is a cross-sectional view illustrating an example of a display device.

FIG. 20 is a cross-sectional view illustrating a display portion of a display device 300B.

The display device 300B illustrated in FIG. 20 includes the transistor 40, the transistor 80, the liquid crystal element 180, the light-emitting element 170, the insulating layer 220, the coloring layer 131, the coloring layer 134, and the like, between the substrate 351 and the substrate 361.

For the structures and manufacturing methods of the transistor 40 and the transistor 80, Embodiment 1 can be referred to.

In the liquid crystal element 180, external light is reflected on the electrode 311b and emitted to the substrate 361 side. The light-emitting element 170 emits light to the substrate 361 side. For the structures of the liquid crystal element 180 and the light-emitting element 170, the structure example 1 can be referred to.

The substrate 361 is provided with the coloring layer 131, the insulating layer 121, the electrode 113 functioning as the common electrode of the liquid crystal element 180, the alignment film 133b.

The liquid crystal layer 112 is sandwiched between the electrode 311a and the electrode 113 with the alignment film 133a positioned between the electrode 311a and the liquid crystal layer 112 and with the alignment film 133b positioned between the electrode 113 and the liquid crystal layer 112.

The transistor 40 is covered with the insulating layer 212 and the insulating layer 213. The insulating layer 213 and the coloring layer 134 are bonded to the insulating layer 194 with the bonding layer 142.

In the display device 300B, the transistor 40 for driving the liquid crystal element 180 and the transistor 80 for driving the light-emitting element 170 are formed over different planes; thus, each of the transistors can be easily formed using a structure and a material suitable for driving the corresponding display element.

<Manufacturing Method Example of Display Device 300A>

Next, the manufacturing method of the display device of this embodiment will be specifically described with reference to FIGS. 21A to 21D, FIGS. 22A and 22B, and FIGS. 23A and 23B. An example of a manufacturing method of the display device 300A illustrated in FIG. 19 will be described below. The manufacturing method will be described with reference to FIGS. 21A to 21D, FIGS. 22A and 22B, and FIGS. 23A and 23B, focusing on the display portion 362 of the display device 300A. Note that the transistor 203 is not illustrated in FIGS. 21A to 21D, FIGS. 22A and 22B, and FIGS. 23A and 23B.

Figure 21A:
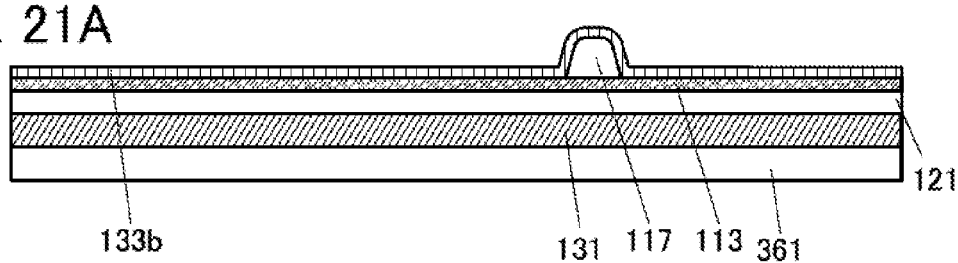
FIGS. 21A to 21D are cross-sectional views illustrating an example of a manufacturing method of a display device.

First, the coloring layer 131 is formed over the substrate 361 (FIG. 21A). The coloring layer 131 is formed using a photosensitive material, in which case the processing into an island shape can be performed by a photolithography method or the like. Note that in a non-display region of the display portion 362 and the circuit 364 and the like illustrated in FIG. 19, the light-blocking layer 132 is provided over the substrate 361.

Then, the insulating layer 121 is formed over the coloring layer 131 and the light-blocking layer 132.

The insulating layer 121 preferably functions as a planarization layer. A resin such as acrylic or epoxy is suitably used for the insulating layer 121.

An inorganic insulating film may be used for the insulating layer 121. For example, an inorganic insulating film such as a silicon nitride film, a silicon oxynitride film, a silicon oxide film, a silicon nitride oxide film, an aluminum oxide film, or an aluminum nitride film can be used for the insulating layer 121. Alternatively, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. Further alternatively, a stack including two or more of the above insulating films may be used.

Next, the electrode 113 is formed. The electrode 113 can be formed in the following manner: a conductive film is formed, a resist mask is formed, the conductive film is etched, and the resist mask is removed. The electrode 113 is formed using a conductive material that transmits visible light.

After that, the insulating layer 117 is formed over the electrode 113. An organic insulating film is preferably used for the insulating layer 117.

Subsequently, the alignment film 133b is formed over the electrode 113 and the insulating layer 117 (FIG. 21A). The alignment film 133b can be formed in the following manner: a thin film is formed using a resin or the like and then, rubbing treatment is performed.

Note that steps illustrated in FIGS. 21B to 21D, FIGS. 22A and 22B, and FIG. 23A are performed independently of the steps described with reference to FIG. 21A.

Figure 21B:
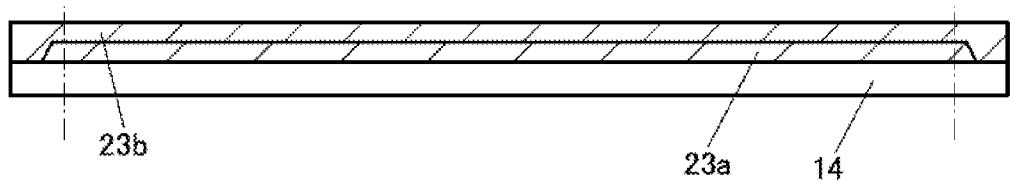

First, the first resin layer 23a that has an island-like shape is formed over the formation substrate 14. Then, the second resin layer 23b is formed over the formation substrate 14 and the first resin layer 23a (FIG. 21B). For these steps, the manufacturing method example 2 (FIGS. 4A, 4B, 4C, and 4D1) in Embodiment 1 can be referred to.

Figure 21C:
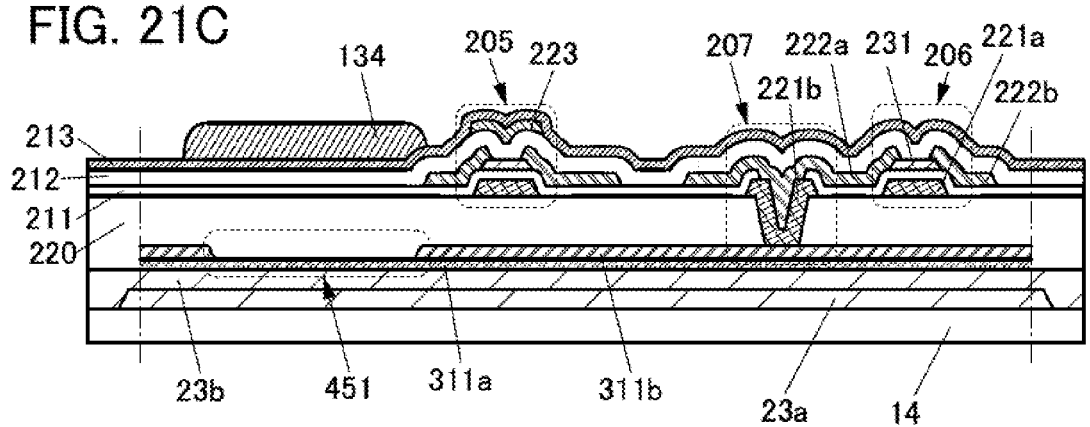

Next, the electrode 311a is formed over the second resin layer 23b, and the electrode 311b is formed over the electrode 311a (FIG. 21C). The electrode 311b includes the opening 451 over the electrode 311a. Each of the electrodes 311a and 311b can be formed in the following manner: a conductive film is formed, a resist mask is formed, the conductive film is etched, and the resist mask is removed. The electrode 311a is formed using a conductive material that transmits visible light. The electrode 311b is formed using a conductive material that reflects visible light.

The electrode 311a may be formed over an insulating film formed over the second resin layer 23b. As the insulating film, an inorganic insulating film that can be used to form the insulating layer 121 is suitably used. The insulating layer can be used as a barrier layer that prevents diffusion of impurities contained in the first resin layer 23a and the second resin layer 23b into a transistor and a display element formed later.

After that, the insulating layer 220 is formed. Then, an opening that reaches the electrode 311b is formed in the insulating layer 220.

The insulating layer 220 can be used as a barrier layer that prevents diffusion of impurities contained in the first resin layer 23a and the second resin layer 23b into a transistor and a display element formed later. For example, the insulating layer 220 preferably prevents moisture and the like contained in the first resin layer 23a and the second resin layer 23b from diffusing into the transistor and the display element when the first resin layer 23a and the second resin layer 23b is heated. Thus, the insulating layer 220 preferably has a high barrier property.

The insulating layer 220 can be formed using the inorganic insulating film, the resin, or the like that can be used for the insulating layer 121.

Next, the transistor 205 and the transistor 206 are formed over the insulating layer 220.

There is no particular limitation on a semiconductor material used for the semiconductor layer of the transistor, and for example, a Group 14 element, a compound semiconductor, or an oxide semiconductor can be used. Typically, a semiconductor containing silicon, a semiconductor containing gallium arsenide, an oxide semiconductor containing indium, or the like can be used.

Described here is the case where a bottom-gate transistor including a metal oxide layer as the semiconductor layer 231 is fabricated as the transistor 206. The transistor 205 includes the conductive layer 223 and the insulating layer 212 in addition to the components of the transistor 206, and has two gates. A metal oxide can function as an oxide semiconductor.

Specifically, first, the conductive layer 221a and the conductive layer 221b are formed over the insulating layer 220. The conductive layer 221a and the conductive layer 221b can be formed in the following manner: a conductive film is formed, a resist mask is formed, the conductive film is etched, and the resist mask is removed. At this time, the conductive layer 221b and the electrode 311b are connected to each other through an opening in the insulating layer 220.

Next, the insulating layer 211 is formed.

For the insulating layer 211, for example, an inorganic insulating film such as a silicon nitride film, a silicon oxynitride film, a silicon oxide film, a silicon nitride oxide film, an aluminum oxide film, or an aluminum nitride film can be used. Alternatively, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. Further alternatively, a stack including two or more of the above insulating films may be used.

An inorganic insulating film is preferably formed at high temperatures because the film can have higher density and a higher barrier property as the deposition temperature becomes higher. The substrate temperature during the formation of the inorganic insulating film is preferably higher than or equal to room temperature (25° C.) and lower than or equal to 350° C., further preferably higher than or equal to 100° C. and lower than or equal to 300° C.

Then, the semiconductor layer 231 is formed. In this embodiment, a metal oxide layer is formed as the semiconductor layer 231. The metal oxide layer can be formed in the following manner: a metal oxide film is formed, a resist mask is formed, the metal oxide film is etched, and the resist mask is removed.

Next, the conductive layer 222a and the conductive layer 222b are formed. The conductive layer 222a and the conductive layer 222b can be formed in the following manner: a conductive film is formed, a resist mask is formed, the conductive film is etched, and the resist mask is removed. Each of the conductive layers 222a and 222b is connected to the semiconductor layer 231. Here, the conductive layer 222a included in the transistor 206 is electrically connected to the conductive layer 221b. As a result, the electrode 311b and the conductive layer 222a can be electrically connected to each other at the connection portion 207.

Note that during the processing of the conductive layer 222a and the conductive layer 222b, the semiconductor layer 231 might be partly etched to be thin in a region not covered by the resist mask.

In the above manner, the transistor 206 can be fabricated.

Next, the insulating layer 212 that covers the transistor 206 is formed. The insulating layer 212 is formed to cover the semiconductor layer 231, the conductive layer 222a, and the conductive layer 222b of each of the transistor 205 and the transistor 206. Next, the conductive layer 223 of the transistor 205 is formed over the insulating layer 212.

The insulating layer 212 can be formed in a manner similar to that of the insulating layer 211.

The conductive layer 223 included in the transistor 205 can be formed in the following manner: a conductive film is formed, a resist mask is formed, the conductive film is etched, and the resist mask is removed.

In the above manner, the transistor 205 can be fabricated.

Next, the insulating layer 213 covering the transistor 205 and the transistor 206 is formed. The insulating layer 213 can be formed in a manner similar to that of the insulating layer 211.

It is preferable to use an oxide insulating film formed in an oxygen-containing atmosphere, such as a silicon oxide film or a silicon oxynitride film, for the insulating layer 212. An insulating film with low oxygen diffusibility and oxygen permeability, such as a silicon nitride film, is preferably stacked as the insulating layer 213 over the silicon oxide film or the silicon oxynitride film. The oxide insulating film formed in an oxygen-containing atmosphere can easily release a large amount of oxygen by heating. When a stack including such an oxide insulating film that releases oxygen and such an insulating film with low oxygen diffusibility and oxygen permeability is heated, oxygen can be supplied to the metal oxide layer. As a result, oxygen vacancies in the metal oxide layer can be filled and defects at the interface between the metal oxide layer and the insulating layer 212 can be repaired, leading to a reduction in defect levels. Accordingly, a display device with extremely high reliability can be fabricated.

Figure 21D:
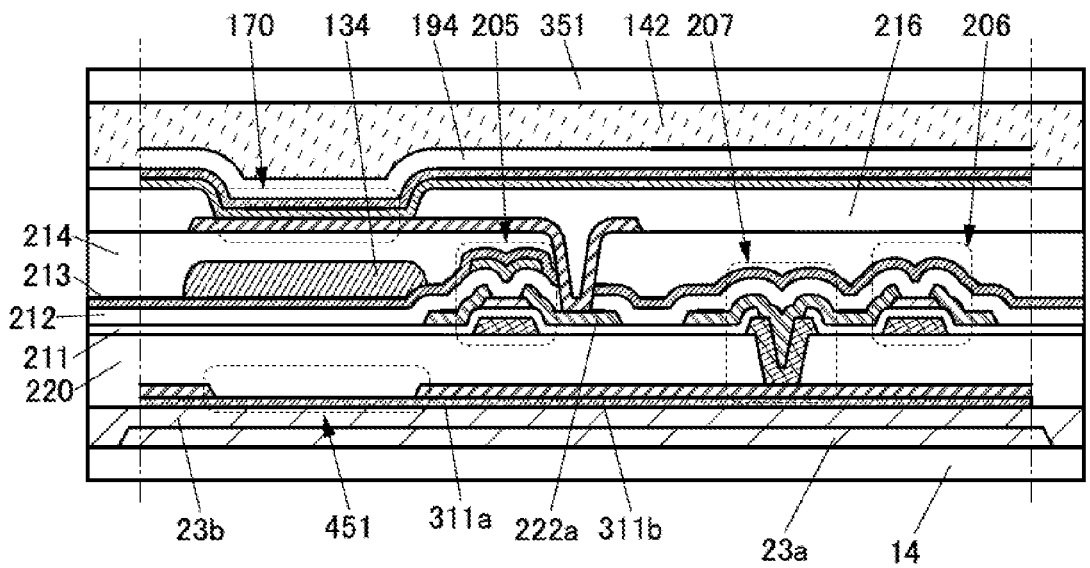

Next, the coloring layer 134 is formed over the insulating layer 213 (FIG. 21C) and then, the insulating layer 214 is formed (FIG. 21D). The coloring layer 134 is positioned so as to overlap with the opening 451 in the electrode 311b.

The coloring layer 134 can be formed in a manner similar to that of the coloring layer 131. The display element is formed on the insulating layer 214 in a later step; thus, the insulating layer 214 preferably functions as a planarization layer. For the insulating layer 214, the description of the resin or the inorganic insulating film that can be used for the insulating layer 121 can be referred to.

After that, an opening that reaches the conductive layer 222a included in the transistor 205 is formed in the insulating layer 212, the insulating layer 213, and the insulating layer 214.

Subsequently, the electrode 191 is formed. The electrode 191 can be formed in the following manner: a conductive film is formed, a resist mask is formed, the conductive film is etched, and the resist mask is removed. Here, the conductive layer 222a included in the transistor 205 and the electrode 191 are connected to each other. The electrode 191 is formed using a conductive material that transmits visible light.

Then, the insulating layer 216 that covers the end portion of the electrode 191 is formed. For the insulating layer 216, the description of the resin or the inorganic insulating film that can be used for the insulating layer 121 can be referred to. The insulating layer 216 includes an opening in a region overlapping with the electrode 191.

Next, the EL layer 192 and the electrode 193 are formed. Part of the electrode 193 functions as the common electrode of the light-emitting element 170. The electrode 193 is formed using a conductive material that reflects visible light.

Steps after the formation of the EL layer 192 are performed such that temperatures higher than the upper temperature limit of the EL layer 192 are not applied to the EL layer 192. The electrode 193 can be formed by an evaporation method, a sputtering method, or the like.

In the above manner, the light-emitting element 170 can be formed. The light-emitting element 170 is formed such that the light-emitting region overlaps with the coloring layer 134 and the opening 451 in the electrode 311b.

Next, the insulating layer 194 is formed so as to cover the electrode 193. The insulating layer 194 functions as a protective layer that prevents diffusion of impurities such as water into the light-emitting element 170. The light-emitting element 170 is sealed with the insulating layer 194. After the electrode 193 is formed, the insulating layer 194 is preferably formed without exposure to the air.

The inorganic insulating film that can be used for the insulating layer 121 can be used for the insulating layer 194, for example. It is particularly preferable that the insulating layer 194 include an inorganic insulating film with a high barrier property. A stack including an inorganic insulating film and an organic insulating film can also be used.

The insulating layer 194 is preferably formed at substrate temperature lower than or equal to the upper temperature limit of the EL layer 192. The insulating layer 194 can be formed by an ALD method, a sputtering method, or the like. An ALD method and a sputtering method are preferable because a film can be formed at low temperatures. An ALD method is preferable because the coverage with the insulating layer 194 is improved.

Then, the substrate 351 is bonded to a surface of the insulating layer 194 with the bonding layer 142 (FIG. 21D).

The bonding layer 142 can be formed using any of the materials given in Embodiment 1 as examples of the material that can be used for the bonding layer 75b.

The substrate 351 can be formed using any of the materials given in Embodiment 1 as examples of the material that can be used for the substrate 75a.

Figure 22A:
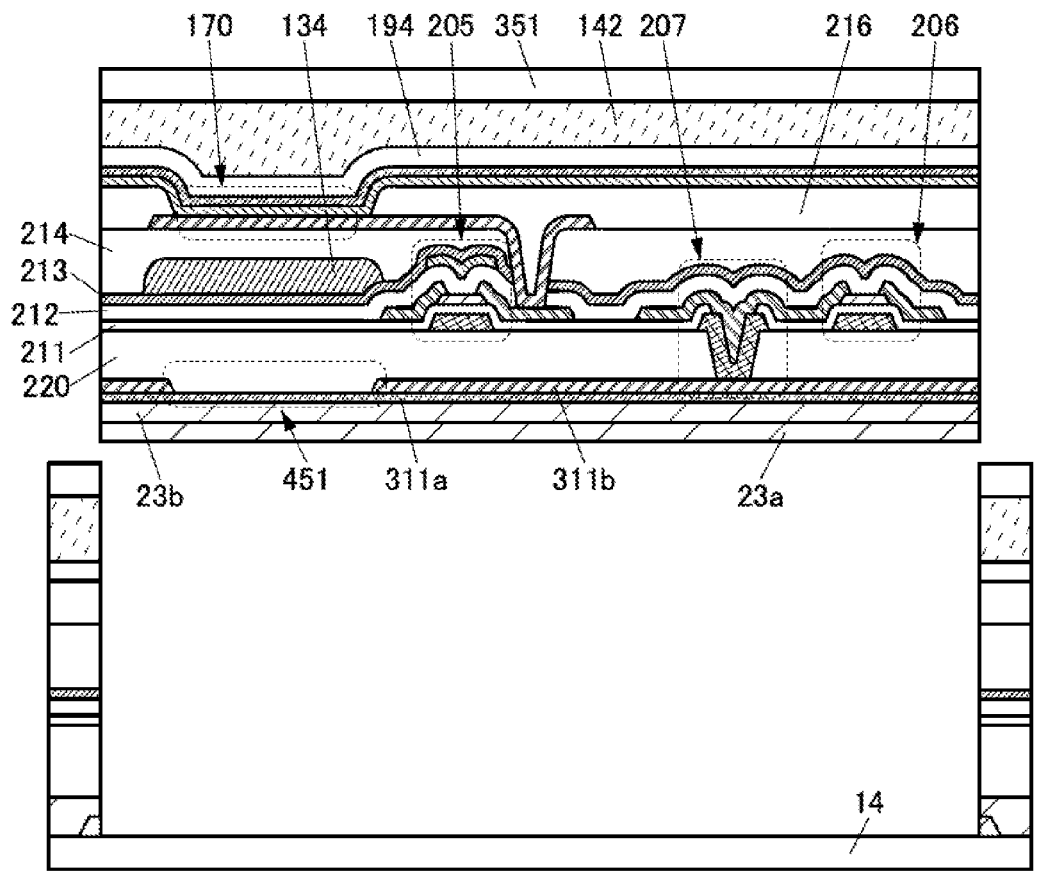
FIGS. 22A and 22B are cross-sectional views illustrating an example of a manufacturing method of a display device.

Then, a separation starting point is formed in the first resin layer 23a, and the formation substrate 14 and the first resin layer 23a are separated from each other (FIG. 22A).

Figure 22B:
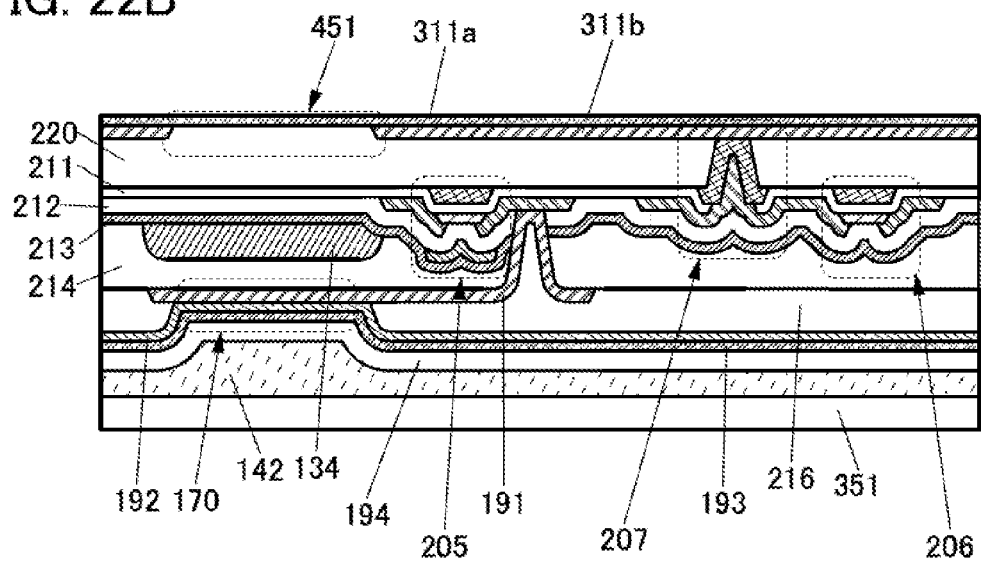

Next, the first resin layer 23a and the second resin layer 23b are preferably removed. The first resin layer 23a and the second resin layer 23b can be removed by a dry etching method, for example. Accordingly, the electrode 311a is exposed (FIG. 22B).

In the case where the insulating film is positioned between the second resin layer 23b and the electrode 311a, the insulating film may be either removed or left. To remove the insulating film, a dry etching method can be used, for example.

Figure 23A:
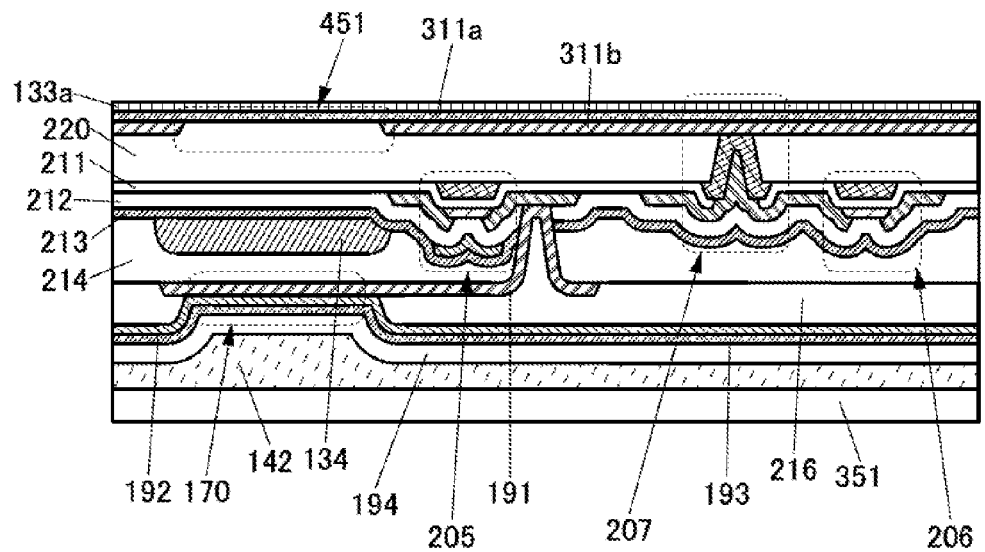
FIGS. 23A and 23B are cross-sectional views illustrating an example of a manufacturing method of a display device.

Subsequently, the alignment film 133a is formed on the exposed surface of the electrode 311a (or the insulating film) (FIG. 23A). The alignment film 133a can be formed in the following manner: a thin film is formed using a resin or the like and then, rubbing treatment is performed.

Figure 23B:
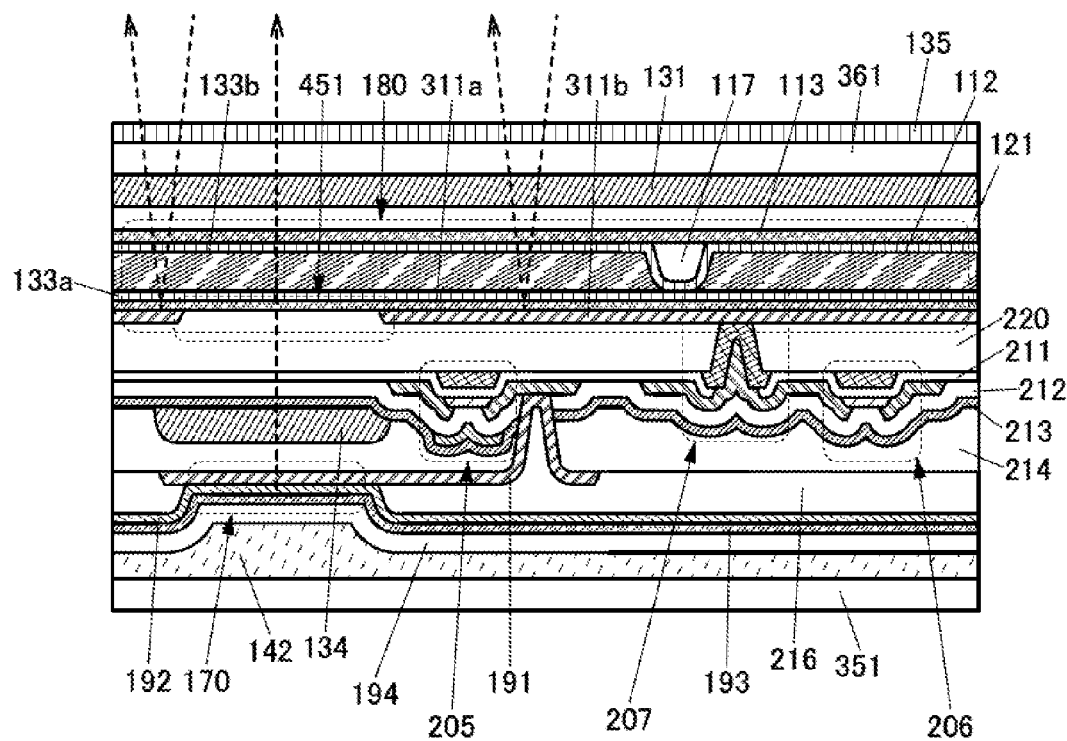

Then, the substrate 361 obtained from the steps described using FIG. 21A and the substrate 351 obtained from the steps up to the step illustrated in FIG. 23A are bonded to each other with the liquid crystal layer 112 provided therebetween (FIG. 23B). Although not illustrated in FIG. 23B, the substrate 351 and the substrate 361 are bonded to each other with the bonding layer 141 as illustrated in FIG. 19 and other drawings. For materials for the bonding layer 141, the description of the materials that can be used for the bonding layer 142 can be referred to.

In the liquid crystal element 180 illustrated in FIG. 23B, the electrode 311a (and the electrode 311b) part of which functions as the pixel electrode, the liquid crystal layer 112, and the electrode 113 part of which functions as the common electrode are stacked. The liquid crystal element 180 is formed so as to overlap with the coloring layer 131.

The polarizing plate 135 is placed on the outer surface of the substrate 361.

Through the above process, the display device 300A can be manufactured.

<Manufacturing Method Example of Display Device 300B>

Next, the manufacturing method of the display device of this embodiment will be specifically described with reference to FIGS. 24A to 24D, FIGS. 25A and 25B, and FIGS. 26A to 26C. An example of a manufacturing method of the display device 300B illustrated in FIG. 20 will be described below. Note that portions similar to those in the manufacturing method example of the display device 300A will not be described in some cases.

Figure 24A:
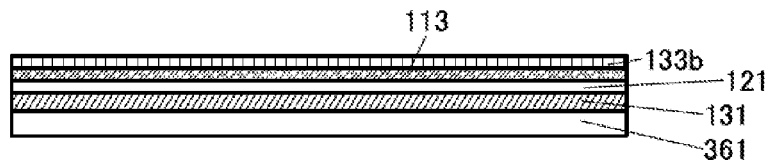
FIGS. 24A to 24D are cross-sectional views illustrating an example of a manufacturing method of a display device.

First, as in the manufacturing method example of the display device 300A, the coloring layer 131, the insulating layer 121, the electrode 113, and the alignment film 133b are formed over the substrate 361 in that order (FIG. 24A).

Figure 24B:
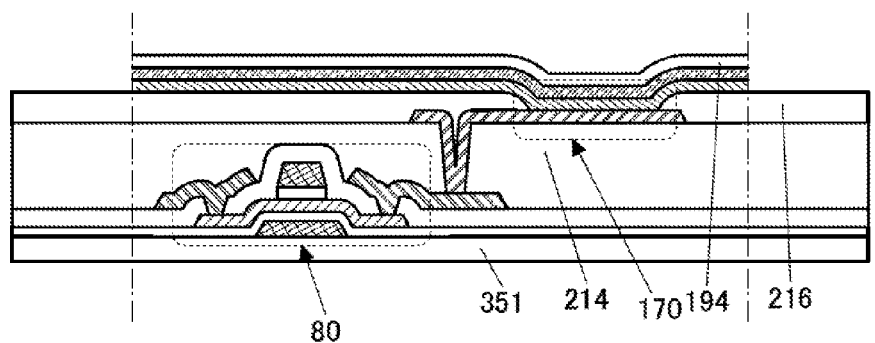

Furthermore, the steps illustrated in FIG. 24B are performed independently of the steps described with reference to FIG. 24A.

First, the transistor 80 is formed over the substrate 351. For the structure and manufacturing method of the transistor 80, Embodiment 1 can be referred to.

Then, the insulating layer 214, the insulating layer 216, the light-emitting element 170, and the insulating layer 194 are formed (FIG. 24B). For the structures and formation methods of the insulating layer 214, the insulating layer 216, the light-emitting element 170, and the insulating layer 194, the manufacturing method example of the display device 300A can be referred to.

Figure 24C:
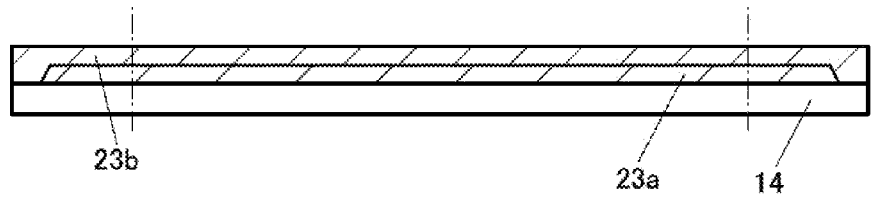
Figure 24D:
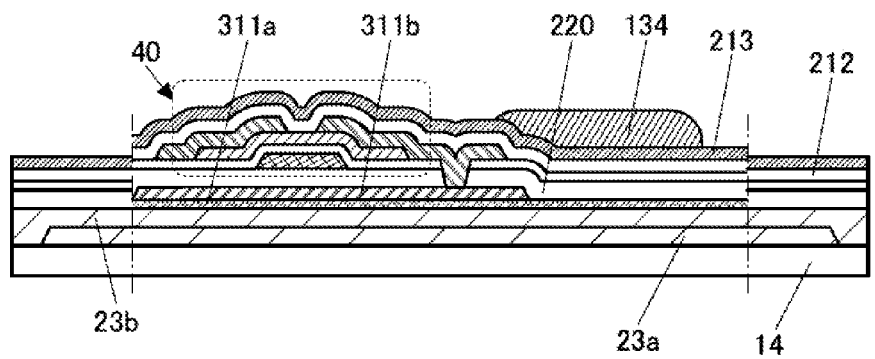

Furthermore, the steps illustrated in FIGS. 24C and 24D are performed independently of the steps described with reference to FIG. 24A and the steps described with reference to FIG. 24B.

First, the first resin layer 23a that has an island-like shape is formed over the formation substrate 14. Then, the second resin layer 23b is formed over the formation substrate 14 and the first resin layer 23a (FIG. 24C). For these steps, the manufacturing method example 2 (FIGS. 4A, 4B, 4C, and 4D1) in Embodiment 1 can be referred to.

Next, the electrode 311a is formed over the second resin layer 23b, and the electrode 311b is formed over the electrode 311a (FIG. 24D). The electrode 311a may be formed over an insulating film formed over the second resin layer 23b.

After that, the insulating layer 220 is formed (FIG. 24D). Then, an opening that reaches the electrode 311b is formed in the insulating layer 220.

Then, the transistor 40 is formed over the insulating layer 220. For the structure and manufacturing method of the transistor 40, Embodiment 1 can be referred to.

After that, the insulating layer 212 that covers the transistor 40 is formed, the insulating layer 213 is formed over the insulating layer 212, and the coloring layer 134 is formed over the insulating layer 213 (FIG. 24D).

Figure 25A:
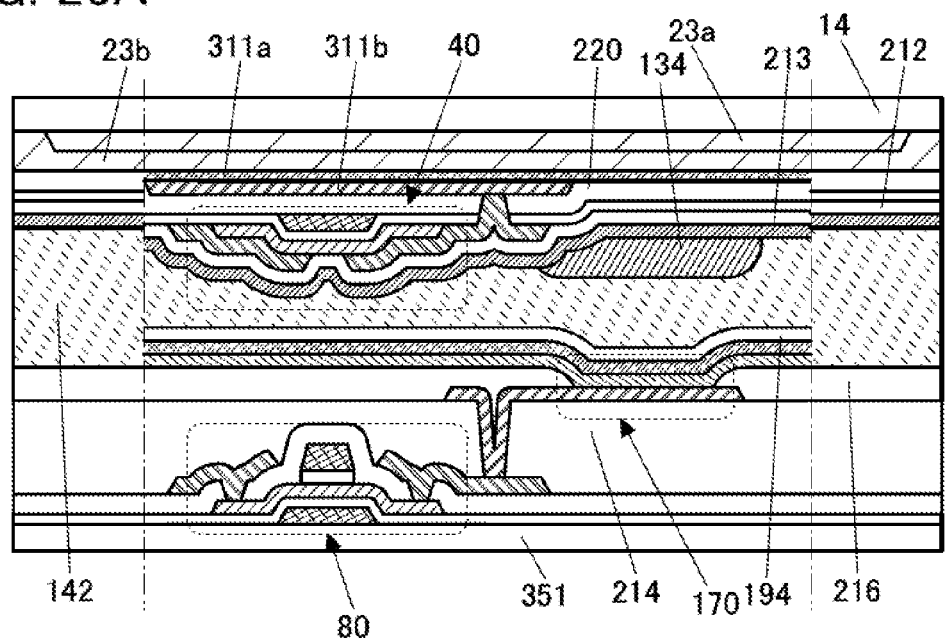
FIGS. 25A and 25B are cross-sectional views illustrating an example of a manufacturing method of a display device.

The substrate 351 obtained from the steps described with reference to FIG. 24B and the formation substrate 14 obtained from the steps up to the steps illustrated in FIG. 24D, are bonded to each other using the bonding layer 142 (FIG. 25A).

Figure 25B:
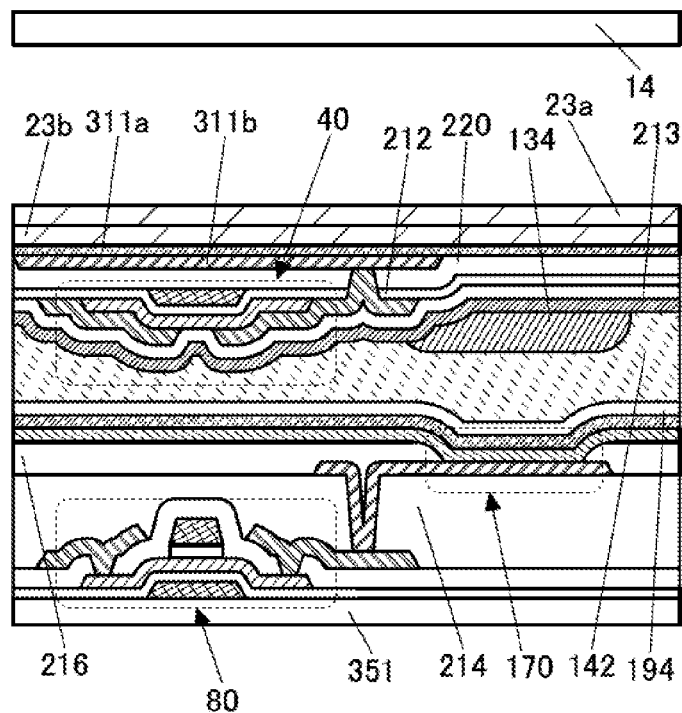

Then, a separation starting point is formed in the first resin layer 23a, and the formation substrate 14 and the first resin layer 23a are separated from each other (FIG. 25B).

Figure 26A:
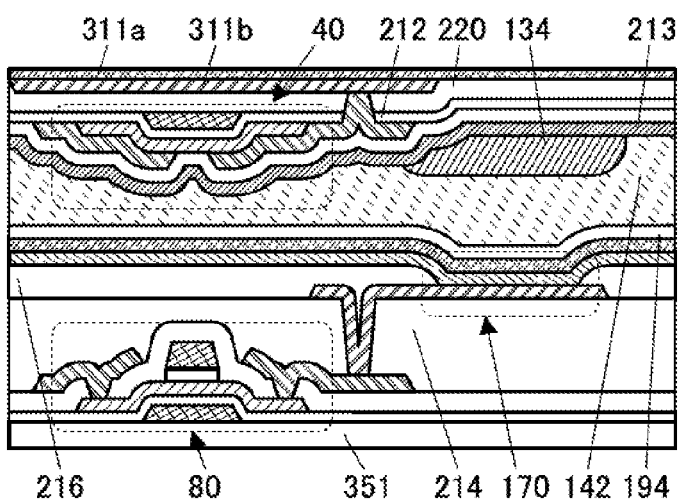
FIGS. 26A to 26C are cross-sectional views illustrating an example of a manufacturing method of a display device.

Next, the first resin layer 23a and the second resin layer 23b are preferably removed. The first resin layer 23a and the second resin layer 23b can be removed by a dry etching method, for example. Accordingly, the electrode 311a is exposed (FIG. 26A).

In the case where the insulating film is positioned between the second resin layer 23b and the electrode 311a, the insulating film may be either removed or left. To remove the insulating film, a dry etching method can be used, for example.

Figure 26B:
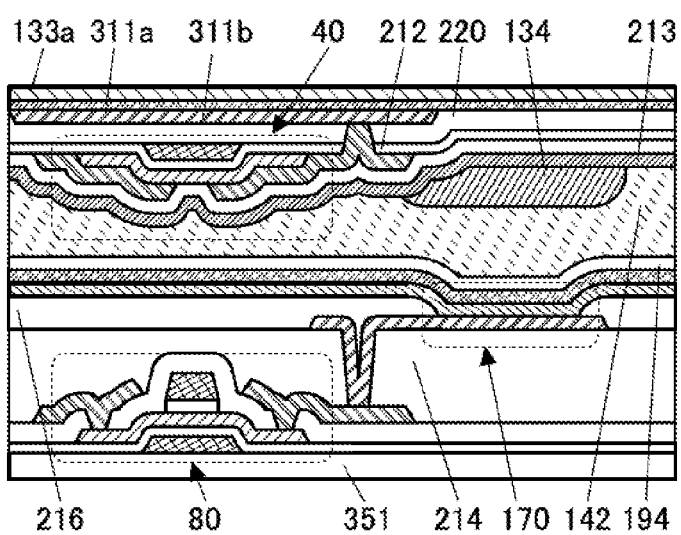

Subsequently, the alignment film 133a is formed on the exposed surface of the electrode 311a (or the insulating film) (FIG. 26B).

Figure 26C:
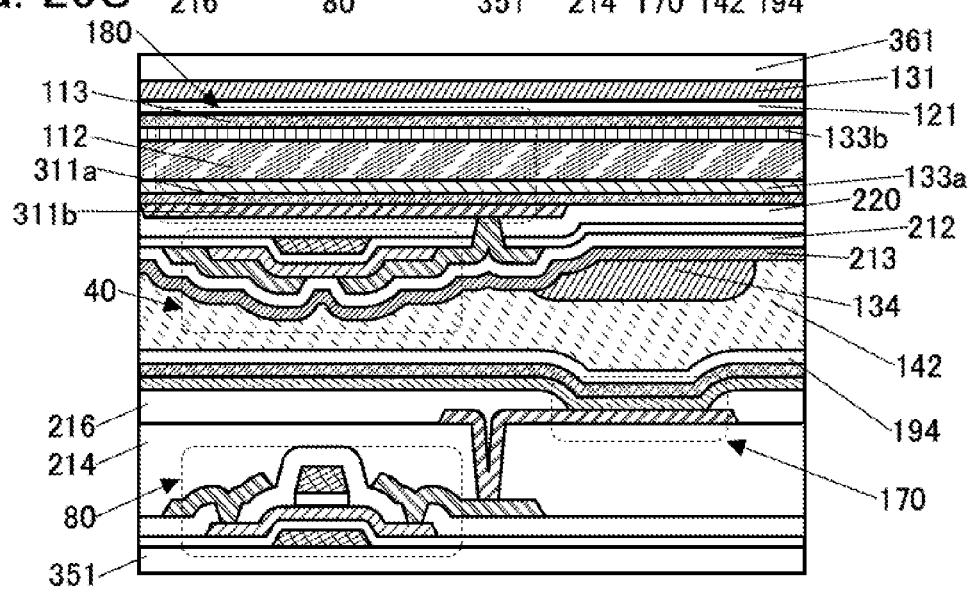

Then, the substrate 361 obtained from the step described using FIG. 24A and the substrate 351 obtained from the steps up to the step illustrated in FIG. 26B are bonded to each other with the liquid crystal layer 112 provided therebetween (FIG. 26C). Although not illustrated in FIG. 26C, the substrate 351 and the substrate 361 are bonded to each other with a bonding layer.

In the liquid crystal element 180 illustrated in FIG. 26C, the electrode 311a (and the electrode 311b) part of which functions as the pixel electrode, the liquid crystal layer 112, and the electrode 113 part of which functions as the common electrode are stacked. The liquid crystal element 180 is formed so as to overlap with the coloring layer 131.

Through the above process, the display device 300B can be manufactured.

The display device of this embodiment includes two types of display elements as described above; thus, switching between a plurality of display modes is possible. Accordingly, the display device can have high visibility regardless of the ambient brightness, leading to high convenience.

With the use of the method described in Embodiment 1, the first resin layer 23a can be separated from the formation substrate 14 without laser irradiation performed on the entire area of the first resin layer 23a. Consequently, a display device can be manufactured at low costs. In addition, separation of the first resin layer 23a from the formation substrate 14 at an unintended time can be avoided. Since the timing of separation can be controlled and high separability can be achieved, the yield of a separation process and a manufacturing process of a display device can be increased.

This embodiment can be combined with any of other embodiments as appropriate.

(Embodiment 3)

In this embodiment, more specific structure examples of the display device described in Embodiment 2 will be described with reference to FIGS. 27A, 27B1, 27B2, 27B3, and 27B4, FIG. 28, and FIGS. 29A and 29B.

Figure 27A:
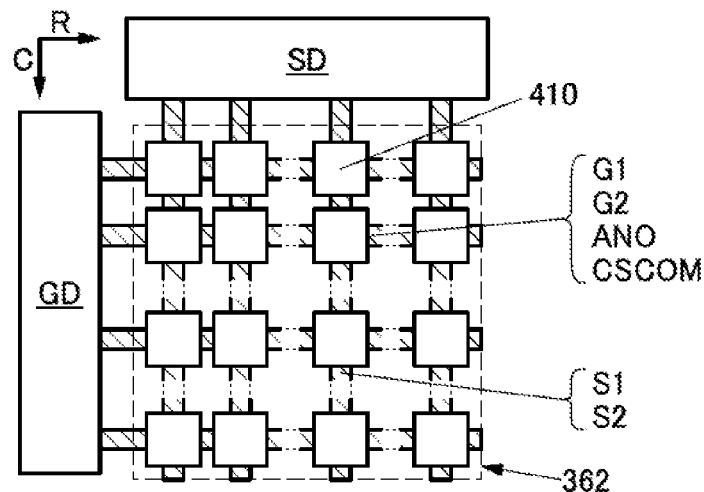
FIG. 27A illustrates an example of a display device, and FIGS. 27B1, 27B2, 27B3, and 27B4 each illustrate an example of a pixel.
Figure 27A:
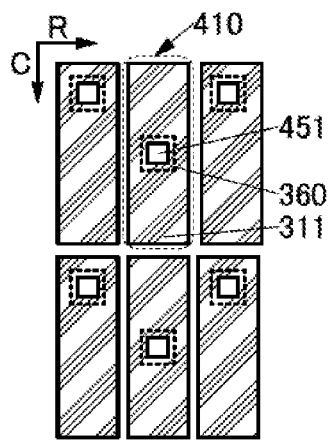
Figure 27A:
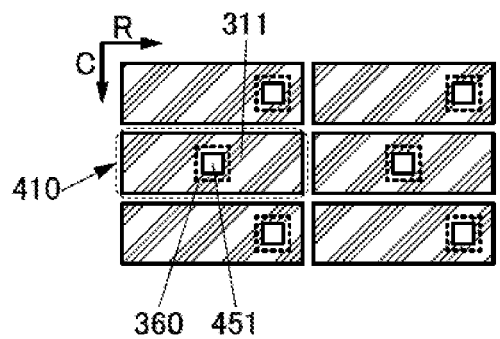
Figure 27A:
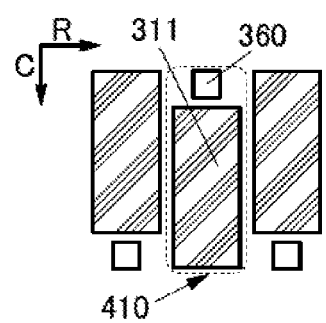
Figure 27A:
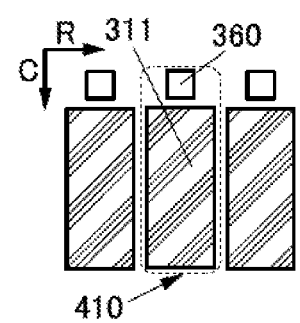

FIG. 27A is a block diagram of a display device 400. The display device 400 includes the display portion 362, a circuit GD, and a circuit SD. The display portion 362 includes a plurality of pixels 410 arranged in a matrix.

The display device 400 includes a plurality of wirings G1, a plurality of wirings G2, a plurality of wirings ANO, a plurality of wirings CSCOM, a plurality of wirings S1, and a plurality of wirings S2. The plurality of wirings G1, the plurality of wirings G2, the plurality of wirings ANO, and the plurality of wirings CSCOM are each electrically connected to the circuit GD and the plurality of pixels 410 arranged in a direction indicated by an arrow R. The plurality of wirings S1 and the plurality of wirings S2 are each electrically connected to the circuit SD and the plurality of pixels 410 arranged in a direction indicated by an arrow C.

Although the structure including one circuit GD and one circuit SD is illustrated here for simplicity, the circuit GD and the circuit SD for driving liquid crystal elements and the circuit GD and the circuit SD for driving light-emitting elements may be provided separately.

The pixels 410 each include a reflective liquid crystal element and a light-emitting element.

FIGS. 27B1, 27B2, 27B3, and 27B4 illustrate structure examples of the electrode 311 included in the pixel 410. The electrode 311 serves as a reflective electrode of the liquid crystal element. The opening 451 is provided in the electrode 311 in FIGS. 27B1 and 27B2.

In FIGS. 27B1 and 27B2, a light-emitting element 360 positioned in a region overlapping with the electrode 311 is indicated by a broken line. The light-emitting element 360 overlaps with the opening 451 included in the electrode 311. Thus, light from the light-emitting element 360 is emitted to the display surface side through the opening 451.

In FIG. 27B1, the pixels 410 which are adjacent in the direction indicated by the arrow R are pixels emitting light of different colors. As illustrated in FIG. 27B1, the openings 451 are preferably provided in different positions in the electrodes 311 so as not to be aligned in two adjacent pixels provided in the direction indicated by the arrow R. This allows two light-emitting elements 360 to be apart from each other, thereby preventing light emitted from the light-emitting element 360 from entering a coloring layer in the adjacent pixel 410 (such a phenomenon is referred to as crosstalk). Furthermore, since two adjacent light-emitting elements 360 can be arranged apart from each other, a high-resolution display device is achieved even when EL layers of the light-emitting elements 360 are separately formed with a blocking mask or the like.

In FIG. 27B2, the pixels 410 which are adjacent in a direction indicated by the arrow C are pixels emitting light of different colors. Also in FIG. 27B2, the openings 451 are preferably provided in different positions in the electrodes 311 so as not to be aligned in two adjacent pixels provided in the direction indicated by the arrow C.

The lower the ratio of the total area of the opening 451 to the total area except for the opening is, the brighter an image displayed using the liquid crystal element can be. Furthermore, the higher the ratio of the total area of the opening 451 to the total area except for the opening is, the brighter an image displayed using the light-emitting element 360 can be.

The opening 451 may have a polygonal shape, a quadrangular shape, an elliptical shape, a circular shape, a cross-like shape, a stripe shape, a slit-like shape, or a checkered pattern, for example. The opening 451 may be provided close to the adjacent pixel. Preferably, the opening 451 is provided close to another pixel emitting light of the same color, in which case crosstalk can be suppressed.

As illustrated in FIGS. 27B3 and 27B4, a light-emitting region of the light-emitting element 360 may be positioned in a region where the electrode 311 is not provided, in which case light emitted from the light-emitting element 360 is emitted to the display surface side.

In FIG. 27B3, the light-emitting elements 360 are not aligned in two adjacent pixels 410 provided in the direction indicated by the arrow R. In FIG. 27B4, the light-emitting elements 360 are aligned in two adjacent pixels 410 provided in the direction indicated by the arrow R.

The structure illustrated in FIG. 27B3 can, as mentioned above, prevent crosstalk and increase the resolution because the light-emitting elements 360 included in two adjacent pixels 410 can be apart from each other. The structure illustrated in FIG. 27B4 can prevent light emitted from the light-emitting element 360 from being blocked by the electrode 311 because the electrode 311 is not positioned along a side of the light-emitting element 360 which is parallel to the direction indicated by the arrow C. Thus, high viewing angle characteristics can be achieved.

As the circuit GD, any of a variety of sequential circuits such as a shift register can be used. In the circuit GD, a transistor, a capacitor, and the like can be used. A transistor included in the circuit GD can be formed in the same steps as the transistors included in the pixels 410.

The circuit SD is electrically connected to the wirings S1. For example, an integrated circuit can be used as the circuit SD. Specifically, an integrated circuit formed on a silicon substrate can be used as the circuit SD.

For example, a COG method, a COF method, or the like can be used to mount the circuit SD on a pad electrically connected to the pixels 410. Specifically, an anisotropic conductive film can be used to mount an integrated circuit on the pad.

Figure 28:
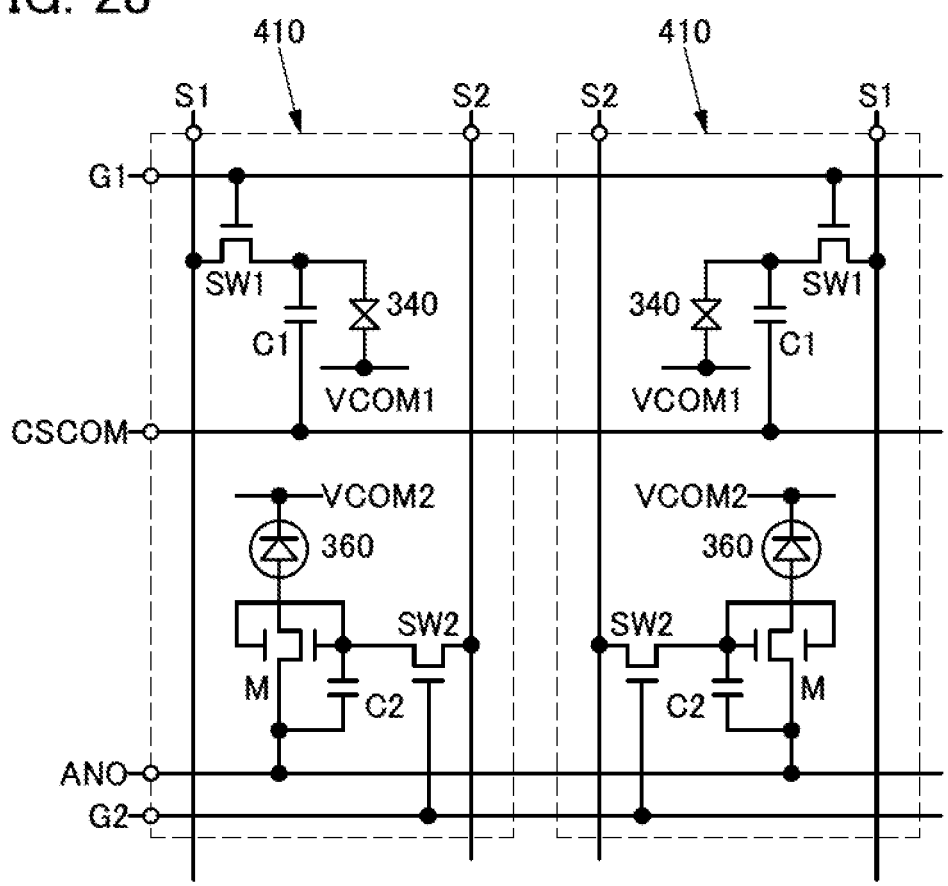
FIG. 28 is a circuit diagram illustrating an example of a pixel circuit in a display device.

FIG. 28 is an example of a circuit diagram of the pixels 410. FIG. 28 illustrates two adjacent pixels 410.

The pixels 410 each include a switch SW1, a capacitor C1, a liquid crystal element 340, a switch SW2, a transistor M, a capacitor C2, the light-emitting element 360, and the like. The pixel 410 is electrically connected to the wiring G1, the wiring G2, the wiring ANO, the wiring CSCOM, the wiring S1, and the wiring S2. FIG. 28 illustrates a wiring VCOM1 electrically connected to the liquid crystal element 340 and a wiring VCOM2 electrically connected to the light-emitting element 360.

FIG. 28 illustrates an example in which a transistor is used as each of the switches SW1 and SW2.

A gate of the switch SW1 is connected to the wiring G1. One of a source and a drain of the switch SW1 is connected to the wiring S1, and the other is connected to one electrode of the capacitor C1 and one electrode of the liquid crystal element 340. The other electrode of the capacitor C1 is connected to the wiring CSCOM. The other electrode of the liquid crystal element 340 is connected to the wiring VCOM1.

A gate of the switch SW2 is connected to the wiring G2. One of a source and a drain of the switch SW2 is connected to the wiring S2, and the other is connected to one electrode of the capacitor C2 and gates of the transistor M. The other electrode of the capacitor C2 is connected to one of a source and a drain of the transistor M and the wiring ANO. The other of the source and the drain of the transistor M is connected to one electrode of the light-emitting element 360. Furthermore, the other electrode of the light-emitting element 360 is connected to the wiring VCOM2.

FIG. 28 illustrates an example where the transistor M includes two gates between which a semiconductor is provided and which are connected to each other. This structure can increase the amount of current flowing through the transistor M.

The wiring G1 can be supplied with a signal for changing the on/off state of the switch SW1. A predetermined potential can be supplied to the wiring VCOM1. The wiring S1 can be supplied with a signal for changing the orientation of liquid crystals of the liquid crystal element 340. A predetermined potential can be supplied to the wiring CSCOM.

The wiring G2 can be supplied with a signal for changing the on/off state of the switch SW2. The wiring VCOM2 and the wiring ANO can be supplied with potentials having a difference large enough to make the light-emitting element 360 emit light. The wiring S2 can be supplied with a signal for changing the conduction state of the transistor M.

In the pixel 410 of FIG. 28, for example, an image can be displayed in the reflective mode by driving the pixel with the signals supplied to the wiring G1 and the wiring S1 and utilizing the optical modulation of the liquid crystal element 340. In the case where an image is displayed in the transmissive mode, the pixel is driven with the signals supplied to the wiring G2 and the wiring S2 and the light-emitting element 360 emits light. In the case where both modes are performed at the same time, the pixel can be driven with the signals supplied to the wiring G1, the wiring G2, the wiring S1, and the wiring S2.

Figure 29A:
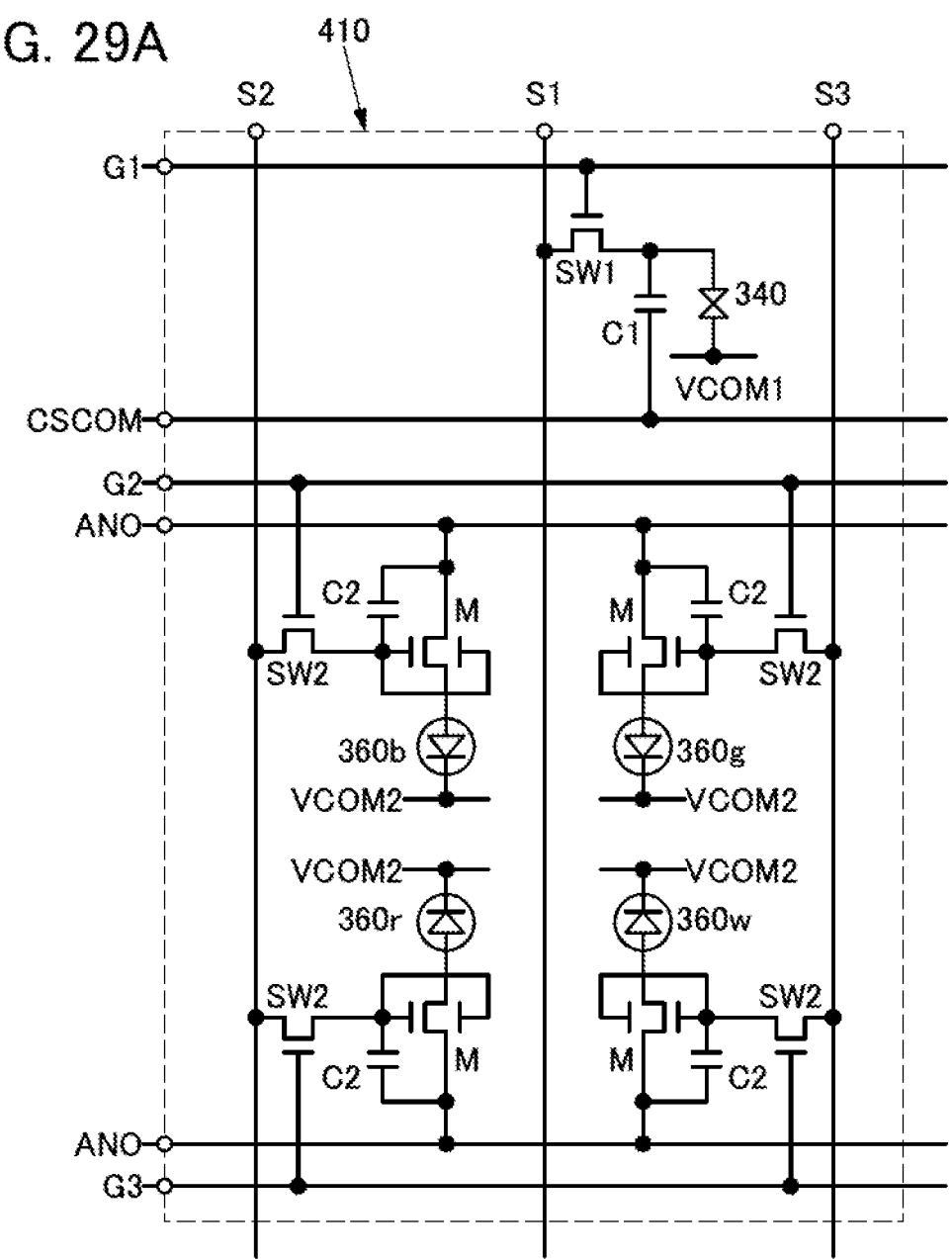
FIG. 29A is a circuit diagram illustrating an example of a pixel circuit in a display device.

Although FIG. 28 illustrates an example in which one liquid crystal element 340 and one light-emitting element 360 are provided in one pixel 410, one embodiment of the present invention is not limited thereto. FIG. 29A illustrates an example in which one liquid crystal element 340 and four light-emitting elements 360 (light-emitting elements 360$r$, 360$g$, 360$b$, and 360$w$) are provided in one pixel 410. The pixel 410 illustrated in FIG. 29A differs from that in FIG. 28 in being capable of displaying a full-color image with the use of the light-emitting elements by one pixel.

In FIG. 29A, in addition to the wirings in FIG. 28, a wiring G3 and a wiring S3 are connected to the pixel 410.

In the example in FIG. 29A, light-emitting elements emitting red light (R), green light (G), blue light (B), and white light (W) can be used as the four light-emitting elements 360, for example. Furthermore, as the liquid crystal element 340, a reflective liquid crystal element emitting white light can be used. Thus, in the case of displaying an image in the reflective mode, a white image can be displayed with high reflectivity. In the case of displaying an image in the transmissive mode, an image can be displayed with a higher color rendering property at low power consumption.

Figure 29B:
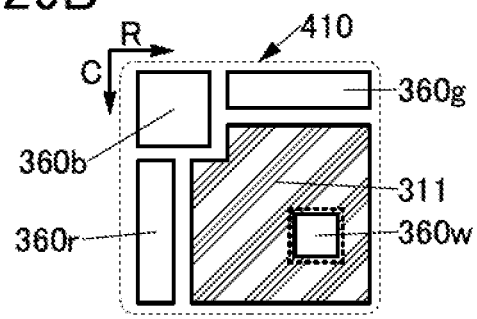
FIG. 29B is a diagram illustrating an example of a pixel.

FIG. 29B illustrates a structure example of the pixel 410 corresponding to FIG. 29A. The pixel 410 includes the light-emitting element 360$w$ overlapping with the opening included in the electrode 311 and the light-emitting element 360$r$, the light-emitting element 360$g$, and the light-emitting element 360$b$ which are arranged in the periphery of the electrode 311. It is preferable that the light-emitting elements 360$r$, 360$g$, and 360$b$ have almost the same light-emitting area.

This embodiment can be combined with any other embodiment as appropriate.

(Embodiment 4)

In this embodiment, described is the composition of a cloud-aligned composite oxide semiconductor (CAC-OS) applicable to a transistor disclosed in one embodiment of the present invention.

The CAC-OS has, for example, a composition in which elements included in a metal oxide are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of a metal oxide, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that a metal oxide preferably contains at least indium. In particular, indium and zinc are preferably contained. In addition, an element M (M is gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, or magnesium) may be contained.

For example, an In-M-Zn oxide with the CAC-OS composition has a composition in which materials are separated into indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0), and an oxide of the element M (MO$_{X3}$, where X3 is a real number greater than 0) or an M-Zn oxide (M$_{X4}$Zn$_{Y4}$O$_{Z4}$, where X4, Y4, and Z4 are real numbers greater than 0), and a mosaic pattern is formed. InO$_{X1}$ or In$_{X2}$Zn$_{Y2}$O$_{Z2}$ forming the mosaic pattern is distributed in the film. This composition is also referred to as a cloud-like composition.

In other words, an In-M-Zn oxide with the CAC-OS composition is a metal oxide in which a region including MO$_{X3}$ as a main component and a region including InO$_{X1}$ or In$_{X2}$Zn$_{Y2}$O$_{Z2}$ as a main component are mixed. Accordingly, the metal oxide is referred to as a composite metal oxide in some cases. Note that in this specification, for example, when the atomic ratio of In to an element M in a first region is higher than the atomic ratio of In to an element M in a second region, the first region has higher In concentration than the second region.

Note that in the metal oxide having the CAC-OS composition, a stacked-layer structure including two or more films with different atomic ratios is not included. For example, a two-layer structure of a film including In as a main component and a film including Ga as a main component is not included.

Specifically, of the CAC-OS, an In—Ga—Zn oxide with the CAC composition (such an In—Ga—Zn oxide may be particularly referred to as CAC-IGZO) is described. In the CAC-OS of an In—Ga—Zn oxide, materials are separated into $InO_{X1}$ or $In_{X2}Zn_{Y2}O_{Z2}$, and gallium oxide ($GaO_{X5}$, where X5 is a real number greater than 0) or gallium zinc oxide ($Ga_{X6}Zn_{Y6}O_{Z6}$, where X6, Y6, and Z6 are real numbers greater than 0), for example, and a mosaic pattern is formed. $InO_{X1}$ or $In_{X2}Zn_{Y2}O_{Z2}$ forming the mosaic pattern is a cloud-like metal oxide.

In other words, an In—Ga—Zn oxide including a CAC-OS is a composite metal oxide having a composition in which a region including $GaO_{X5}$ as a main component and a region including $In_{X2}Zn_{Y2}O_{Z2}$ or $InO_{X1}$ as a main component are mixed. A boundary between the region including $GaO_{X5}$ as a main component and the region including $In_{X2}Zn_{Y2}O_{Z2}$ or $InO_{X1}$ as a main component is not clearly observed in some cases.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a layered crystal structure in which a plurality of IGZO nanocrystals have c-axis alignment and are connected in the a-b plane direction without alignment.

In this specification and the like, CAC-IGZO can be defined as a metal oxide containing In, Ga, Zn, and O in the state where a plurality of regions containing Ga as a main component and a plurality of regions containing In as a main component are each dispersed randomly forming a mosaic pattern.

The crystallinity of the In—Ga—Zn oxide including a CAC-OS can be analyzed by electron diffraction. For example, a ring-like region with high luminance is observed in an electron diffraction pattern image. Furthermore, a plurality of spots are observed in the ring-like region in some cases.

The In—Ga—Zn oxide including a CAC-OS has a structure different from that of an IGZO compound in which metal elements are evenly distributed, and has characteristics different from those of the IGZO compound. That is, in the In—Ga—Zn oxide including a CAC-OS, regions including $GaO_{X5}$ or the like as a main component and regions including $In_{X2}Zn_{Y2}O_{Z2}$ or $InO_{X1}$ as a main component are separated to form a mosaic pattern.

In the case where aluminum, silicon, boron, yttrium, tin, copper, vanadium, beryllium, titanium, iron, nickel, germanium, zirconium, molybdenum, lanthanum, cerium, neodymium, hafnium, tantalum, tungsten, or magnesium is contained instead of gallium in a CAC-OS, nanoparticle regions including the metal element as a main component are observed in part of the CAC-OS and nanoparticle regions including In as a main component are observed in part thereof, and these nanoparticle regions are randomly dispersed to form a mosaic pattern in the CAC-OS.

The conductivity of a region including $In_{X2}Zn_{Y2}O_{Z2}$ or $InO_{X1}$ as a main component is higher than that of a region including $GaO_{X5}$ or the like as a main component. In other words, when carriers flow through regions including $In_{X2}Zn_{Y2}O_{Z2}$ or $InO_{X1}$ as a main component, conductivity is exhibited. Accordingly, when regions including $In_{X2}Zn_{Y2}O_{Z2}$ or $InO_{X1}$ as a main component are distributed in a metal oxide like a cloud, high field-effect mobility ($\mu$) can be achieved.

In contrast, the insulating property of a region including $GaO_{X5}$ or the like as a main component is higher than that of a region including $In_{X2}Zn_{Y2}O_{Z2}$ or $InO_{X1}$ as a main component. In other words, when regions including $GaO_{X5}$ or the like as a main component are distributed in a metal oxide, leakage current can be suppressed and favorable switching operation can be achieved.

Accordingly, when an In—Ga—Zn oxide including a CAC-OS is used for a semiconductor element, the insulating property derived from $GaO_{X5}$ or the like and the conductivity derived from $In_{X2}Zn_{Y2}O_{Z2}$ or $InO_{X1}$ complement each other, whereby a high on-state current ($I_{on}$), high field-effect mobility ($\mu$), and a low off-state current ($I_{off}$) can be achieved.

A semiconductor element that includes an In—Ga—Zn oxide including a CAC-OS has high reliability. Thus, the In—Ga—Zn oxide including a CAC-OS is suitably used in a variety of semiconductor devices typified by a display.

This embodiment can be combined with any other embodiment as appropriate.

(Embodiment 5)

In this embodiment, a display module and electronic devices of embodiments of the present invention are described.

Figure 30:
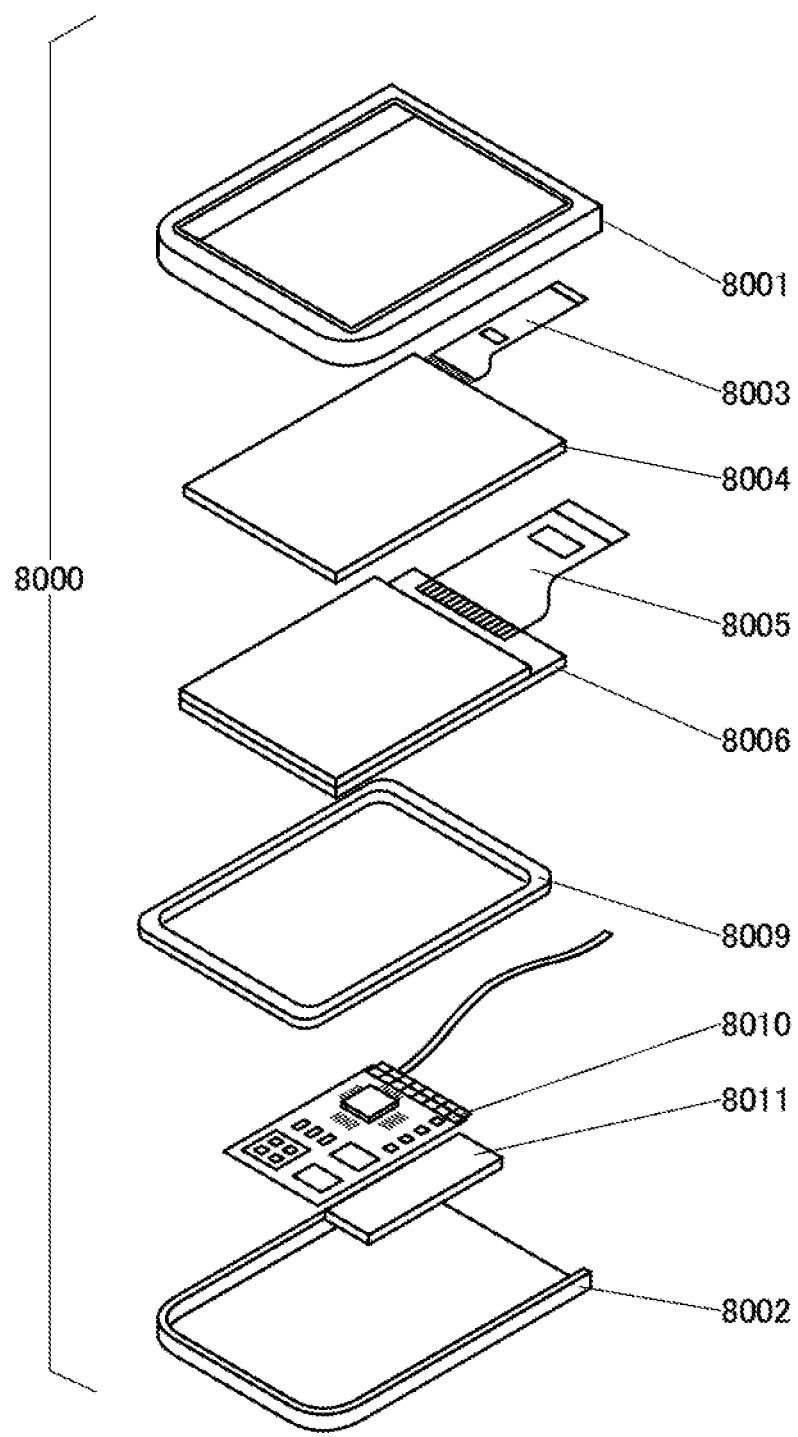
FIG. 30 illustrates an example of a display module.

In a display module 8000 in FIG. 30, a touch panel 8004 connected to an FPC 8003, a display panel 8006 connected to an FPC 8005, a frame 8009, a printed circuit board 8010, and a battery 8011 are provided between an upper cover 8001 and a lower cover 8002.

The display device fabricated using the separation method of one embodiment of the present invention can be used for, for example, the display panel 8006. Thus, the display module can be manufactured with high yield.

The shape and size of the upper cover 8001 and the upper cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. Instead of providing the touch panel 8004, the display panel 8006 may have a touch panel function.

The frame 8009 protects the display panel 8006 and functions as an electromagnetic shield for blocking electromagnetic waves generated by the operation of the printed circuit board 8010. The frame 8009 can also function as a radiator plate.

The printed circuit board 8010 includes a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The display module 8000 may be additionally provided with a member such as a polarizing plate, a retardation plate, or a prism sheet.

According to one embodiment of the present invention, highly reliable electronic devices having curved surfaces can be manufactured. According to one embodiment of the present invention, flexible and highly reliable electronic devices can be manufactured.

Examples of the electronic devices include a television set, a desktop or laptop personal computer, a monitor of a computer or the like, a digital camera, a digital video camera, a digital photo frame, a mobile phone, a portable game machine, a portable information terminal, an audio reproducing device, and a large game machine such as a pachinko machine.

The display device of one embodiment of the present invention can achieve high visibility regardless of the intensity of external light. Thus, the display device of one embodiment of the present invention can be suitably used for a portable electronic device, a wearable electronic device (wearable device), an e-book reader, or the like.

Figure 31A:
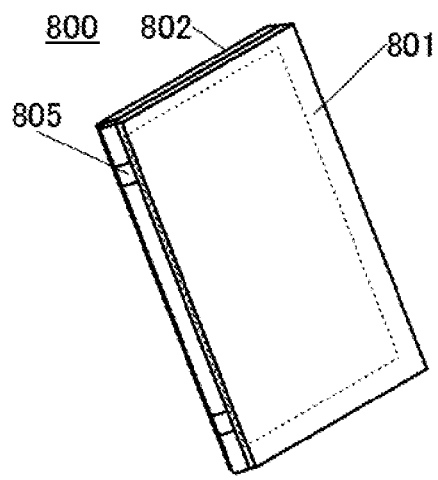
FIGS. 31A to 31D illustrate examples of electronic devices.
Figure 31B:
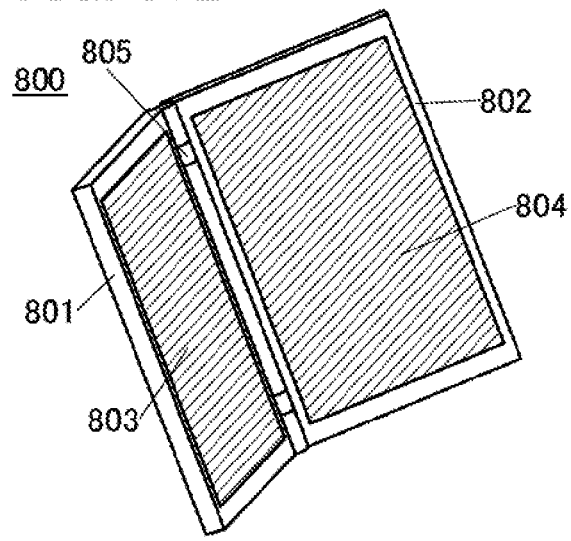

A portable information terminal 800 illustrated in FIGS. 31A and 31B includes a housing 801, a housing 802, a display portion 803, a display portion 804, a hinge portion 805, and the like.

The housing 801 and the housing 802 are joined together with the hinge portion 805. The portable information terminal 800 can be opened as illustrated in FIG. 31B from a closed state (FIG. 31A).

The display device manufactured using the separation method of one embodiment of the present invention can be used for at least one of the display portion 803 and the display portion 804. Thus, the portable information terminal can be manufactured with high yield.

The display portion 803 and the display portion 804 can each display at least one of a text, a still image, a moving image, and the like. When a text is displayed on the display portion, the portable information terminal 800 can be used as an e-book reader.

Since the portable information terminal 800 is foldable, the portable information terminal 800 has high portability and excellent versatility.

A power button, an operation button, an external connection port, a speaker, a microphone, or the like may be provided for the housing 801 and the housing 802.

Figure 31C:
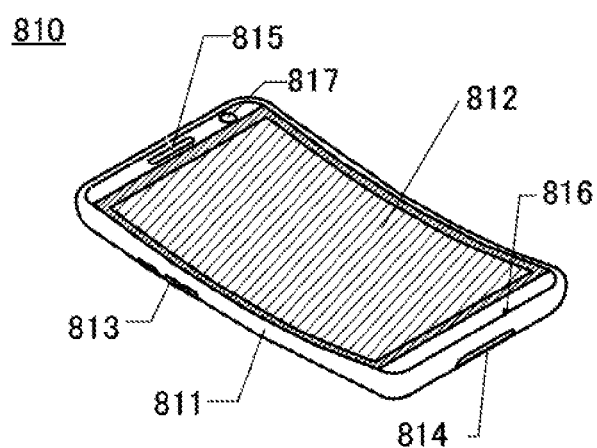

A portable information terminal 810 illustrated in FIG. 31C includes a housing 811, a display portion 812, an operation button 813, an external connection port 814, a speaker 815, a microphone 816, a camera 817, and the like.

The display device manufactured using the separation method of one embodiment of the present invention can be used for the display portion 812. Thus, the portable information terminal can be manufactured with high yield.

The portable information terminal 810 includes a touch sensor in the display portion 812. Operations such as making a call and inputting a character can be performed by touch on the display portion 812 with a finger, a stylus, or the like.

With the operation button 813, the power can be turned on or off. In addition, types of images displayed on the display portion 812 can be switched; for example, switching an image from a mail creation screen to a main menu screen is performed with the operation button 813.

When a detection device such as a gyroscope sensor or an acceleration sensor is provided inside the portable information terminal 810, the direction of display on the screen of the display portion 812 can be automatically changed by determining the orientation of the portable information terminal 810 (whether the portable information terminal 810 is placed horizontally or vertically). Furthermore, the direction of display on the screen can be changed by touch on the display portion 812, operation with the operation button 813, sound input using the microphone 816, or the like.

The portable information terminal 810 functions as, for example, one or more of a telephone set, a notebook, and an information browsing system. Specifically, the portable information terminal 810 can be used as a smartphone. The portable information terminal 810 is capable of executing a variety of applications such as mobile phone calls, e-mailing, viewing and editing texts, music reproduction, reproducing a moving image, Internet communication, and computer games, for example.

Figure 31D:
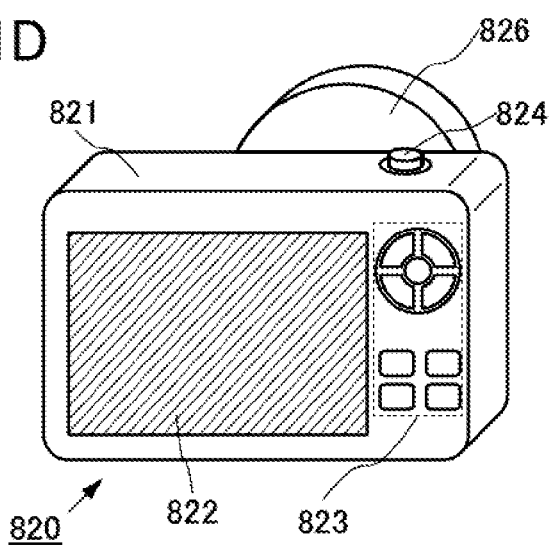

A camera 820 illustrated in FIG. 31D includes a housing 821, a display portion 822, operation buttons 823, a shutter button 824, and the like. Furthermore, an attachable lens 826 is attached to the camera 820.

The display device manufactured using the separation method of one embodiment of the present invention can be used for the display portion 822. Thus, the camera can be manufactured with high yield.

Although the lens 826 of the camera 820 here is detachable from the housing 821 for replacement, the lens 826 may be incorporated into the housing 821.

A still image or a moving image can be taken with the camera 820 at the press of the shutter button 824. In addition, images can also be taken by the touch of the display portion 822 which has a function of a touch panel.

Note that a stroboscope, a viewfinder, or the like can be additionally attached to the camera 820. Alternatively, these may be incorporated into the housing 821.

FIGS. 32A to 32E illustrate electronic devices. These electronic devices each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

The display device manufactured using the separation method of one embodiment of the present invention can be favorably used for the display portion 9001. Thus, the electronic devices can be manufactured with high yield.

The electronic devices illustrated in FIGS. 32A to 32E can have a variety of functions, for example, a function of displaying a variety of information (a still image, a moving image, a text image, and the like) on the display portion, a touch panel function, a function of displaying a calendar, the date, the time, and the like, a function of controlling processing with a variety of software (programs), a wireless communication function, a function of being connected to a variety of computer networks with a wireless communication function, a function of transmitting and receiving a variety of data with a wireless communication function, a function of reading a program or data stored in a storage medium and displaying the program or data on the display portion, and the like. Note that the functions of the electronic devices illustrated in FIGS. 32A to 32E are not limited to the above, and the electronic devices may have other functions.

Figure 32A:
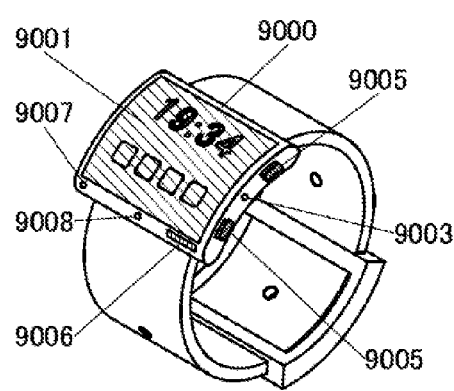
FIGS. 32A to 32E illustrate examples of electronic devices.
Figure 32B:
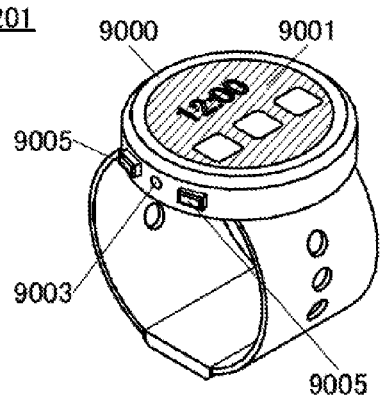

FIG. 32A is a perspective view of a watch-type portable information terminal 9200. FIG. 32B is a perspective view of a watch-type portable information terminal 9201.

The portable information terminal 9200 illustrated in FIG. 32A is capable of executing a variety of applications such as mobile phone calls, e-mailing, viewing and editing texts, music reproduction, Internet communication, and computer games. The display surface of the display portion 9001 is bent, and an image can be displayed on the bent display surface. The portable information terminal 9200 can employ near field communication conformable to a communication standard. In that case, for example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is also possible. Note that the charging operation may be performed by wireless power feeding without using the connection terminal 9006.

Unlike in the portable information terminal illustrated in FIG. 32A, the display surface of the display portion 9001 is not curved in the portable information terminal 9201 illustrated in FIG. 32B. Furthermore, the external state of the display portion of the portable information terminal 9201 is a non-rectangular shape (a circular shape in FIG. 32B).

Figure 32C:
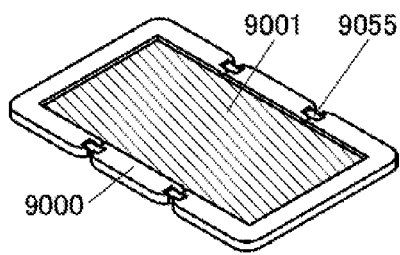
Figure 32D:
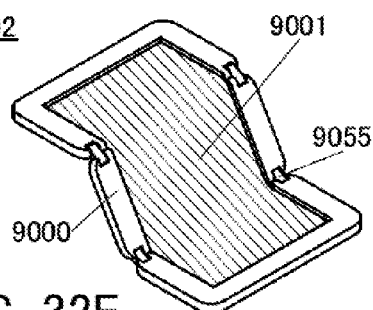
Figure 32E:
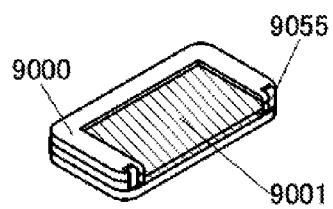

FIGS. 32C to 32E are perspective views of a foldable portable information terminal 9202. FIG. 32C is a perspective view illustrating the portable information terminal 9202 that is opened. FIG. 32D is a perspective view illustrating the portable information terminal 9202 that is being opened or being folded. FIG. 32E is a perspective view illustrating the portable information terminal 9202 that is folded.

The folded portable information terminal 9202 is highly portable, and the opened portable information terminal 9202 is highly browsable due to a seamless large display region. The display portion 9001 of the portable information terminal 9202 is supported by three housings 9000 joined together by hinges 9055. By folding the portable information terminal 9202 at a connection portion between two housings 9000 with the hinges 9055, the portable information terminal 9202 can be reversibly changed in shape from opened to folded. For example, the portable information terminal 9202 can be bent with a radius of curvature of greater than or equal to 1 mm and less than or equal to 150 mm.

This embodiment can be combined with any other embodiment as appropriate.

EXAMPLE 1

In this example, the effect that the baking conditions used to form a resin layer over a formation substrate have on the separability of the resin layer was evaluated.

In this example, the evaluation was performed on Sample A, Sample B, and Sample C.

As the formation substrate in each of the samples, an approximately 0.7-mm-thick glass substrate was used. As the resin layer, a polyimide resin film was formed over the formation substrate of each of the samples. The polyimide resin film was formed using a material including a non-photosensitive soluble polyimide resin. The film formation conditions were determined such that the three samples had approximately the same film thickness after being baked. The polyimide resin film was formed by a spin coating method at room temperature. The amount of coating was 40 ml, and the coating time was 12.5 seconds. The coating was performed at a spinning rate of 500 rpm for Sample A and 1000 rpm for Sample B and Sample C.

For Sample A, baking was performed at 180° C. for 30 minutes while a mixed gas of a nitrogen gas and an oxygen gas (580 NL/min, oxygen concentration: 20%) was made to flow, and then, baking was performed at 450° C. for 1 hour while the same mixed gas was made to flow. The film thickness after the baking was approximately 1.11 μm.

For Sample B, baking was performed at 180° C. for 30 minutes while a mixed gas of a nitrogen gas and an oxygen gas (580 NL/min, oxygen concentration: 20%) was made to flow, and then, baking was performed at 400° C. for 1 hour while the same mixed gas was made to flow. The film thickness after the baking was approximately 1.01 μm.

For Sample C, baking was performed at 180° C. for 30 minutes while a mixed gas of a nitrogen gas and an oxygen gas (580 NL/min, oxygen concentration: 20%) was made to flow, and then, baking was performed at 350° C. for 1 hour while the same mixed gas was made to flow. The film thickness after the baking was approximately 1.07 μm.

Sample A, Sample B, and Sample C were subjected to a separation test. As a result, separation was able to occur at the interface between the formation substrate and the resin layer.

For the separation test, a compact table-top universal tester (EZ-TEST EZ-S-50N) manufactured by Shimadzu Corporation was used, and an adhesive tape/adhesive sheet testing method based on standard number JIS Z0237 of Japanese Industrial Standards (JIS) was employed. Each sample had a size of 126 mm×25 mm.

The force required for separation in Sample A was 0.091 N. The force required for separation in Sample B was 0.169 N. There is no large difference between the thicknesses of Sample A and Sample B; thus, it can be presumed that the force required for separation in Sample A is reduced by baking at a higher temperature.

The above results show that, by forming the resin layer through baking at a high temperature in an atmosphere containing enough oxygen, the resin layer can be separated from the formation substrate.

EXAMPLE 2

In this example, the XPS analysis results of a surface on the formation substrate side of a resin layer formed over a formation substrate are described.

The surface on the formation substrate side of the resin layer corresponds to a surface exposed by the separation process.

In this example, three samples (Sample D to Sample F) were formed.

In Sample D to Sample F, separation can be performed at the interface between the formation substrate and the resin layer without special treatment (e.g., treatment of irradiating an entire surface of the resin layer with laser light).

As the formation substrate in each of the samples, an approximately 0.7-mm-thick glass substrate was used. As the resin layer, a polyimide resin film was formed over the formation substrate of each of the samples. The polyimide resin film was formed using a material including a non-photosensitive soluble polyimide resin. The film formation conditions were determined such that the three samples had approximately the same film thickness after being baked. The polyimide resin film was formed by a spin coating method at room temperature. The amount of coating was 40 ml, and the coating time was 12.5 seconds. The coating was performed at a spinning rate of 1000 rpm for Sample D and Sample E and 500 rpm for Sample F.

For Sample D, Sample E, and Sample F, baking was performed at 180° C. for 30 minutes while a mixed gas of a nitrogen gas and an oxygen gas (580 NL/min, oxygen concentration: 20%) was made to flow, and then, baking was performed for 1 hour while the same mixed gas was made to flow. The temperature of the 1-hour baking was 350° C. for Sample D, 400° C. for Sample E, and 450° C. for Sample F.

In each sample, XPS analysis was performed on the surface on the formation substrate side.

The oxygen concentration in each of Sample D to Sample F was higher than 15 atomic %. Specifically, the oxygen concentration in Sample D was approximately 16.0 atomic %, the oxygen concentration in Sample E was approximately 18.6 atomic %, and the oxygen concentration in Sample F was approximately 19.7 atomic %.

A comparison sample was formed, and XPS analysis was performed on a surface on the formation surface side in the comparison sample. The oxygen concentration in the comparison sample was lower than 1 atomic %. In the comparison sample, separation was not able to occur at the interface between the formation substrate and the resin layer in the case where the treatment of irradiating an entire surface of the resin layer with laser light was not performed.

Sample D to Sample F were formed such that the resin layers in the samples after being baked had almost the same film thickness. The forces required for separation in samples having the same structures as Sample D to Sample F were evaluated. The evaluation shows that the structure of Sample D required the largest force for separation and the structure of Sample F required the smallest force for separation. Thus, there is a tendency that the higher the oxygen concentration is, the smaller the force required for separation is. This suggests that the oxygen concentration measured by the XPS analysis performed on the surface on the separation surface side of the resin layer is preferably high.

EXAMPLE 3

In this example, analysis results of the polyimide resin film used in Example 1 are described.

In this example, analysis by FTIR and analysis by $^1$H NMR were performed.

A polyimide resin film formed under the same conditions as those used to form Sample C in Example 1 was used in this example.

Specifically, the polyimide resin film was formed using a material including a non-photosensitive soluble polyimide resin. The polyimide resin film was formed by a spin coating method at room temperature. The amount of coating was 40 ml, and the coating time was 12.5 seconds. The coating was performed at a spinning rate of 1000 rpm.

After the film was formed, baking was performed at 180° C. for 30 minutes while a mixed gas of a nitrogen gas and an oxygen gas (580 NL/min, oxygen concentration: 20%) was made to flow, and then, baking was performed at 350° C. for 1 hour while the same mixed gas was made to flow.

Part of the obtained polyimide resin film was analyzed by FTIR (single-reflection attenuated total reflection (ATR)).

Furthermore, part of the obtained polyimide resin film was decomposed into monomers using high-temperature methanol, and the resulting object was analyzed by $^1$H NMR.

The analysis results in this example show that a polyimide resin used in this example includes an oxydiphthalic acid represented by Structural formula (100) as an acid component and an aromatic amine as an amine component.

The above shows that, in Example 1, the baking was performed at a high temperature in an atmosphere containing enough oxygen, the resin layer including a residue of an oxydiphthalic acid was formed, and the resin layer was able to be separated from the formation substrate.

REFERENCE NUMERALS

10A: display device, 10B: display device, 13: bonding layer, 14: formation substrate, 22: substrate, 23: resin layer, 23a: first resin layer, 23b: second resin layer, 24a: first layer, 24b: second layer, 28: bonding layer, 29: substrate, 31: insulating layer, 32: insulating layer, 33: insulating layer, 34: insulating layer, 35: insulating layer, 39: mask, 40: transistor, 41: conductive layer, 43a: conductive layer, 43b: conductive layer, 43c: conductive layer, 44: metal oxide layer, 45: conductive layer, 49: transistor, 60: light-emitting element, 61: conductive layer, 62: EL layer, 63: conductive layer, 64: cut, 65: instrument, 66: laser light, 67: irradiation region, 74: insulating layer, 75: protective layer, 75a: substrate, 75b: bonding layer, 76: connector, 80: transistor, 81: conductive layer, 82: insulating layer, 83: metal oxide layer, 84: insulating layer, 85: conductive layer, 86a: conductive layer, 86b: conductive layer, 86c: conductive layer, 91: formation substrate, 93a: first resin layer, 93b: second resin layer, 95: insulating layer, 96: partition, 97: coloring layer, 98: light-blocking layer, 99: bonding layer, 112: liquid crystal layer, 113: electrode, 117: insulating layer, 121: insulating layer, 131: coloring layer, 132: light-blocking layer, 133a: alignment film, 133b: alignment film, 134: coloring layer, 135: polarizing plate, 141: bonding layer, 142: bonding layer, 170: light-emitting element, 180: liquid crystal element, 191: electrode, 192: EL layer, 193: electrode, 194: insulating layer, 201: transistor, 203: transistor, 204: connection portion, 205: transistor, 206: transistor, 207: connection portion, 211: insulating layer, 212: insulating layer, 213: insulating layer, 214: insulating layer, 216: insulating layer, 220: insulating layer, 221a: conductive layer, 221b: conductive layer, 222a: conductive layer, 222b: conductive layer, 223: conductive layer, 231: semiconductor layer, 242: connection layer, 243: connector, 252: connection portion, 300A: display device, 300B: display device, 311: electrode, 311a: electrode, 311b: electrode, 340: liquid crystal element, 351: substrate, 360: light-emitting element, 360b: light-emitting element, 360g: light-emitting element, 360r: light-emitting element, 360w: light-emitting element, 361: substrate, 362: display portion, 364: circuit, 365: wiring, 372: FPC, 373: IC, 381: display portion, 382: driver circuit portion, 400: display device, 410: pixel, 451: opening, 800: portable information terminal, 801: housing, 802: housing, 803: display portion, 804: display portion, 805: hinge portion, 810: portable information terminal, 811: housing, 812: display portion, 813: operation button, 814: external connection port, 815: speaker, 816: microphone, 817: camera, 820: camera, 821: housing, 822: display portion, 823: operation button, 824: shutter button, 826: lens, 8000: display module, 8001: upper cover, 8002: upper cover, 8003: FPC, 8004: touch panel, 8005: FPC, 8006: display panel, 8009: frame, 8010: printed circuit board, 8011: battery, 9000: housing, 9001: display portion, 9003: speaker, 9005: operation key, 9006: connection terminal, 9007: sensor, 9008: microphone, 9055: hinge, 9200: portable information terminal, 9201: portable information terminal, 9202: portable information terminal.

This application is based on Japanese Patent Application serial no. 2016-154489 filed with Japan Patent Office on Aug. 5, 2016, the entire contents of which are hereby incorporated by reference.

The invention claimed is:

1. A manufacturing method of a display device comprising:
   forming, over a substrate, a first layer including a material including a resin or a resin precursor;
   performing a first treatment on the first layer, so that a material of the first layer comprises a polyimide resin;
   forming a first resin layer including a residue of an oxydiphthalic acid by performing first heat treatment on the first layer in an atmosphere containing oxygen after the first treatment;
   forming, over the first resin layer, a layer to be separated after the first heat treatment; and
   separating the layer to be separated and the substrate from each other,
   wherein the first heat treatment is performed at a temperature higher than the first treatment.

2. The manufacturing method of the display device according to claim 1,
   wherein, after the first heat treatment, an island-like-shaped first resin layer is formed by forming a mask over the first resin layer and performing etching,
   wherein, in a step of forming the layer to be separated, an insulating layer covering an end portion of the first resin layer is formed over the substrate and the first resin layer and a transistor including metal oxide in a channel formation region is formed over the first resin layer with the insulating layer positioned between the first resin layer and the transistor, and
   wherein, before separation of the layer to be separated and the substrate from each other, a separation starting point is formed by separating at least part of the first resin layer from the substrate.

3. The manufacturing method according to claim 1,
   wherein, in the first heat treatment, a gas containing oxygen is made to flow.

4. The manufacturing method of the display device according to claim 1,
   wherein the first resin layer includes a polyimide resin obtained using an acid component containing an oxydiphthalic acid or an oxydiphthalic acid derivative and an amine component containing an aromatic amine or an aromatic amine derivative.

5. The manufacturing method of the display device according to claim 1,
   wherein the first heat treatment is performed at a temperature higher than or equal to 350° C. and lower than or equal to 450° C., and
   wherein, in the first heat treatment, a mixed gas containing nitrogen and oxygen is made to flow.

6. The manufacturing method of the display device according to claim 1,
   wherein the first resin layer is formed to a thickness greater than or equal to 1 μm and less than or equal to 3 μm.

7. The manufacturing method of the display device according to claim 1,
   wherein the first layer is formed with a spin coater.

8. The manufacturing method of the display device according to claim 2,
   wherein the transistor is manufactured at a temperature lower than or equal to the temperature of the first heat treatment.

9. The manufacturing method of the display device according to claim 1,
   wherein the material is a non-photosensitive material.

10. A manufacturing method of a display device comprising:
    forming, over a substrate, a first layer including a material including a resin or a resin precursor;
    baking the first layer by a first heat treatment on the first layer so as to comprise a polyimide resin;
    forming a first resin layer including a residue of an oxydiphthalic acid by performing second heat treatment on the first layer in an atmosphere containing oxygen after the first heat treatment;
    forming an island-like-shaped first resin layer by forming a mask over the first layer or the first resin layer and performing etching;
    forming a second layer covering an end portion of the first resin layer over the substrate and the first resin layer;
    forming a second resin layer covering the end portion of the first resin layer by performing third heat treatment on the second layer in an atmosphere containing less oxygen than the atmosphere of the second heat treatment;
    forming a transistor including metal oxide in a channel formation region over the first resin layer with the second resin layer positioned between the first resin layer and the transistor;
    forming a separation starting point by separating at least part of the first resin layer from the substrate; and
    separating the transistor and the substrate from each other,
    wherein the second heat treatment is performed at a temperature higher than the first heat treatment.

11. The manufacturing method of the display device according to claim 10,
    wherein, in the second heat treatment, a gas containing oxygen is made to flow, and
    wherein, in the third heat treatment, a gas containing oxygen is not made to flow or a gas in which a proportion of oxygen is lower than a proportion of oxygen in the gas used in the second heat treatment is made to flow.

12. The manufacturing method of the display device according to claim 11,
    wherein the second resin layer includes a residue of an oxydiphthalic acid.

13. The manufacturing method of the display device according to claim 10,
    wherein the first resin layer includes a polyimide resin obtained using an acid component containing an oxydiphthalic acid or an oxydiphthalic acid derivative and an amine component containing an aromatic amine or an aromatic amine derivative.

14. The manufacturing method according to claim 10,
    wherein the second heat treatment is performed at a temperature higher than or equal to 350° C. and lower than or equal to 450° C, and
    wherein, in the second heat treatment, a mixed gas containing nitrogen and oxygen is made to flow.

15. The manufacturing method of the display device according to claim 10,
    wherein the first resin layer is formed to a thickness greater than or equal to 1 μm and less than or equal to 3 μm.

16. The manufacturing method of the display device according to claim 10,
    wherein the first layer is formed with a spin coater.

17. The manufacturing method of the display device according to claim 10, wherein the transistor is manufactured at a temperature lower than or equal to the temperature of the second heat treatment.

18. The manufacturing method of the display device according to claim 10,
wherein the material is a non-photosensitive material.

19. A display device comprising:
a first resin layer comprising a first surface and a second surface which are opposite to each other;
a second resin layer over the first resin layer and in contact with the second surface of the first resin layer;
a transistor over the second resin layer; and
a display element electrically connected to the transistor,
wherein the first resin layer includes a residue of an oxydiphthalic acid, and
wherein oxygen concentration measured on the first surface of the first resin layer is higher than or equal to 10 atomic %.

20. The display device according to claim 19,
wherein the second resin layer includes a residue of an oxydiphthalic acid.

21. The display device according to claim 19,
wherein the oxygen concentration measured by X-ray photoelectron spectroscopy analysis performed on the first surface of the first resin layer higher than or equal to 15 atomic %.

22. The display device according to claim 19,
wherein the first resin layer has a thickness greater than or equal to 1 μm and less than or equal to 3 μm.

23. The display device according to claim 19,
wherein the transistor includes metal oxide in a channel formation region.

24. A display module comprising:
the display device according to claim 20; and
a flexible printed circuit.

25. An electronic device comprising:
the display module according to claim 24; and
at least one of an antenna, a battery, a housing, a camera, a speaker, a microphone, and an operation button.

* * * * *